US012795890B2

(12) United States Patent
Kang et al.

(10) Patent No.: US 12,795,890 B2
(45) Date of Patent: Nov. 10, 2026

(54) INTEGRATED CIRCUIT DEVICE

(71) Applicant: SAMSUNG ELECTRONICS CO., LTD., Suwon-si (KR)

(72) Inventors: Jungoo Kang, Suwon-si (KR); Dayeon Nam, Suwon-si (KR); Sungjoon Yoon, Suwon-si (KR); Donggeon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 633 days.

(21) Appl. No.: 18/138,311

(22) Filed: Apr. 24, 2023

(65) Prior Publication Data

US 2023/0397404 A1 Dec. 7, 2023

(30) Foreign Application Priority Data

Jun. 3, 2022 (KR) ........................ 10-2022-0068514

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC ....... H10D 1/696; H10D 1/716; H10B 12/315
See application file for complete search history.

(56) References Cited

U.S. PATENT DOCUMENTS 8,481,398 B2 7/2013 Chung et al.
9,716,094 B2 7/2017 Kang et al.
10,978,552 B2 4/2021 Kang et al.
2016/0372478 A1 12/2016 Ino et al.
2017/0186752 A1 6/2017 Choi et al.
2020/0335333 A1 10/2020 Kang et al.
2020/0395438 A1 12/2020 Kang et al.
2021/0115564 A1 4/2021 Park et al.
2021/0125993 A1 4/2021 An et al.
(Continued)

FOREIGN PATENT DOCUMENTS

KR 10-1610826 4/2016
KR 10-2017-0075975 7/2017
(Continued)

OTHER PUBLICATIONS

Office Action issued in corresponding TW Patent Application No. 112120429 on Mar. 26, 2024.

*Primary Examiner* — Molly K Reida
(74) *Attorney, Agent, or Firm* — Morgan, Lewis & Bockius LLP

(57) ABSTRACT

An integrated circuit device includes: a capacitor structure, wherein the capacitor structure includes: a lower electrode arranged on a substrate, wherein the lower electrode includes an electrode layer extending in a direction substantially perpendicular to an upper surface of the substrate, wherein the electrode layer includes niobium nitride; a supporter arranged on a sidewall of the lower electrode; a dielectric layer arranged on the lower electrode and the supporter; a first interface layer arranged between a sidewall of the lower electrode and the dielectric layer and between a top surface of the lower electrode and the dielectric layer, wherein the first interface layer includes a conductive metal nitride; and an upper electrode arranged on the dielectric layer, wherein the upper electrode covers the lower electrode and includes niobium nitride.

20 Claims, 40 Drawing Sheets

(56) References Cited

U.S. PATENT DOCUMENTS

| | | | |
|---|---|---|---|
| 2022/0037325 | A1 | 2/2022 | Kang et al. |
| 2022/0085023 | A1 | 3/2022 | Shin et al. |
| 2022/0130835 | A1 | 4/2022 | An et al. |

FOREIGN PATENT DOCUMENTS

| | | |
|---|---|---|
| KR | 10-2020-0122175 | 10/2020 |
| KR | 10-2020-0141809 | 12/2020 |
| KR | 10-2021-0047591 | 4/2021 |
| KR | 10-2021-0050686 | 5/2021 |
| KR | 10-2335280 | 12/2021 |

A1 - A1'

INTEGRATED CIRCUIT DEVICE

CROSS-REFERENCE TO RELATED APPLICATION

This application claims priority under 35 U.S.C. § 119 to Korean Patent Application No. 10-2022-0068514, filed on Jun. 3, 2022, in the Korean Intellectual Property Office, the disclosure of which is incorporated by reference herein in its entirety.

TECHNICAL FIELD

The present inventive concept relates to an integrated circuit device, and more particularly, to an integrated circuit device including a capacitor structure.

DISCUSSION OF THE RELATED ART

Due to downscaling of integrated circuit devices, for example, dynamic random access memory (DRAM) devices, sizes of capacitor structures that are included in the integrated circuit devices are also decreased. According to a decrease in sizes of capacitor structures, various kinds of capacitor structures are under development to increase capacitance and improve leakage characteristics.

SUMMARY

The present inventive concept provides an integrated circuit device including a capacitor structure by which capacitance may be increased and leakage characteristics may be improved.

According to an embodiment of the present inventive concept, an integrated circuit device includes: a capacitor structure, wherein the capacitor structure includes: a lower electrode arranged on a substrate, wherein the lower electrode includes an electrode layer extending in a direction substantially perpendicular to an upper surface of the substrate, wherein the electrode layer includes niobium nitride; a supporter arranged on a sidewall of the lower electrode; a dielectric layer arranged on the lower electrode and the supporter; a first interface layer arranged between a sidewall of the lower electrode and the dielectric layer and between a top surface of the lower electrode and the dielectric layer, wherein the first interface layer includes a conductive metal nitride; and an upper electrode arranged on the dielectric layer, wherein the upper electrode covers the lower electrode and includes niobium nitride.

According to an embodiment of the present inventive concept, an integrated circuit device includes: a capacitor structure, wherein the capacitor structure includes: a lower electrode arranged on a substrate, wherein the lower electrode includes an electrode layer extending in a direction substantially perpendicular to a top surface of the substrate, and the electrode layer includes niobium nitride; a supporter arranged on a sidewall of the lower electrode; a dielectric layer arranged on the lower electrode and the supporter; a first interface layer arranged between a sidewall of the electrode layer and the dielectric layer and between a top surface of the electrode layer and the dielectric layer, wherein the first interface layer includes a conductive metal nitride; and an upper electrode arranged on the dielectric layer, wherein the upper electrode overlaps the lower electrode and includes niobium nitride, and wherein the lower electrode further includes a first seed layer at least partially surrounded by the supporter and contacting at least a portion of the electrode layer.

According to an embodiment of the present inventive concept, an integrated circuit device includes: a capacitor structure, wherein the capacitor structure includes: a lower electrode arranged on a substrate, wherein the lower electrode includes an electrode layer extending in a direction substantially perpendicular to a first surface of the substrate, and the electrode layer includes niobium nitride; a supporter arranged on a sidewall of the lower electrode; a dielectric layer arranged on the lower electrode and the supporter; a first interface layer arranged between a sidewall of the electrode layer and the dielectric layer and between a first surface of the electrode layer and the dielectric layer, wherein the first interface layer includes a conductive metal nitride; an upper electrode arranged on the dielectric layer, wherein the upper electrode covers the lower electrode and includes niobium nitride; and a second interface layer arranged between the dielectric layer and the upper electrode, wherein the second interface layer includes a conductive metal oxide, wherein the supporter includes a first supporter and a second supporter respectively disposed on a middle portion of a sidewall of the lower electrode and an upper portion of the sidewall of the lower electrode, and wherein the lower electrode further includes a capping layer arranged on the electrode layer, and wherein a surface of the capping layer is arranged lower than a surface of the second supporter.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
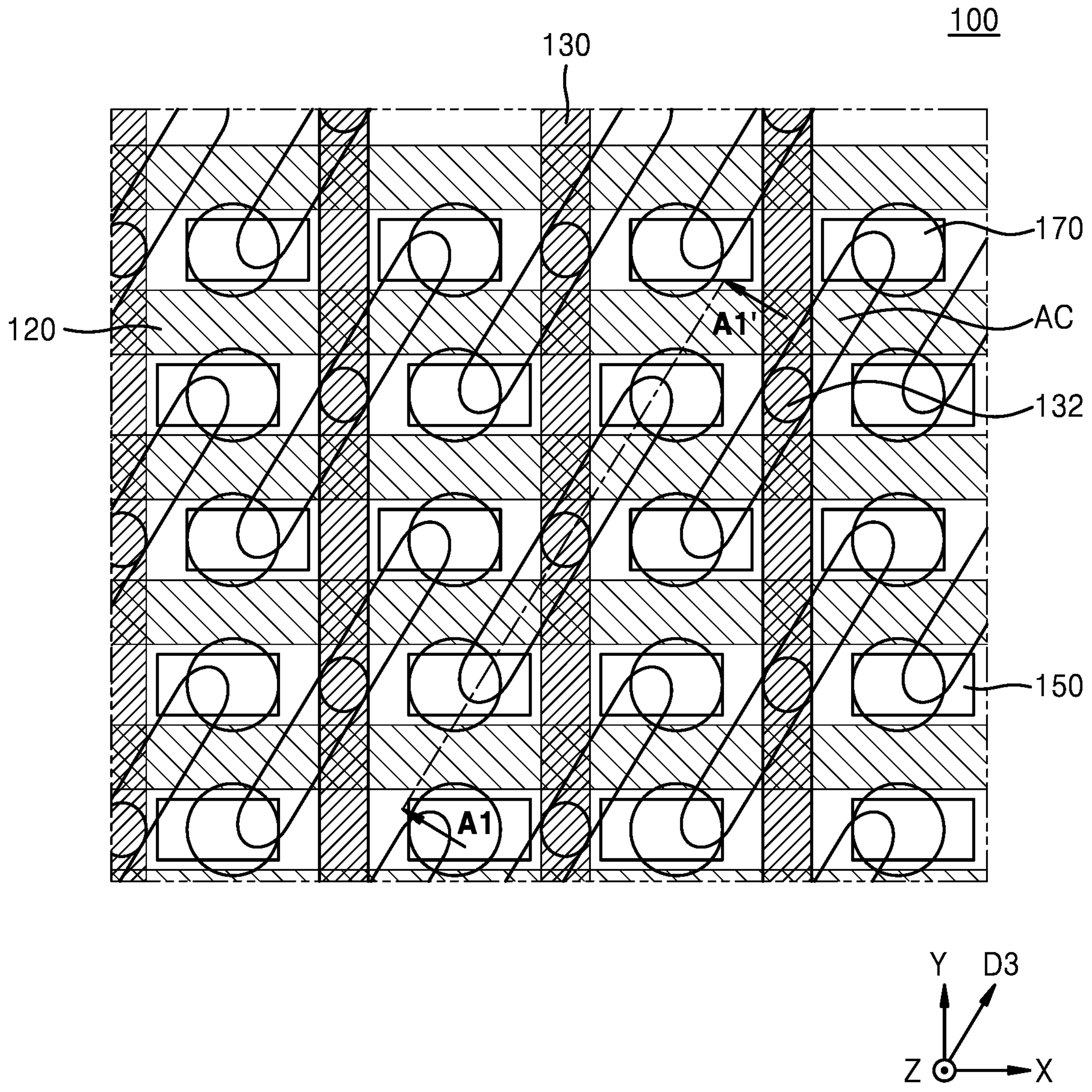
FIG. 1 is a layout diagram of an integrated circuit device according to an embodiment of the present inventive concept.

Hereinafter, example embodiments of the present inventive concept will be described in detail with reference to the attached drawings. The embodiments of the present inventive concept described below may be implemented by any one single embodiment. In addition, the embodiments described below may be implemented by combination of one or more embodiments. Therefore, the present inventive concept is not to be construed as being limited to any particular embodiment.

It is to be understood that unless the context clearly indicates otherwise, the singular forms of the components or elements may include the plural forms as well. In the drawings, various thicknesses, lengths, and angles are shown and while the arrangement shown does indeed represent an embodiment of the present inventive concept, it is to be understood that modifications of the various thicknesses, lengths, and angles may be possible within the spirit and scope of the present inventive concept and the present inventive concept is not necessarily limited to the particular thicknesses, lengths, and angles shown.

Figure 2:
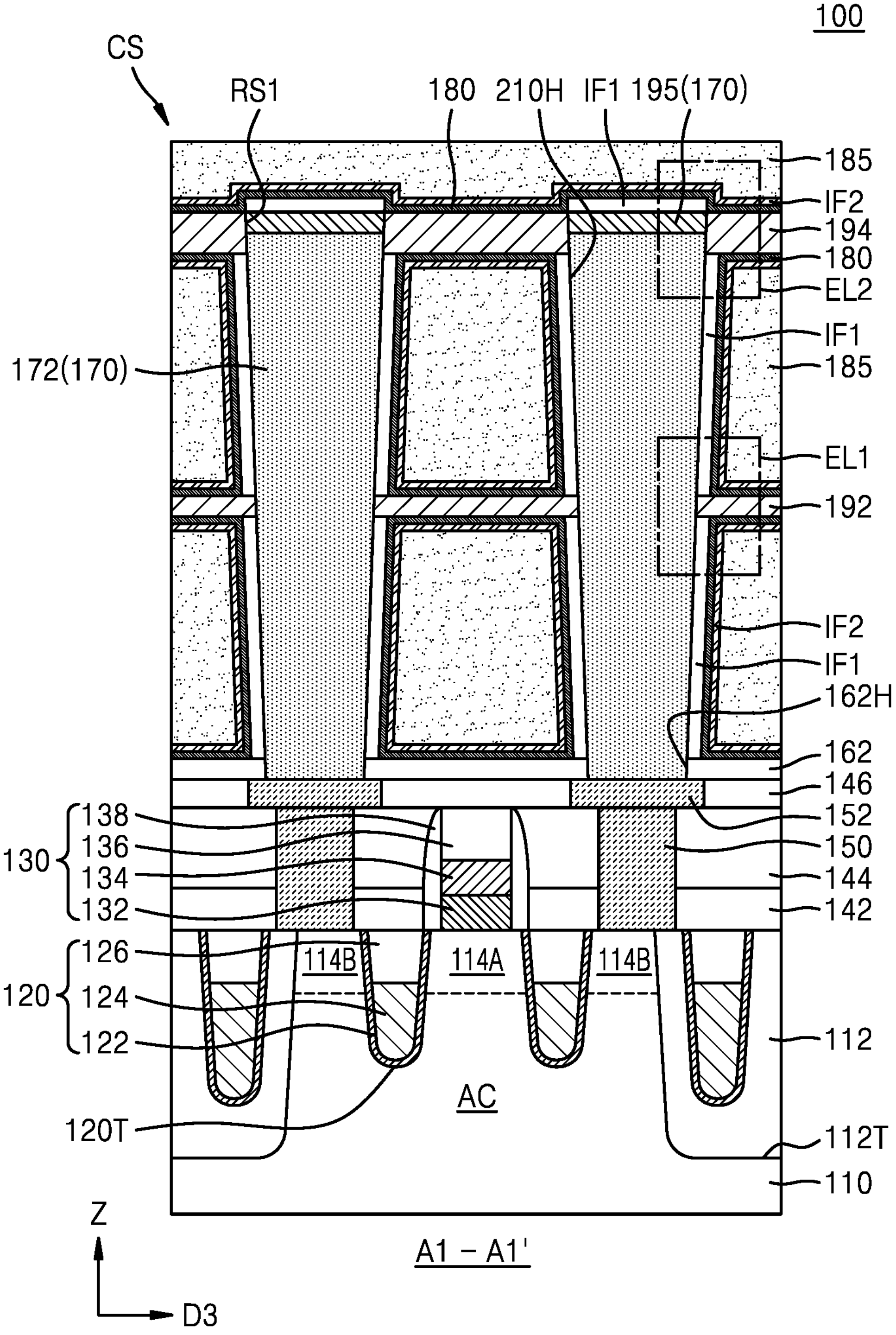
FIG. 2 is a cross-sectional view of the integrated circuit device, taken along line A1-A1' shown in FIG. 1.
Figure 3:
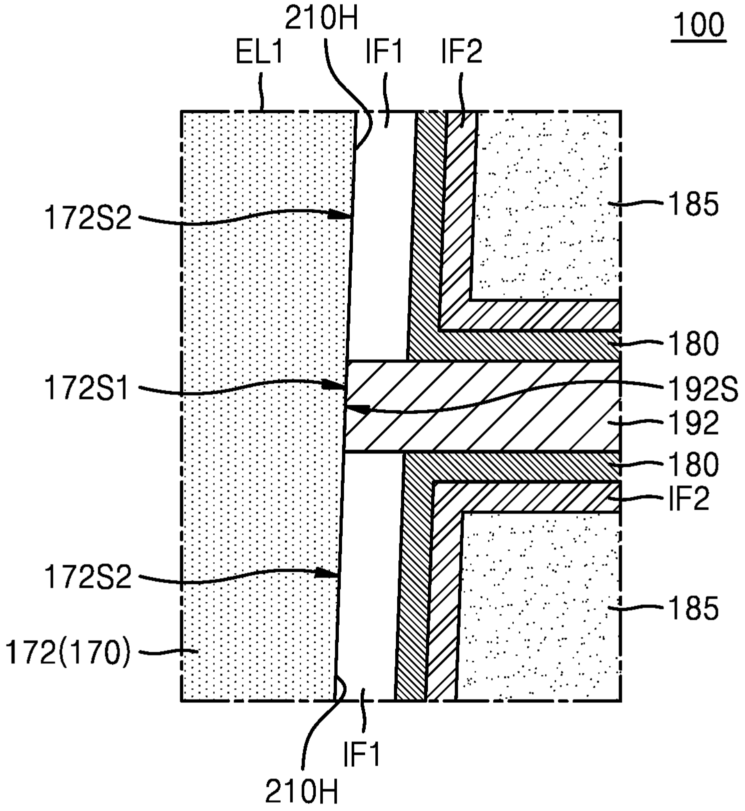
FIGS. 3 and 4 are enlarged views of portion and portion shown in FIG. 2, respectively.
Figure 4:
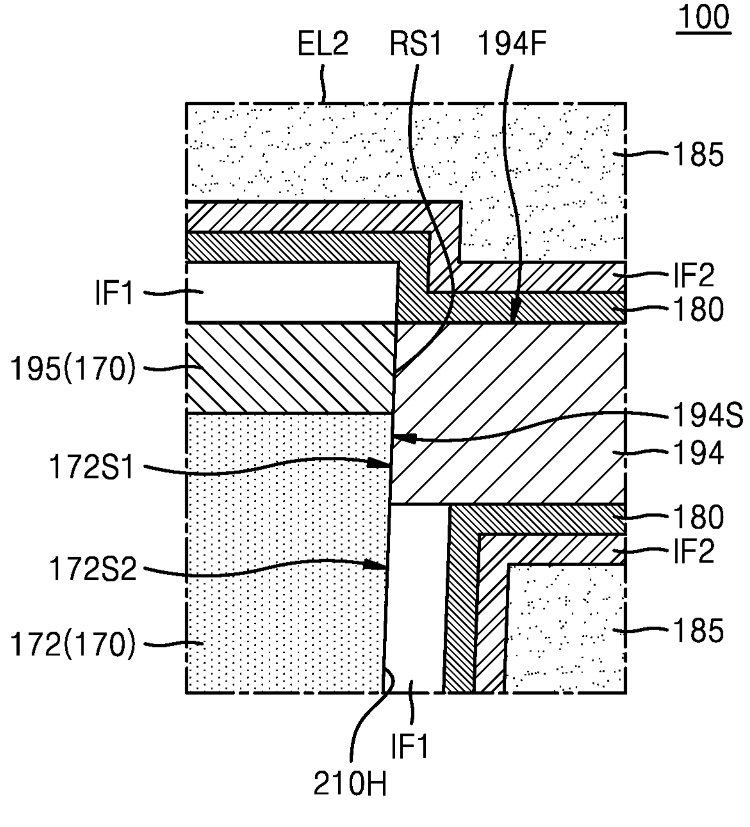

FIG. 1 is a layout diagram of an integrated circuit device 100 according to an embodiment of the present inventive concept. FIG. 2 is a cross-sectional view taken along line A1-A1' shown in FIG. 1. FIGS. 3 and 4 are enlarged views of portion EL1 and portion EL2 shown in FIG. 2, respectively.

For example, in the integrated circuit device 100, a substrate 110 may include an active region AC defined by a device isolation layer 112. In an embodiment of the present inventive concept, the substrate 110 may include semiconductor materials, such as Si, Ge, or SiGe, SiC, GaAs, InAs, or InP. In an embodiment of the present inventive concept, the substrate 110 may include a conductive region, for example, an impurity-doped well or an impurity-doped structure.

The device isolation layer 112 may have a shallow trench isolation (STI) structure. For example, the device isolation layer 112 may include an insulating material filling the device isolation layer 112 formed in the substrate 110. The insulating material may include, for example, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but the present inventive concept is not limited thereto.

The active region AC may have a shape of a relatively long island having a short axis and a long axis. As shown in FIG. 1, the long axis of the active region AC may extend in a D3 direction that is parallel to a top surface of the substrate 110. In an embodiment of the present inventive concept, the active region AC may be doped with P-type or N-type impurities.

The substrate 110 may further include a gate line trench 120T extending in an X direction that is parallel to the top surface of the substrate 110. The gate line trench 120T may cross with the active region AC, and may be formed in a certain depth from the top surface of the substrate 110. A portion of the gate line trench 120T may extend into the device isolation layer 112, and the portion of the gate line trench 120T formed in the device isolation layer 112 may have a bottom surface that is at a level lower than a level of a portion of the gate line trench 120T formed within the active region AC.

A first source/drain region 114A and a second source/drain region 114B may be arranged at an upper portion of the active region AC on two sides of the gate line trench 120T. For example, the gate line trench 120T may be disposed between the first source/drain region 114A and the second source/drain region 114B. The first source/drain region 114A and the second source drain region 114B may include impurity regions doped with impurities having conductive types different from conductive types of impurities doped in the active region AC. The first source/drain region 114A and the second source/drain region 114B may be doped with N-type or P-type impurities.

A gate structure 120 may be formed in the gate line trench 120T. The gate structure 120 may include a gate insulating layer 122, a gate electrode 124, and a gate capping layer 126 sequentially formed on the gate line trench 120T. For example, the gate insulating layer 122 may be formed in the gate line trench 120T. The gate electrode 124 may be disposed on the gate insulating layer 122. The gate capping layer 126 may be disposed on the gate electrode 124 and may fill a remaining space of the gate line trench 120T.

The gate insulating layer 122 may be conformally formed with a certain thickness on the inner wall of the gate line trench 120T. The gate insulating layer 122 may include at least one of silicon nitride, silicon oxynitride, oxide/nitride/oxide (ONO), and high-k electric materials having a dielectric constant greater than a dielectric constant of silicon oxide.

For example, the gate insulating layer 122 may have a dielectric constant ranging from about 10 to about 25. In an embodiment of the present inventive concept, the gate insulating layer 122 may include $HfO_2$, $ZrO_2$, $Al_2O_3$, $HfAlO_3$, $Ta_2O_3$, $TiO_2$, or combinations thereof, but present inventive concept is not limited thereto.

The gate electrode 124 may be formed on the gate insulating layer 122 to fill the gate line trench 120T from a bottom portion of the gate line trench 120T to a certain height. The gate electrode 124 may include a work function adjustment layer arranged on the gate insulating layer 122. The gate electrode 124 may also include a buried metal layer filling the bottom portion of the gate line trench 120T on the work function adjustment layer.

For example, the work function adjustment layer may include a metal, such as titanium (Ti) and tantalum (Ta). As an additional example, the work function adjustment layer may include a metal nitride, such as a titanium nitride (TiN), titanium aluminum nitride (TiAlN), titanium aluminum carbon nitride (TiAlCN), tantalum nitride (TaN), tantalum aluminum nitride (TaAlN), tantalum aluminum carbon nitride (TaAlCN), and tantalum silicon carbon nitride (TaSiCN). The work function adjustment layer may additionally include a metal carbide, such as titanium aluminum carbide (TiAlC), and the buried metal layer may include at least one of tungsten (W), tungsten nitride (WN), TiN, and TaN.

The gate capping layer 126 may fill, on the gate electrode 124, a remaining portion of the gate line trench 120T. For example, the gate capping layer 126 may include at least one of the silicon oxide, silicon oxynitride, and/or silicon nitride.

A bit line structure 130 extending in the Y direction, which is parallel to the top surface of the substrate 110 and substantially perpendicular to the X direction, may be formed on the first source/drain region 114A. The bit line structure 130 may include a bit line contact 132, a bit line 134, a bit line capping layer 136, and a bit line spacer 138 disposed on the substrate 110.

For example, the bit line contact 132 may include polysilicon, and the bit line 134 may include a metal material. The bit line capping layer 136 may include an insulating material, such as SiN or SiON. The bit line spacer 138 may include a single-layer structure or a multi-layer structure including an insulating material, such as SiO, SiON, or SiN.

In an embodiment of the present inventive concept, the bit line spacer 138 may further include an air space. In addition, a bit line intermediate layer may be between the bit line contact 132 and the bit line 134. The bit line intermediate layer may include, for example, a metal silicide, such as tungsten silicide, or a metal nitride, such as WN.

Although FIG. 2 illustrates that the bit line contact 132 is formed to have a bottom surface at a same level as that of the top surface of the substrate 110, in an embodiment of the present inventive concept, a recess may be formed in a certain depth from the top surface of the substrate 110, and the bit line contact 132 may extend into the recess, and therefore, the bottom surface of the bit line contact 132 may be formed at a level that is lower than the level of the top surface of the substrate 110.

A first insulating layer 142 and a second insulating layer 144 may be sequentially arranged on the substrate 110, and the bit line structure 130 may penetrate through the first insulating layer 142 and the second insulating layer 144 and be connected to the first source/drain region 114A.

A capacitor contact 150 may be arranged on the second source/drain region 114B. A sidewall of the capacitor contact 150 may be at least partially surrounded by the first insulating layer 142 and the second insulating layer 144. In an embodiment of the present inventive concept, the capacitor contact 150 may include a lower contact pattern, a metal silicide layer, an upper contact pattern, and a barrier layer at least partially surrounding a side surface and a bottom surface of the upper contact pattern. In an embodiment of the present inventive concept, the lower contact pattern may include polysilicon, and the upper contact pattern may include a metal material. The barrier layer may include a conductive metal nitride.

A third insulating layer 146 may be arranged on the second insulating layer 144, and a landing pad 152 connected to the capacitor contact 150 may be arranged to penetrate through the third insulating layer 146. As shown in FIG. 2, the landing pad 152 may vertically overlap with the capacitor contact 150, and may be formed to have a width greater than a width of the capacitor contact 150. For example, the landing pad 152 may completely overlap an upper surface of the capacitor contact 150. In an embodiment of the present inventive concept, the landing pad 152 may include at least one of the following materials: a metal, such as ruthenium (Ru), Ti, Ta, niobium (Nb), iridium (Ir), molybdenum (Mo), and W; and/or a conductive metal nitride, such as TiN, TaN, niobium nitride (NbN), molybdenum nitride (MoN), and WN. For example, the landing pad 152 may include TiN.

An etch stop layer 162 may be formed on the landing pad 152 and the third insulating layer 146. The etch stop layer 162 may include an opening 162H exposing a top surface of the landing pad 152.

A capacitor structure CS may be arranged on the etch stop layer 162 and the third insulating layer 146. The capacitor structure CS may include a lower electrode 170 electrically connected to the capacitor contact 150 through the landing pad 152 disposed on the capacitor contact 150. The capacitor structure CS may additionally include a dielectric layer 180, which covers the lower electrode 170, and an upper electrode 185 disposed on the dielectric layer 180. The lower electrode 170 may be arranged in an opening 210H of a mold structure 210 (see FIG. 20).

In an embodiment of the present inventive concept, as shown in FIG. 4, the lower electrode 170 may further include a capping layer 195 that is arranged at a position lower than that of a surface 194F of a second supporter 194. The capping layer 195 may be buried and arranged in a recess hole RS1 that is formed at a position lower than that of the surface 194F of the second supporter 194. For example, a lower surface of the recess hole RS1 may be lower than the surface 194F of the second supporter 194. In an embodiment of the present inventive concept, the capping layer 195 may include a conductive metal nitride, for example, TiN.

In an embodiment of the present inventive concept, the capacitor structure CS may include a first interface layer IF1 arranged between a sidewall of the lower electrode 170 and the dielectric layer 180, and between the capping layer 195 and the dielectric layer 180. The first interface layer IF1 may be arranged outside the opening 210H of the mold structure 210 (see FIG. 20). The first interface layer IF1 may include a conductive metal nitride. In an embodiment of the present inventive concept, the first interface layer IF1 may include NbN or niobium titanium oxynitride (NbTiON).

In an embodiment of the present inventive concept, the capacitor structure CS may include a second interface layer IF2 arranged between the dielectric layer 180 and the upper electrode 185. In an embodiment of the present inventive concept, the second interface layer IF2 may include a conductive metal oxide. In an embodiment of the present inventive concept, the second interface layer IF2 may include niobium oxide (NbO).

The lower electrode 170 may be on the landing pad 152, and a bottom portion of the lower electrode 170 may be in the opening 162H of the etch stop layer 162. A width of the bottom portion of the lower electrode 170 may be less than a width of the landing pad 152, and accordingly, the entire bottom portion of the lower electrode 170 may be disposed on the landing pad 152. For example, the entire bottom portion of the lower electrode 170 may contact the landing pad 152.

In an embodiment of the present inventive concept, as shown in FIG. 2, the lower electrode 170 may have a shape of a pillar, column, or cylinder extending in a third direction (e.g., a vertical direction or a Z direction). As shown in FIG. 1, the lower electrode 170 may have a horizontal cross-section that is circular, but the present inventive concept is not limited thereto. In an embodiment of the present inventive concept, the cross-section of the lower electrode 170 may include various kinds of polygons or rounded polygons, for example, an oval, a square, a rounded square, a diamond, a trapezoid, and the like.

As shown in FIG. 1, the lower electrode 170 and the capacitor contact 150 may be repeatedly arranged in a first direction (an X direction) and a second direction (a Y direction). In addition, the landing pad 152 may vertically overlap with the lower electrode 170, and may be spaced apart from the lower electrode 170 in the first direction (the X direction) and the second direction (the Y direction) and may be arranged in the form of a matrix.

In an embodiment of the present inventive concept, unlike shown in FIG. 1, the capacitor contact 150 is repeatedly arranged in the first direction (e.g., the X direction) and the second direction (e.g., the Y direction), but the lower electrode 170 may be arranged in a hexagon shape, such as a honeycomb structure. In this case, the landing pad 152 may vertically overlap with a portion of the capacitor contact 150, and may vertically overlap with an entirety of a portion of the lower electrode 170.

The lower electrode 170 may include an electrode layer 172. The electrode layer 172 may include NbN. In an embodiment of the present inventive concept, the electrode layer 172 may include a single electrode layer including NbN. A first supporter 192 and a second supporter 194 may be arranged spaced apart from each other in the third direction (e.g., the Z direction) on a sidewall of the lower electrode 170.

The lower electrode 170 may include a first sidewall portion (e.g., a first portion of a sidewall) 172S1 and a second sidewall portion (e.g., a second portion of the sidewall) 172S2. The first sidewall portion 172S1 may be at least partially surrounded by the first supporter 192 and the second supporter 194. For example, as shown in FIG. 3, the first sidewall portion 172S1 of the lower electrode 170 may contact a sidewall 192S of the first supporter 192. As shown in FIG. 4, the first sidewall portion 172S1 of the lower electrode 170 may contact at least a portion of a sidewall 194S of the second supporter 194. As shown in FIGS. 3 and 4, the first sidewall portion 172S1 and the second sidewall portion 172S2 may be coplanar with each other and may be aligned with respect to each other. For example, the first sidewall portion 172S1 and the second sidewall portion 172S2 may form a single sidewall of the lower electrode 170.

The first supporter 192 and the second supporter 194 may be arranged between the lower electrode 170 and another lower electrode 170 adjacent thereto, and may function as supporting members to prevent falling or destruction of the lower electrode 170 in a process of forming the mold structure 210 (see FIG. 21) or a process of forming the dielectric layer 180. The first supporter 192 and the second supporter 194 may include, for example, silicon nitride, silicon oxynitride, silicon boron nitride (SiBN), or silicon carbon nitride (SiCN).

The second supporter 194 may be arranged at an upper portion of the sidewall of the lower electrode 170, and the first supporter 192 may be arranged at a middle portion of the sidewall of the lower electrode 170, which is at a level lower than that of the second supporter 194 with reference to the top surface of the substrate 110. Although FIG. 2 illustrates that one first supporter 192 and one second supporter 194 are formed on the sidewall of the lower electrode 170, the number of first supporters 192 and the number of second supporters 194 may be changed. In an embodiment of the present inventive concept, a plurality of first supporters 192 may be formed, and the plurality of first supporters 192 may be arranged spaced apart from each other at a substantially same interval in the vertical direction (e.g., the Z direction).

The first interface layer IF1 may be arranged on a sidewall of the electrode layer 172, that is, between the second sidewall portion 172S2 and the dielectric layer 180 and between a top surface of the capping layer 195 and the dielectric layer 180. The dielectric layer 180 may be arranged on a sidewall of the first interface layer IF1 and a top surface of the first interface layer IF1 on the lower electrode 170.

The dielectric layer 180 may extend from the first interface layer IF1 on the sidewall of the lower electrode 170 to top surfaces and bottom surfaces of the first supporter 192 and the second supporter 194, and may also be arranged on the etch stop layer 162. The dielectric layer 180 may have a thickness of from about 20 Å to about 100 Å, but the present inventive concept is not limited thereto.

In an embodiment of the present inventive concept, the dielectric layer 180 may include at least one of zirconium oxide, hafnium oxide, titanium oxide, niobium oxide, tantalum oxide, yttrium oxide, strontium titanium oxide, barium strontium titanium oxide, scandium oxide, and/or lanthanide oxide.

In an embodiment of the present inventive concept, the dielectric layer 180 may include hafnium oxide predominantly including a tetragonal crystal structure. In an embodiment of the present inventive concept, the dielectric layer 180 may have a stack structure including a first dielectric layer and a second dielectric layer, and at least one of the first dielectric layer and the second dielectric layer may include hafnium oxide predominantly including a tetragonal crystal structure.

The upper electrode 185 covering the lower electrode 170 may be arranged on the dielectric layer 180. For example, the upper electrode 185 may be arranged above the dielectric layer 180. In an embodiment of the present inventive concept, the second interface layer IF2 may be arranged between the dielectric layer 180 and the upper electrode 185. The upper electrode 185 may include, for example, NbN. In an embodiment of the present inventive concept, the upper electrode 185 may include a single electrode layer including NbN.

In an embodiment of the present inventive concept, when the first interface layer IF1 includes a conductive metal nitride, for example, NbN or niobium oxynitride (NbTiON), the dielectric layer 180 contacting the first interface layer IF1 may include hafnium oxide having a tetragonal crystal structure.

For example, the first interface layer IF1 including a conductive metal nitride, such as NbN or NbTiON, contacts the dielectric layer 180, and in the process of forming the dielectric layer 180, the dielectric layer 180 may predominantly (e.g., greater than 50%) include the tetragonal crystal structure compared with a monoclinic crystal structure.

In an embodiment of the present inventive concept, when the first interface layer IF1 includes a conductive metal nitride, such as NbN or NbTiON, after a thermal treatment process performed after the process of forming the dielectric layer 180, the dielectric layer 180 may be crystallized to predominantly include a tetragonal crystal structure when compared with the monoclinic crystal structure of the dielectric layer 180. The hafnium oxide having a tetragonal crystal structure may have a dielectric constant greater than that of hafnium oxide having a monoclinic crystal structure, and accordingly, the capacitor structure CS may have a relatively large capacitance.

In an embodiment of the present inventive concept, when the second interface layer IF2 includes a conductive metal oxide, such as NbO, leakage between the dielectric layer 180 and the upper electrode 185 may be inhibited to prevent a leakage.

Figure 5:
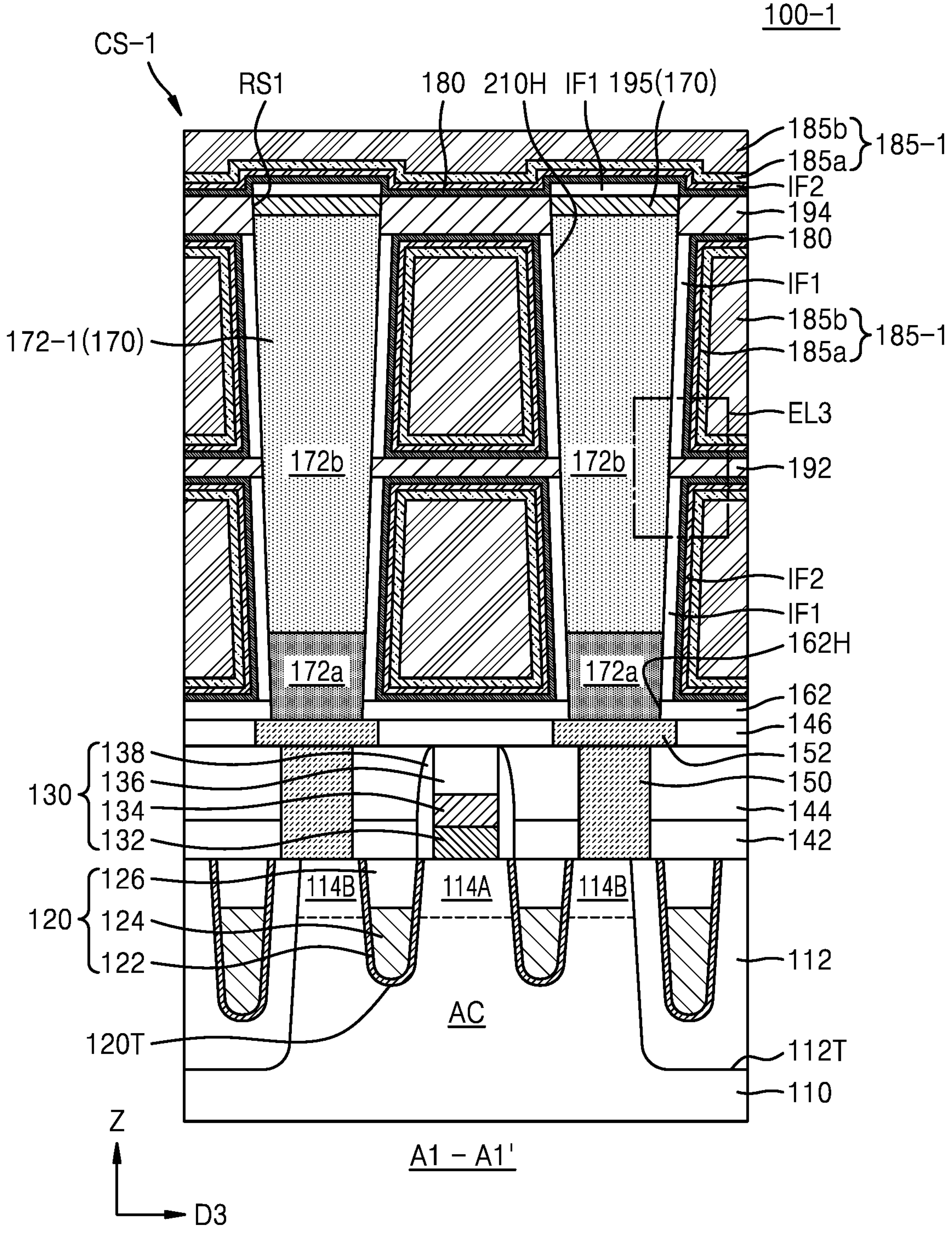
FIG. 5 is a cross-sectional view of an integrated circuit device according to an embodiment of the present inventive concept.
Figure 6:
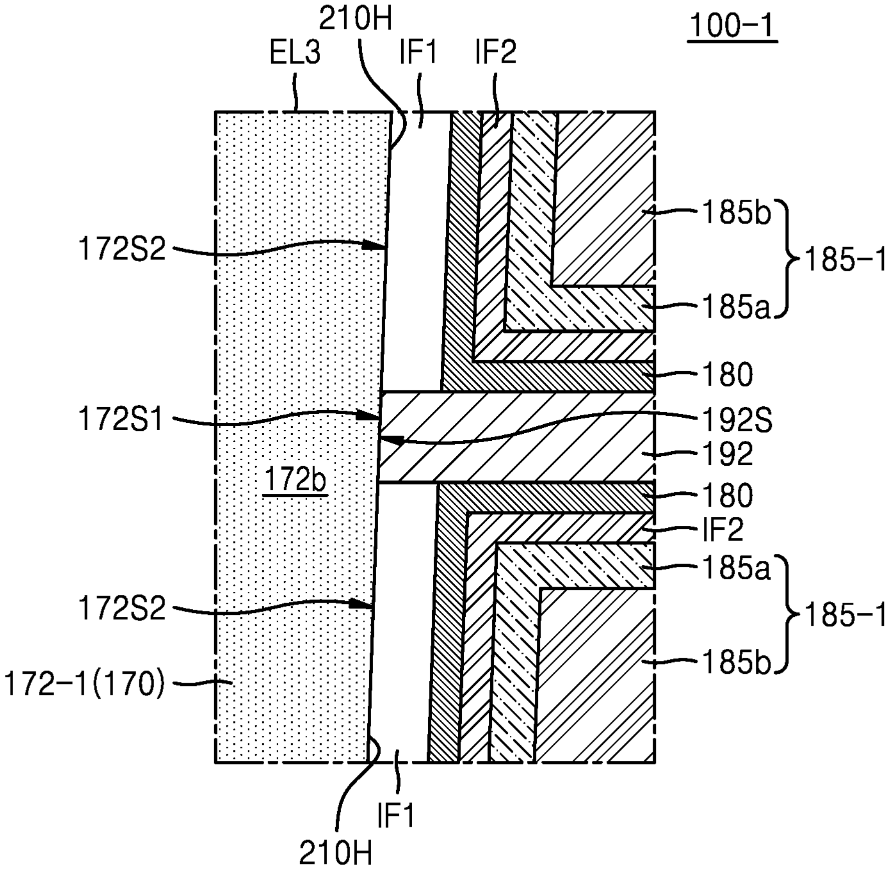
FIG. 6 is an enlarged view of portion shown in FIG. 5.

FIG. 5 is a cross-sectional view of the integrated circuit device 100-1 according to an embodiment of the present inventive concept, and FIG. 6 is an enlarged view of portion EL3 shown in FIG. 5.

For example, the integrated circuit device 100-1 may be identical to the integrated circuit device 100 shown in FIGS. 1 to 4, except that an electrode layer 172-1 and an upper electrode 185-1 include a plurality of layers. In FIGS. 5 and 6, same reference numerals as those of FIGS. 1 to 4 indicate same components or elements. In FIGS. 5 and 6, same descriptions as those of FIGS. 1 to 4 are briefly given or omitted.

The integrated circuit device 100-1 may include a capacitor structure CS-1. The capacitor structure CS-1 may include the lower electrode 170, the dielectric layer 180, and an upper electrode 185-1. The integrated circuit device 100-1 may include an electrode layer 172-1 included in the lower electrode 170.

The electrode layer 172-1 may include two layers including a first sub-electrode layer 172*a* arranged above the substrate 110 and a second sub-electrode layer 172*b* arranged on the first sub-electrode layer 172*a*. In an embodiment of the present inventive concept, the electrode layer 172-1 may include a double layer including TiN and NbN. In an embodiment of the present inventive concept, the first sub-electrode layer 172*a* may include TiN, and the second sub-electrode layer 172*b* may include NbN.

Figure 20:
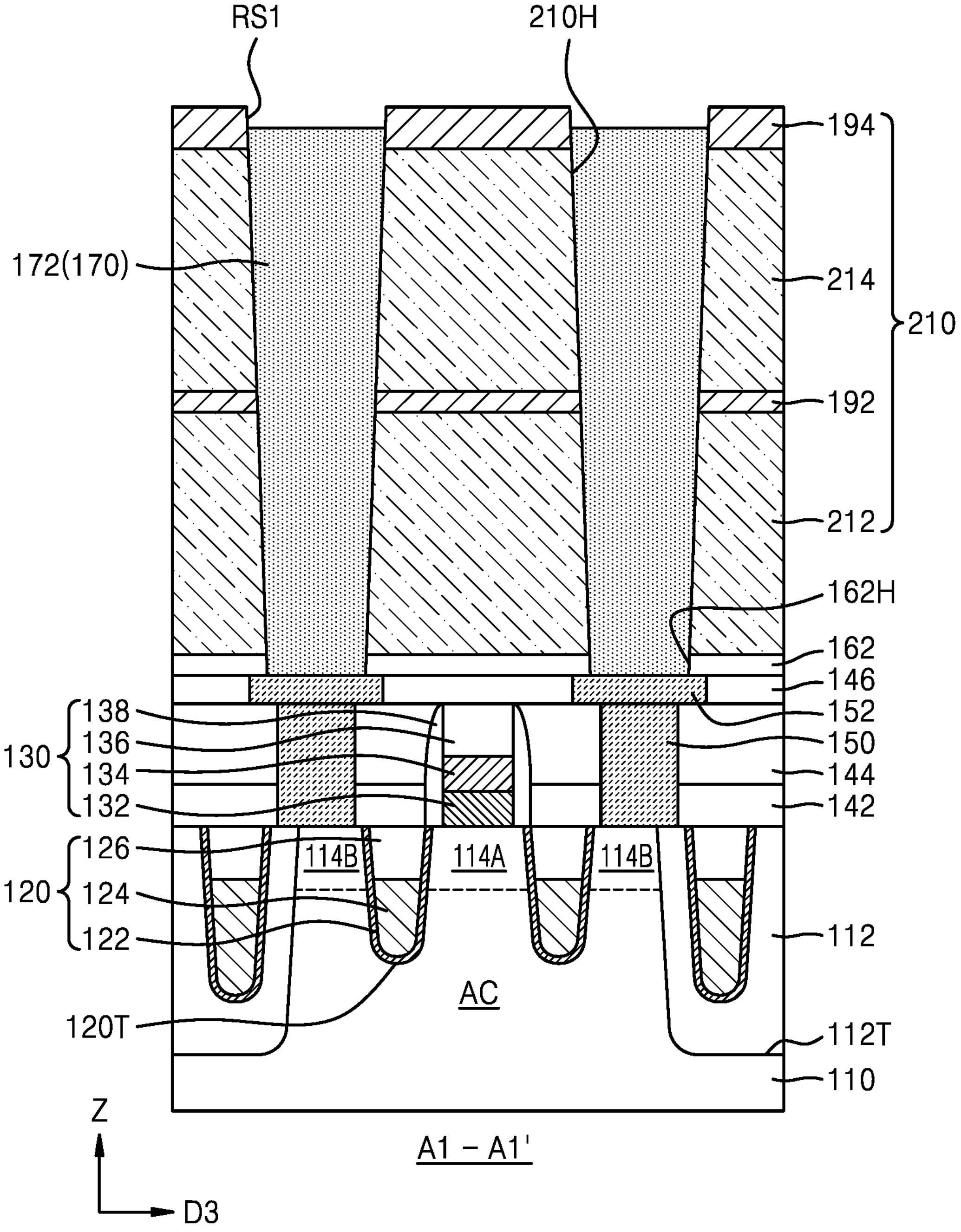
FIGS. 20, 21, 22, and 23 are cross-sectional views for describing a method of manufacturing an integrated circuit device according to an embodiment of the present inventive concept.

The electrode layer 172-1 may be arranged in the opening 210H of the mold structure 210 (see FIG. 20). A thickness of the first sub-electrode layer 172*a* and the second sub-electrode layer 172*b* may be adjusted according to necessity. A thickness of the second sub-electrode layer 172*b* may be greater than a thickness of the first sub-electrode layer 172*a*. The first interface layer IF1 may be arranged on sidewalls of the first sub-electrode layer 172*a* and the second sub-electrode layer 172*b*.

The upper electrode 185-1 may include a double layer including a fourth sub-electrode layer 185*a*, which is arranged above the dielectric layer 180, and a fifth sub-electrode layer 185*b* that is arranged on the fourth sub-electrode layer 185*a*. In an embodiment of the present inventive concept, the fourth sub-electrode layer 185*a* may include TiN, and the fifth sub-electrode layer 185*b* may include NbN. As described above, the integrated circuit device 100-1 may include various configurations of the electrode layer 172-1 and the upper electrode 185-1.

Figure 7:
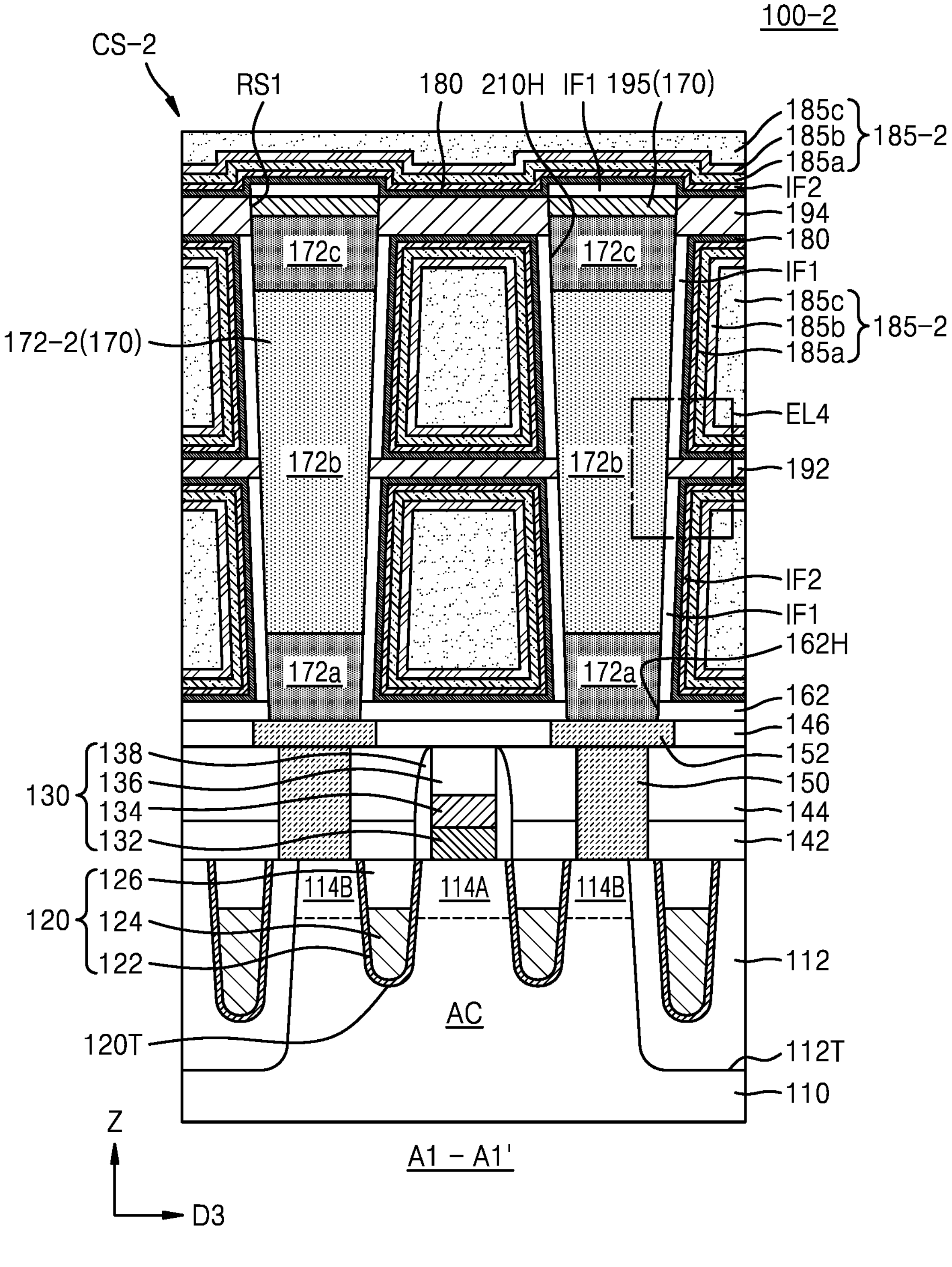
FIG. 7 is a cross-sectional view of an integrated circuit device according to an embodiment of the present inventive concept.
Figure 8:
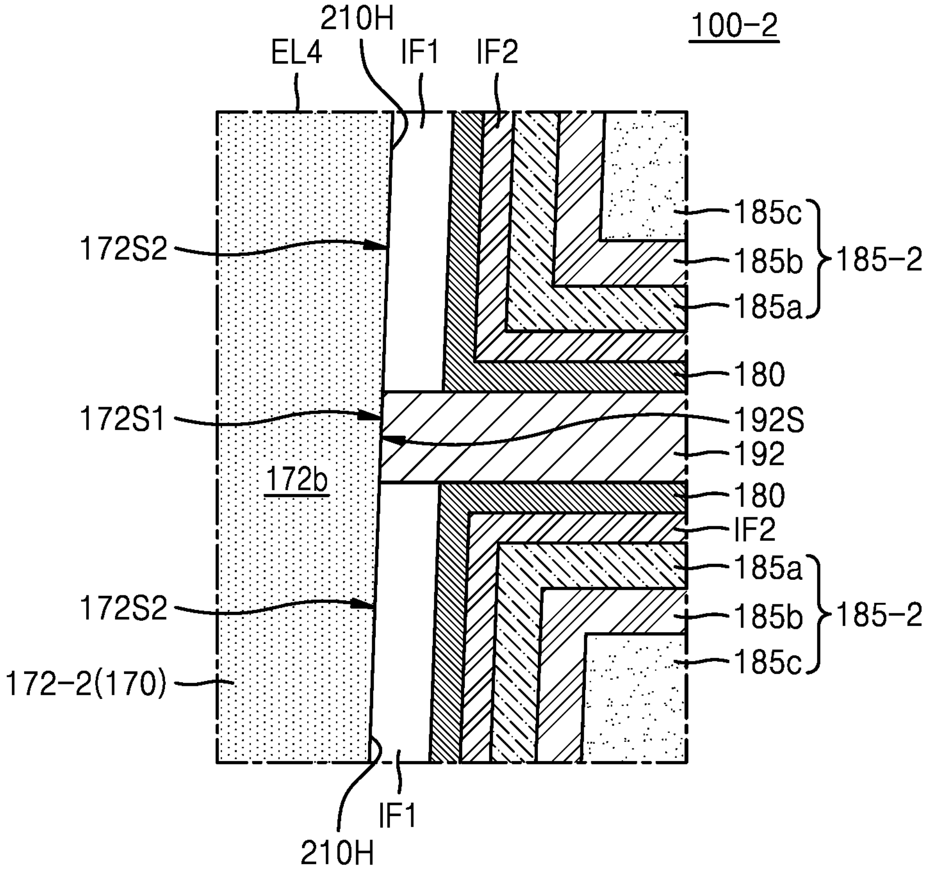
FIG. 8 is an enlarged view of portion shown in FIG. 7.

FIG. 7 is a cross-sectional view of an integrated circuit device 100-2 according to an embodiment of the present inventive concept, and FIG. 8 is an enlarged view of portion EL4 shown in FIG. 7.

For example, the integrated circuit device 100-2 may be identical to the integrated circuit device 100 shown in FIGS. 1 to 4, except that an electrode layer 172-2 and an upper electrode 185-2 each include a plurality of layers. In FIGS. 7 and 8, same reference numerals as those of FIGS. 1 to 4 indicate same components or elements. In FIGS. 7 and 8, same descriptions as those of FIGS. 1 to 4 are briefly given or omitted.

The integrated circuit device 100-2 may include a capacitor structure CS-2. The capacitor structure CS-2 may include the lower electrode 170, the dielectric layer 180, and the upper electrode 185-2. The integrated circuit device 100-2 may include the electrode layer 172-2 included in the lower electrode 170. The electrode layer 172-2 may include three layers including the first sub-electrode layer 172*a*, which is arranged above the substrate 110, the second sub-electrode layer 172*b*, which is arranged on the first sub-electrode layer 172*a*, and a third sub-electrode layer 172*c*, which is arranged on the second sub-electrode layer 172*b*.

In an embodiment of the present inventive concept, the electrode layer 172-2 may include three layers including TiN, NbN, and TiN. In an embodiment of the present inventive concept, the first sub-electrode layer 172*a* may include TiN. The second sub-electrode layer 172*b* may include NbN, and the third sub-electrode layer 172*c* may include TiN.

The electrode layer 172-2 may be arranged in the opening 210H of the mold structure 210 (see FIG. 20). Thicknesses of the first sub-electrode layer 172*a*, the second sub-electrode layer 172*b*, and the third sub-electrode layer 172*c* may be adjusted according to necessity. For example, a thickness of the second sub-electrode layer 172*b* may be greater than each of a thickness of the first sub-electrode layer 172*a* and a thickness of the second sub-electrode layer 172*b*. The first interface layer IF1 may be arranged on sidewalls of the first sub-electrode layer 172*a*, the second sub-electrode layer 172*b*, and the third sub-electrode layer 172*c*.

The upper electrode 185-2 may include three layers including the fourth sub-electrode layer 185*a*, which is arranged above the dielectric layer 180, the fifth sub-electrode layer 185*b*, which is arranged on the fourth sub-electrode layer 185*a*, and a sixth sub-electrode layer 185*c*, which is arranged on the fifth sub-electrode layer 185*b*.

In an embodiment of the present inventive concept, the fourth sub-electrode layer 185*a* may include TiN. The fifth sub-electrode layer 185*b* may include NbN, and the sixth sub-electrode layer 185*c* may include TiN. As described above, the integrated circuit device 100-2 may include various configurations of the electrode layer 172-2 and the upper electrode 185-2.

Figure 9:
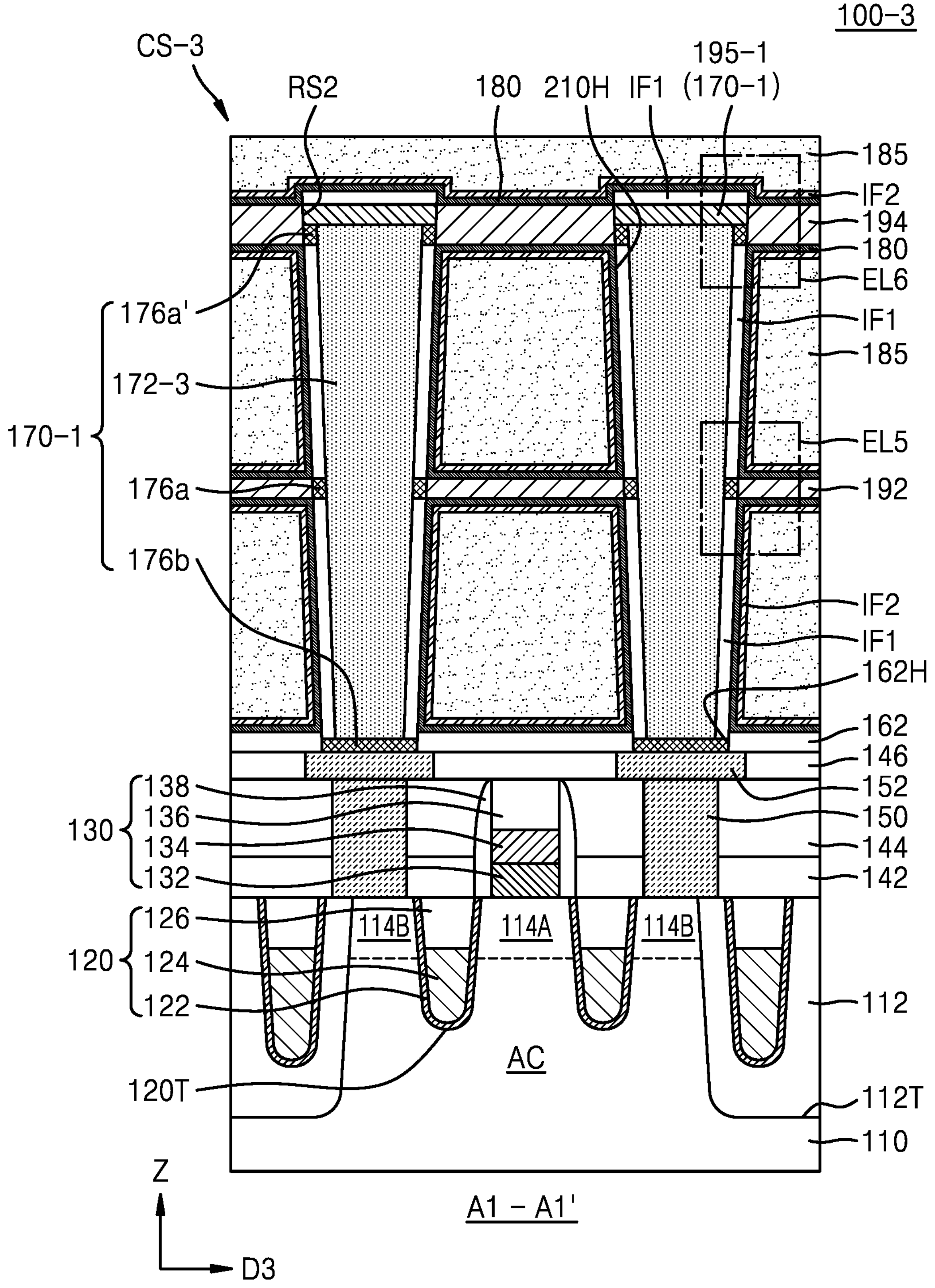
FIG. 9 is a cross-sectional view of an integrated circuit device according to an embodiment of the present inventive concept.
Figure 10:
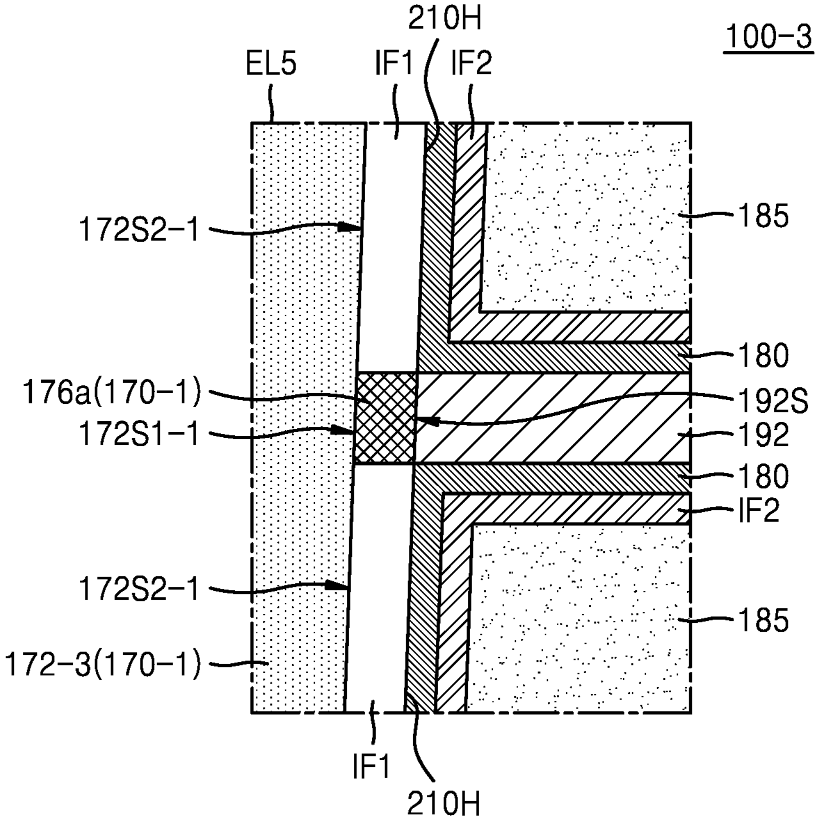
FIGS. 10 and 11 are enlarged views of portion and portion shown in FIG. 9, respectively.
Figure 11:
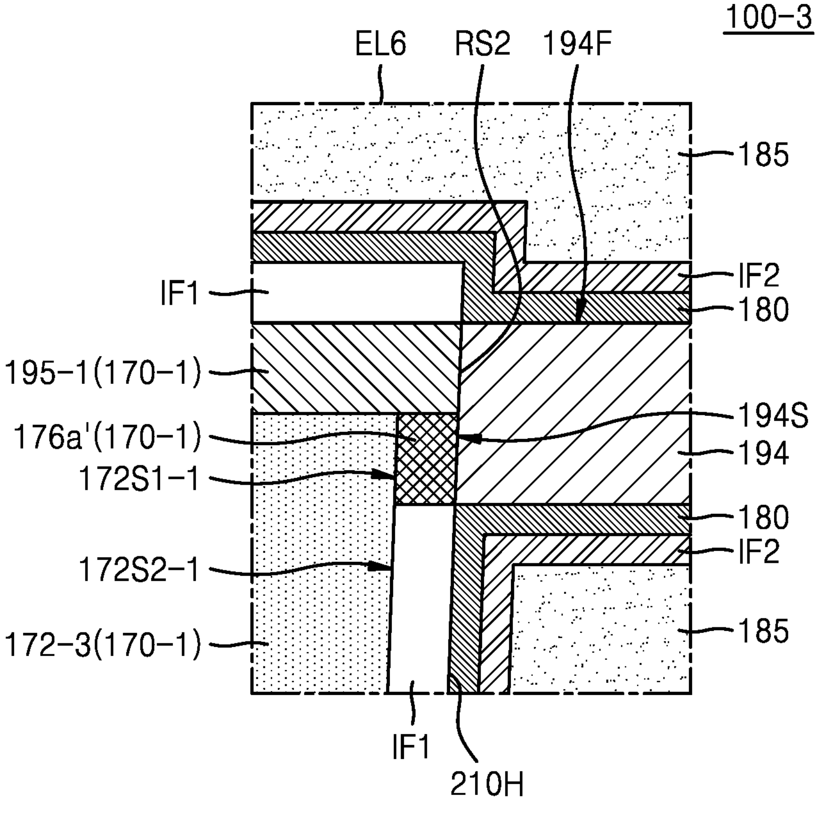

FIG. 9 is a cross-sectional view of an integrated circuit device 100-3 according to an embodiment of the present inventive concept, and FIGS. 10 and 11 are enlarged view of portion EL5 and portion EL6 shown in FIG. 9, respectively.

For example, the integrated circuit device 100-3 may be almost identical to the integrated circuit device 100 shown in FIGS. 1 to 4 except that a lower electrode 170-1 includes first seed layers 176*a* and 176*a*' and a second seed layer 176*b*, and the first interface layer IF1 is formed on the inside of the opening 210H. In FIGS. 9 to 11, same reference numerals as those of FIGS. 1 to 4 indicate same components or elements. In FIGS. 9 to 11, same descriptions as those of FIGS. 1 to 4 are briefly given or omitted.

The integrated circuit device 100-3 may include a capacitor structure CS-3. The capacitor structure CS-3 may include the lower electrode 170-1, the dielectric layer 180, and the upper electrode 185. The lower electrode 170-1 may include an electrode layer 172-3 extending in a direction substantially perpendicular to the top surface of the substrate 110, and the electrode layer 172-3 may include NbN. As shown in FIGS. 10 and 11, the electrode layer 172-3 may be spaced apart from the inside of the opening 210H. For example, the electrode layer 172-3 may be spaced apart from an inner sidewall of the opening 210H.

In other words, the electrode layer 172-3 may be formed on the first interface layer IF1 that is on the inside of the opening 210H. The first interface layer IF1 may include a conductive metal nitride. In an embodiment of the present inventive concept, the first interface layer IF1 may include NbN or NbTiON.

The lower electrode 170-1 may include the first seed layers 176*a* and 176*a*'. The lower electrode 170-1 may include the first seed layers 176*a* and 176*a*' respectively surrounded by supporters 192 and 194 and contacting at least a portion of the electrode layer 172-3. The first seed layers 176*a* and 176*a*' may be respectively arranged between the first supporter 192 and the electrode layer 172-3 and between the second supporter 194 and the electrode layer 172-3.

The lower electrode 170-1 may include the second seed layer 176*b*. The second seed layer 176*b* may be arranged between the electrode layer 172-3 and the landing pad 152. The second seed layer 176*b* may be formed on an inner wall of the opening 162H of the etch stop layer 162, and a top surface of the second seed layer 176*b* may contact a bottom surface of the electrode layer 172-3. For example, the top surface of the second seed layer 176*b* may contact an entirety of the bottom surface of the electrode layer 172-3. In an embodiment of the present inventive concept, the first seed layers 176*a* and 176*a*' and the second seed layer 176*b* may include TiN.

As shown in FIGS. 10 and 11, the electrode layer 172-3 may include a first sidewall portion 172S1-1 and a second sidewall portion 172S2-1. The first sidewall portion 172S1-1 may be surrounded by the first seed layers 176*a* and 176*a*' and might not contact the sidewalls 192S and 194S of the supporters 192 and 194. The first seed layers 176*a* and 176*a*' may be between the first sidewall portion 172S1-1 and the sidewalls 192S and 194S of the supporters 192 and 194.

The second sidewall portion 172S2-1 may be at least partially surrounded by the first interface layer IF1. The second sidewall portion 172S2-1 may contact the first interface layer IF1 without contacting the supporters 192 and 194. The first interface layer IF1 may be formed on the inside of the opening 210H of the mold structure 210 (see FIG. 26).

The second sidewall portion 172S2-1 may be coplanar with the first sidewall portion 172S1-1. The first sidewall portion 172S1-1 and the second sidewall portion 172S2-1 may be aligned with respect to each other. The first seed layers 176*a* and 176*a*' may have a thickness of about 5 Å to about 200 Å in a direction substantially perpendicular to a sidewall of the electrode layer 172-3, but present inventive concept is not limited thereto.

As shown in FIG. 11, the lower electrode 170-1 may further include a capping layer 195-1 arranged at a level lower than a surface 194F of the second supporter 194. For example, a lower surface of the capping layer 195-1 may be arranged at a level lower than a level of the surface 194F of the second supporter 194. The capping layer 195-1 may be buried and arranged in a recess hole RS2 that is formed at a level lower than the surface 194F of the second supporter 194. The capping layer 195-1 may be arranged on the electrode layer 172-1 and the first seed layer 176*a*'. In an embodiment of the present inventive concept, the capping layer 195-1 may include a conductive metal nitride, for example, TiN.

The integrated circuit device 100-3 may include the second interface layer IF2 between the dielectric layer 180 and the upper electrode 185. The second interface layer IF2 may include, for example, a conductive metal oxide. In an embodiment of the present inventive concept, the second interface layer IF2 may include NbO. As described above, the integrated circuit device 100-3 may include various configurations of the lower electrode 170-1 and the first interface layer IF1.

Figure 12:
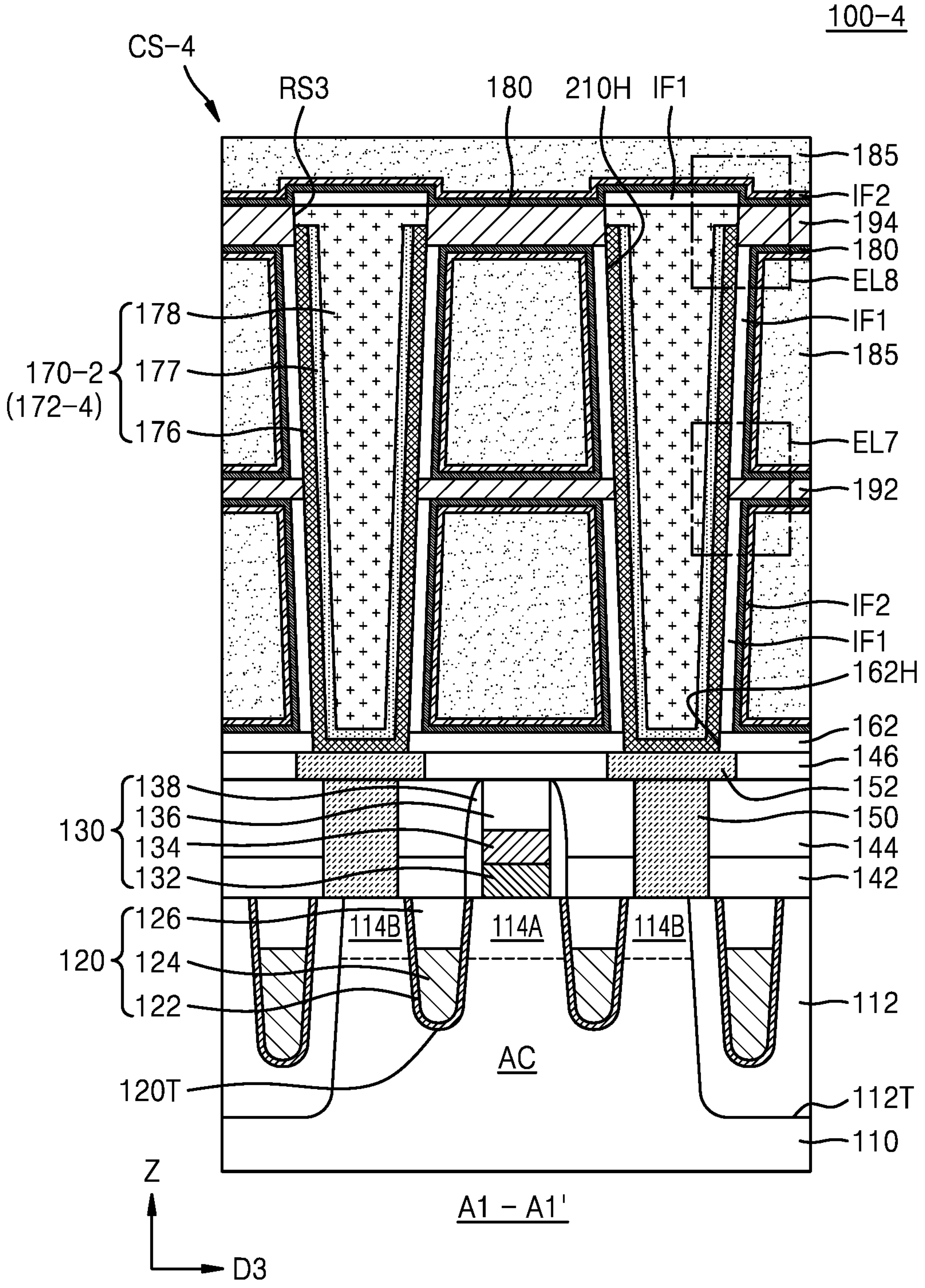
FIG. 12 is a cross-sectional view of an integrated circuit device according to an embodiment of the present inventive concept.
Figure 13:
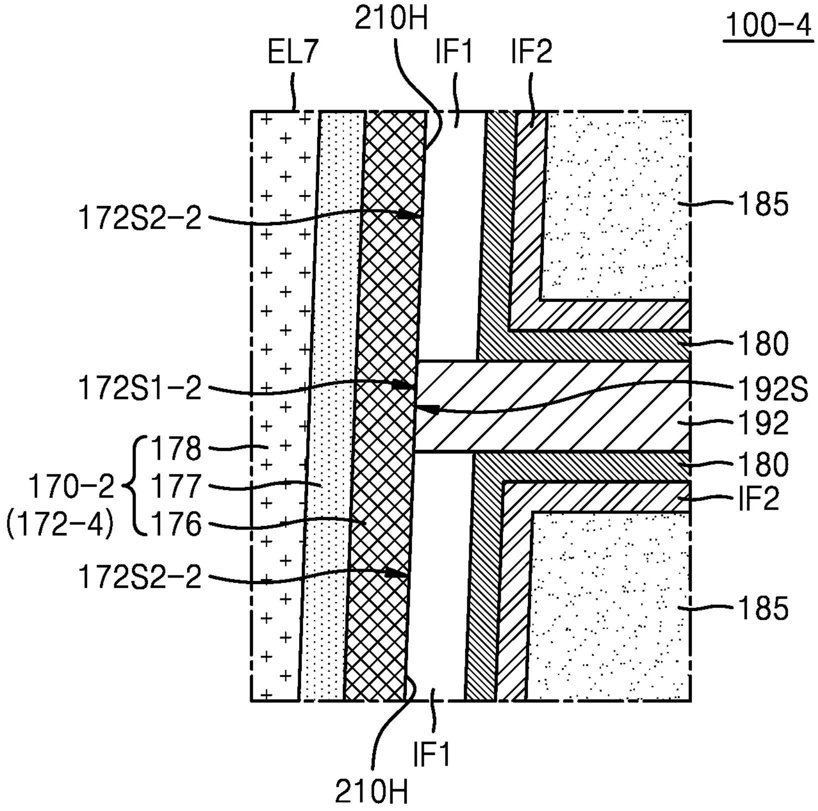
FIGS. 13 and 14 are enlarged views of portion and portion shown in FIG. 12, respectively.
Figure 14:
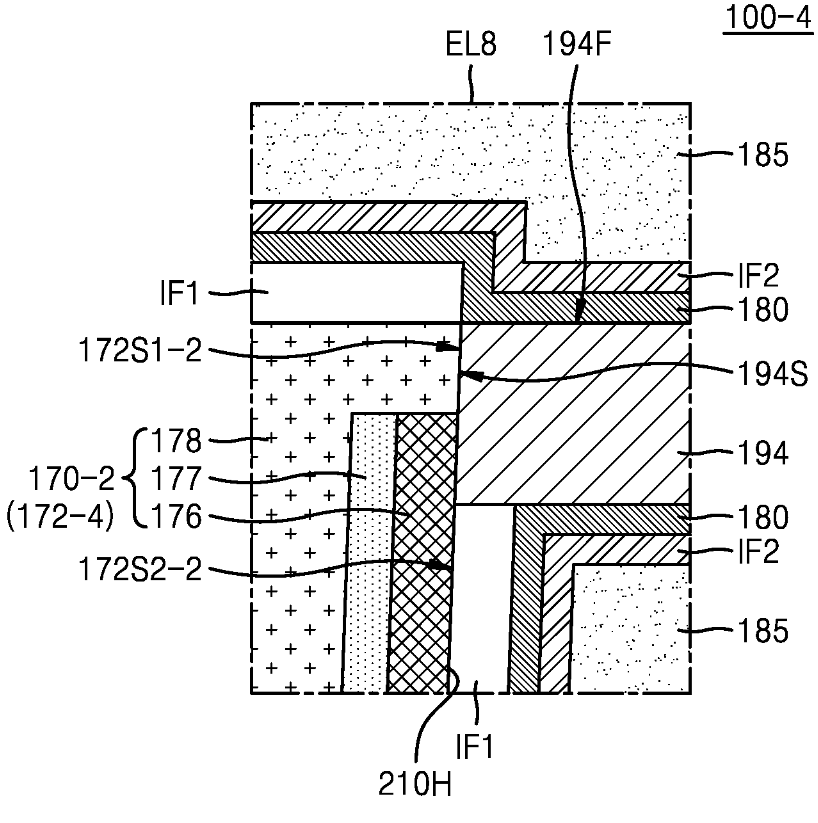

FIG. 12 is a cross-sectional view of an integrated circuit device 100-4 according to an embodiment of the present inventive concept, and FIGS. 13 and 14 are cross-sectional views of portion EL7 and portion EL8 shown in FIG. 12, respectively.

For example, the integrated circuit device 100-4 may be almost identical to the integrated circuit device 100 shown in FIGS. 1 to 4, except that a lower electrode 170-2 includes an electrode layer 172-4 including three layers and does not include the capping layer 195. In FIGS. 12 to 14, same reference numerals as those of FIGS. 1 to 4 indicate same components or elements. In FIGS. 12 to 14, same descriptions as those of FIGS. 1 to 4 are briefly given or omitted.

The integrated circuit device 100-4 may include a capacitor structure CS-4. The capacitor structure CS-4 may include the lower electrode 170-2, the dielectric layer 180, and the upper electrode 185. The lower electrode 170-2 may include the electrode layer 172-3 extending in the direction substantially perpendicular to the top surface of the substrate 110. As shown in FIGS. 13 and 14, the electrode layer 172-3 may be formed on the inside of the opening 210H. The electrode layer 172-3 may include three layers including a u-shaped first sub-electrode layer 176, which is arranged above the substrate 110, a u-shaped second sub-electrode layer 177, which is disposed on the u-shape first sub-electrode layer 176, and a third sub-electrode layer 178 that is disposed on the u-shape second sub-electrode layer 177.

In an embodiment of the present inventive concept, the u-shaped first sub-electrode layer 176 may include TiN. The u-shaped second sub-electrode layer 177 may include NbN, and the third sub-electrode layer 178 may include TiN.

Figure 32:
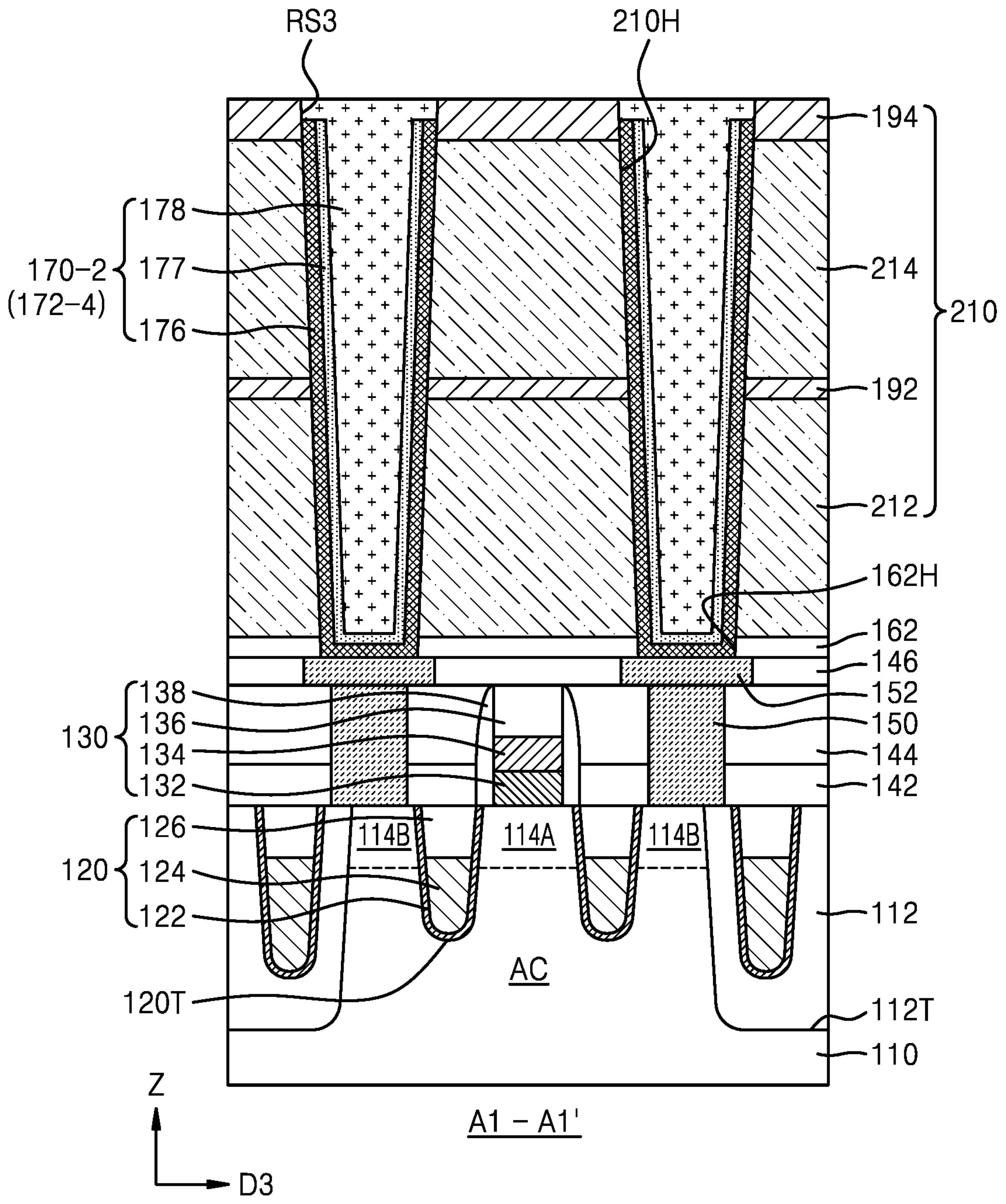

The electrode layer 172-4 may be arranged in the opening 210H of the mold structure 210 (see FIG. 32). Thicknesses of the u-shaped first sub-electrode layer 176, the u-shaped second sub-electrode layer 177, and the third sub-electrode layer 178 may be adjusted according to necessity. In the opening 210H, the third sub-electrode layer 178 may be formed on the u-shaped first sub-electrode layer 176 and the u-shaped second sub-electrode layer 177.

The third sub-electrode layer 178 may also be formed in a recess hole RS3 and on the u-shaped first sub-electrode layer 176 and the u-shaped second sub-electrode layer 177. A thickness of the third sub-electrode layer 178 may be greater than each of a thickness of the u-shaped first sub-electrode layer 176 and a thickness of the u-shaped second sub-electrode layer 177.

The first interface layer IF1 may be on a sidewall of the u-shaped first sub-electrode layer 176. The first interface layer IF1 may be located outside the opening 210H. The first interface layer IF1 may include, for example, a conductive metal nitride. In some embodiments, the first interface layer IF1 may include NbN or NbTiON.

As shown in FIGS. 13 and 14, the electrode layer 172-4 may include a first sidewall portion 172S1-2 and a second sidewall portion 172S2-2. The first sidewall portion 172S1-2 may be at least partially surrounded by the supporters 192 and 194. The second sidewall portion 172S2-2 may be surrounded by the first interface layer IF1. The second sidewall portion 172S2-2 may contact the first interface layer IF1 without contacting the supporters 192 and 194.

The first interface layer IF1 may be formed outside the opening 210H of the mold structure 210 (see FIG. 32).

The second sidewall portion 172S2-2 may be coplanar with the first sidewall portion 172S1-2. The first sidewall portion 172S1-2 and the second sidewall portion 172S2-2 may be aligned with respect to each other. As shown in FIG. 14, the first interface layer IF1 may be formed on the lower electrode 170-2. As shown in FIG. 14, the lower electrode 170-2 might not include a capping layer arranged at a level lower than the surface 194F of the second supporter 194.

The integrated circuit device 100-4 may include the second interface layer IF2 between the dielectric layer 180 and the upper electrode 185. The second interface layer IF2 may include, for example, a conductive metal oxide. In an embodiment of the present inventive concept, the second interface layer IF2 may include NbO. As described above, the integrated circuit device 100-4 may include various configurations of the lower electrode 170-2 and the first interface layer IF1.

Figure 15:
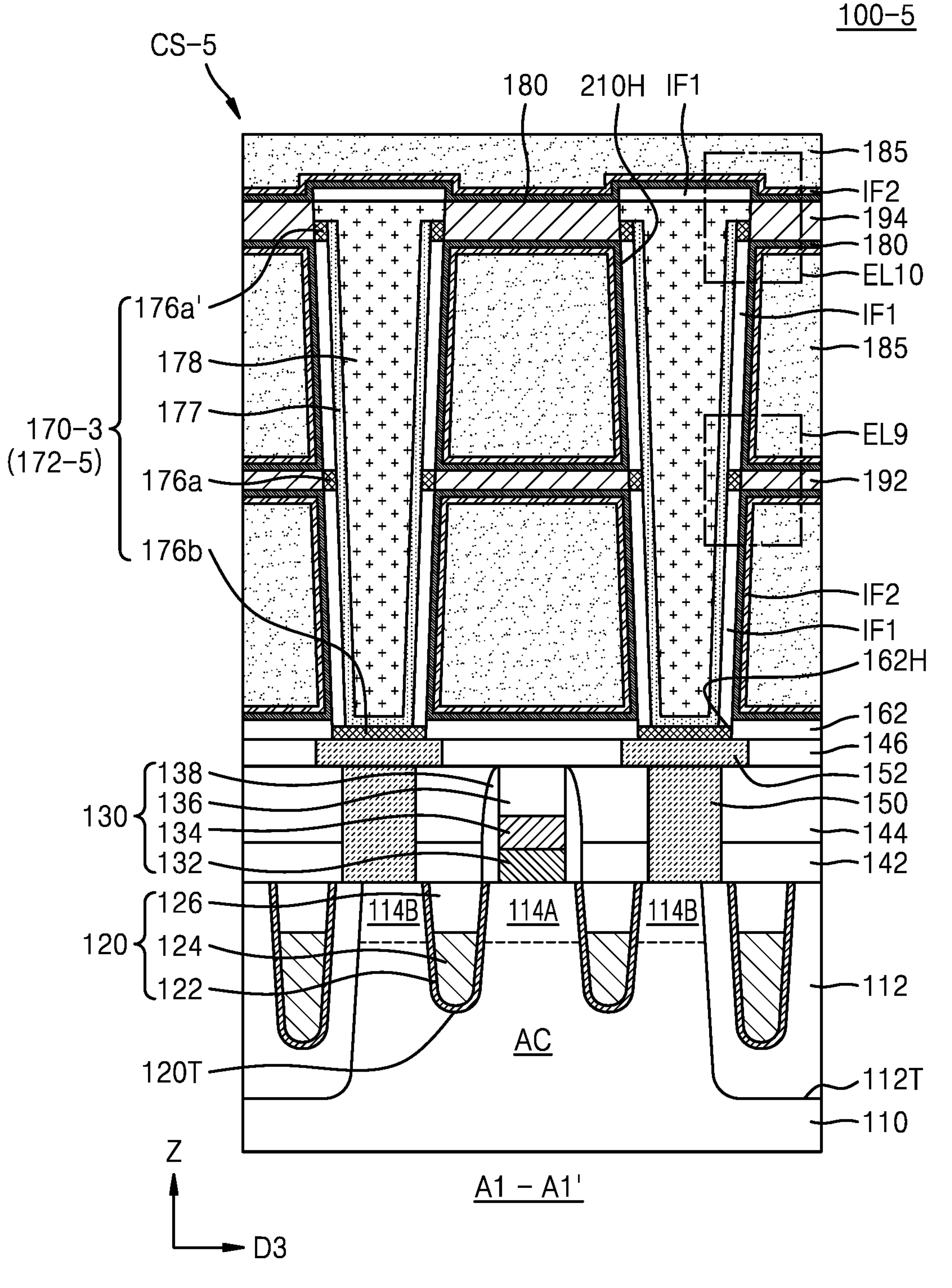
FIG. 15 is a cross-sectional view of an integrated circuit device according to an embodiment of the present inventive concept.
Figure 16:
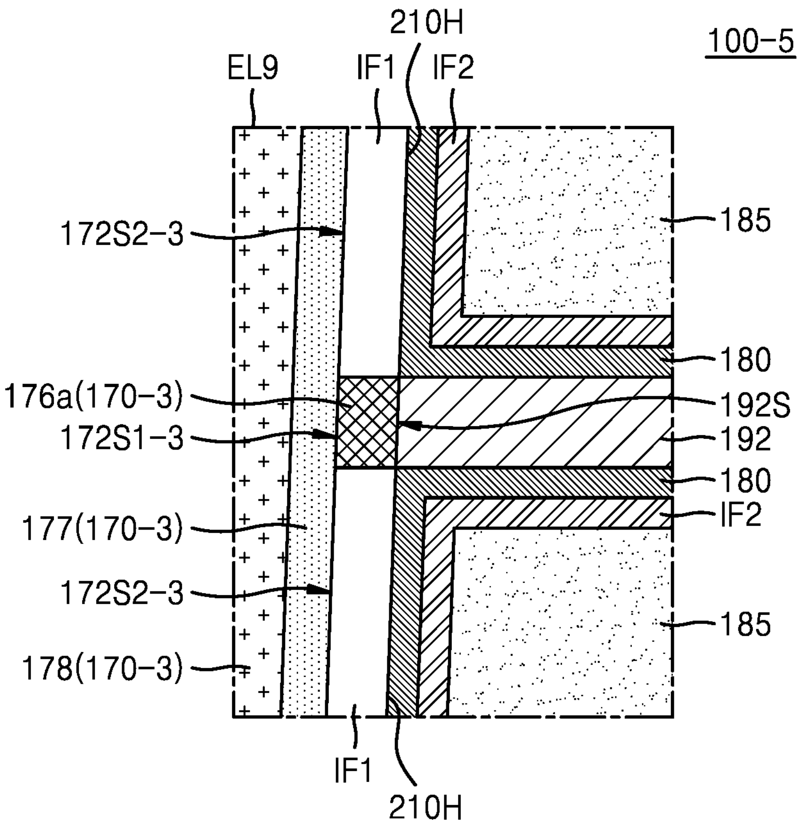
FIGS. 16 and 17 are enlarged views of portion and portion shown in FIG. 15.
Figure 17:
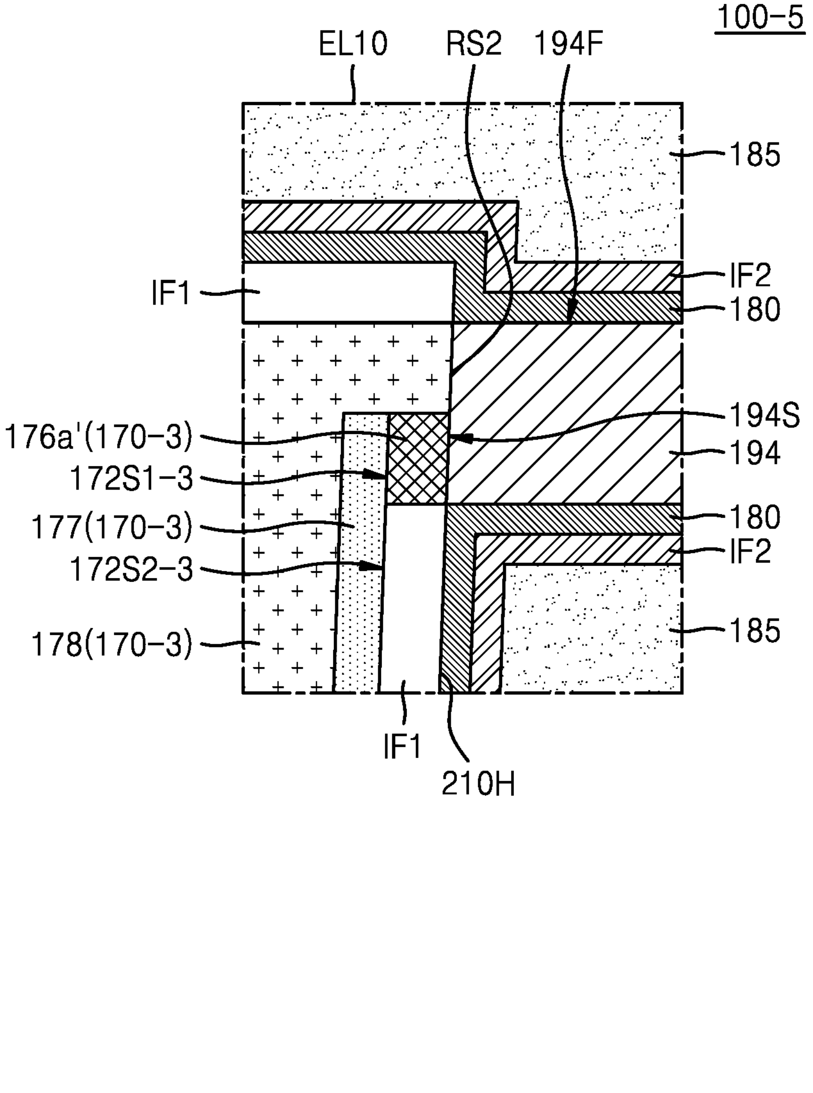

FIG. 15 is a cross-sectional view of an integrated circuit device 100-5 according to an embodiment of the present inventive concept, and FIGS. 16 and 17 are enlarged views of portion EL9 and portion 10 shown in FIG. 15, respectively.

For example, the integrated circuit device 100-5 may be almost identical to the integrated circuit device 100 shown in FIGS. 1 to 4, except that a lower electrode 170-3 includes an electrode layer 172-5 including two layers, and does not include the capping layer. Additionally, the integrated circuit device 100-5 includes the first seed layers 176*a* and 176*a*', the second seed layer 176*b*. In addition, the first interface layer IF1 is formed in the opening 210H. The integrated circuit device 100-5 may be identical to the integrated circuit device 100-4 shown in FIGS. 12 to 14, except that the lower electrode 170-3 includes the electrode layer 172-5 including two layers.

In FIGS. 15 to 17, same reference numerals as those of FIGS. 1 to 4 and FIGS. 12 to 14 indicate same components or elements. In FIGS. 15 to 17, same descriptions as those of FIGS. 1 to 4 and FIGS. 12 to 14 are briefly given or omitted.

The integrated circuit device 100-5 may include a capacitor structure CS-5. The capacitor structure CS-5 may include the lower electrode 170-3, the dielectric layer 180, and the upper electrode 185. The lower electrode 170-3 may include the electrode layer 172-5 extending in the direction substantially perpendicular to the top surface of the substrate 110. As shown in FIGS. 16 and 17, the electrode layer 172-5 may be spaced apart from the inside (e.g., an inner sidewall) of the opening 210H.

The electrode layer 172-5 may be formed with the first interface layer IF1 on the inside of the opening 210H. For example, the first interface layer IF1 may be disposed between the electrode layer 172-5 and inner sidewall of the opening 210H. The first interface layer IF1 may include, for example, a conductive metal nitride. In an embodiment of the present inventive concept, the first interface layer IF1 may include NbN or NbTiON.

The electrode layer 172-5 may include two layers including the u-shaped second sub-electrode layer 177, which is arranged above the substrate 110, and the third sub-electrode layer 178 that is disposed on the u-shaped second sub-electrode layer 177. In an embodiment of the present inventive concept, the u-shaped second sub-electrode layer 177 may include NbN, and the third sub-electrode layer 178 may include TiN.

The electrode layer 172-4 may be arranged in the opening 210H of the mold structure 210 (see FIG. 32). Thicknesses of the u-shaped second sub-electrode layer 177 and the third sub-electrode layer 178 may be adjusted according to necessity. The third sub-electrode layer 178 may be formed on the u-shaped second sub-electrode layer 177 that is disposed in the opening 210H. A thickness of the third sub-electrode layer 178 may be greater than that of the u-shaped second sub-electrode layer 177.

The first interface layer IF1 may be arranged on a sidewall of the u-shaped second sub-electrode layer 177. The first interface layer IF1 may be on the inside of the opening 210H. The first interface layer IF1 may include, for example, a conductive metal nitride. In an embodiment of the present inventive concept, the first interface layer IF1 may include NbN or NbTiON.

The lower electrode 170-3 may include the first seed layers 176*a* and 176*a*'. The lower electrode 170-3 may include the first seed layers 176*a* and 176*a*' at least partially surrounded by the supporters 192 and 194 and contacting at least a portion of the electrode layer 172-5. The first seed layers 176*a* and 176*a*' may be arranged between the first supporter 192 and the electrode layer 172-5 and between the second supporter 194 and the electrode layer 172-5.

The lower electrode 170-3 may include the second seed layer 176*b*. The second seed layer 176*b* may be arranged between the electrode layer 172-5 and the landing pad 152. The second seed layer 176*b* may be formed on the inner wall of the opening 162H of the etch stop layer 162, and the top surface of the second seed layer 176*b* may contact an entire portion of a bottom surface of the electrode layer 172-5. In an embodiment of the present inventive concept, the first seed layers 176*a* and 176*a*' and the second seed layer 176*b* may include TiN.

As shown in FIGS. 16 and 17, the electrode layer 172-5 may include a first sidewall portion 172S1-3 and a second sidewall portion 172S2-3. The first sidewall portion 172S1-3 may be at least partially surrounded by the first seed layers 176*a* and 176*a*', and might not contact the sidewalls 192S and 194S of the supporters 192 and 194. The first seed layers 176*a* and 176*a*' may be between the first sidewall portion 172S1-3 and the sidewalls 192S and 194S of the supporters 192 and 194.

The second sidewall portion 172S2-3 may be at least partially surrounded by the first interface layer IF1. The second sidewall portion 172S2-3 may contact the first interface layer IF1 without contacting the supporters 192 and 194. The first interface layer IF1 may be formed on the inside of the opening 210H of the mold structure 210 (see FIG. 26).

The second sidewall portion 172S2-3 may be coplanar with the first sidewall portion 172S1-3. The first sidewall portion 172S1-3 and the second sidewall portion 172S2-3 may be aligned with respect to each other. As shown in FIG. 17, the first interface layer IF1 may be formed on the lower electrode 170-3. As shown in FIG. 17, the lower electrode 170-3 might not include the capping layer arranged at a level lower than the surface 194F of the second supporter 194.

The integrated circuit device 100-5 may include the second interface layer IF2 between the dielectric layer 180 and the upper electrode 185. The second interface layer IF2 may include, for example, a conductive metal oxide. In an embodiment of the present inventive concept, the second interface layer IF2 may include NbO. As described above, the integrated circuit device 100-5 may include various configurations of the lower electrode 170-3 and the first interface layer IF1.

Figure 18:
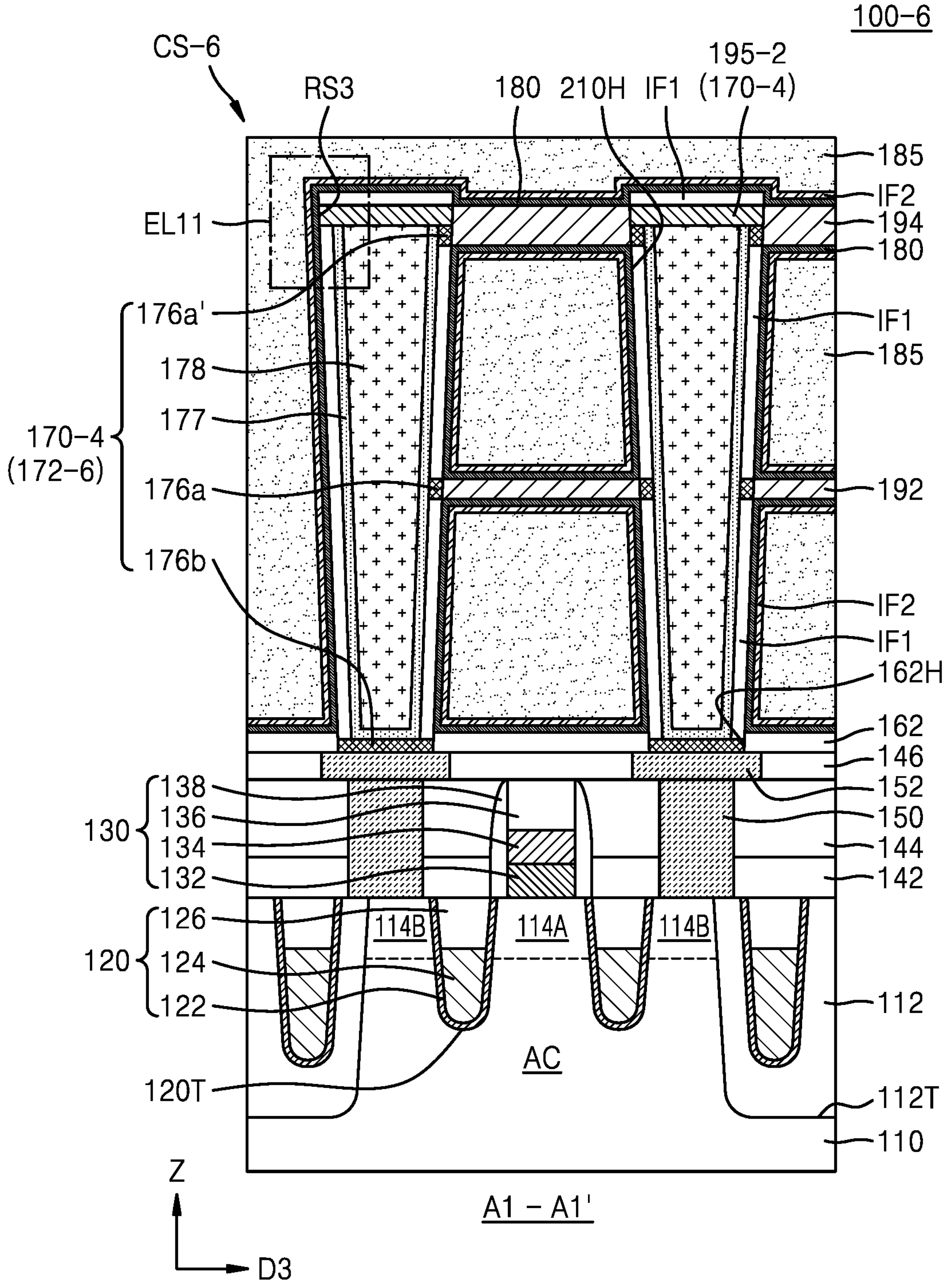
FIG. 18 is a cross-sectional view of an integrated circuit device according to an embodiment of the present inventive concept.
Figure 19:
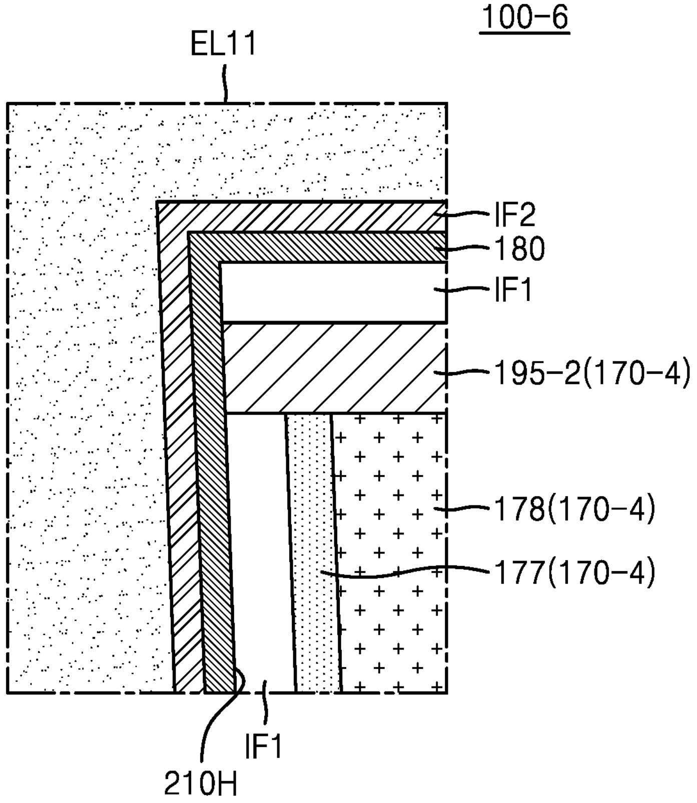
FIG. 19 is an enlarged view of portion shown in FIG. 18.

FIG. 18 is a cross-sectional view of an integrated circuit device 100-6 according to an embodiment of the present inventive concept, and FIG. 19 is an enlarged view of portion EL11 shown in FIG. 18.

For example, the integrated circuit device 100-6 may be identical to the integrated circuit device 100-3 shown in FIGS. 9 to 11, except that the supporters 192 and 194 and the first seed layers 176*a* and 176*a*' are not formed on a sidewall of an electrode layer 172-6 and the electrode layer 172-6 includes two layers.

The integrated circuit device 100-6 may be identical to the integrated circuit device 100-5 shown in FIGS. 15 to 17, except that the supporters 192 and 194 and the first seed layers 176*a* and 176*a*' are not formed on the sidewall of the electrode layer 172-6 and a lower electrode 170-4 includes a capping layer 195-2.

In FIGS. 18 and 19, same reference numerals as those of FIGS. 9 to 11, FIGS. 15 to 17 indicate same components or elements. In FIGS. 18 and 19, same descriptions as those of FIGS. 9 to 11 and FIGS. 15 to 17 are briefly given or omitted.

The integrated circuit device 100-6 may include a capacitor structure CS-6. The capacitor structure CS-6 may include the lower electrode 170-4, the dielectric layer 180, and the upper electrode 185. The lower electrode 170-4 may include the electrode layer 172-6 extending in the direction substantially perpendicular to the top surface of the substrate 110. As shown in FIG. 19, the electrode layer 172-6 may be spaced apart from the inside of the opening 210H.

The electrode layer 172-6 may be formed with the first interface layer IF1 that is formed on the inside of the opening 210H. For example, the first interface layer IF1 may be disposed between the electrode layer 172-6 and an inner surface of the opening 210H. The first interface layer IF1 may include, for example, a conductive metal nitride. In an embodiment of the present inventive concept, the first interface layer IF1 may include NbN or NbTiON.

The electrode layer 172-6 may include a double layer including the u-shaped second sub-electrode layer 177, which is arranged above the substrate 110, and the third sub-electrode layer 178 arranged on the u-shaped second sub-electrode layer 177. In an embodiment of the present inventive concept, the u-shaped second sub-electrode layer 177 may include NbN, and the third sub-electrode layer 178 may include TiN.

Figure 37:
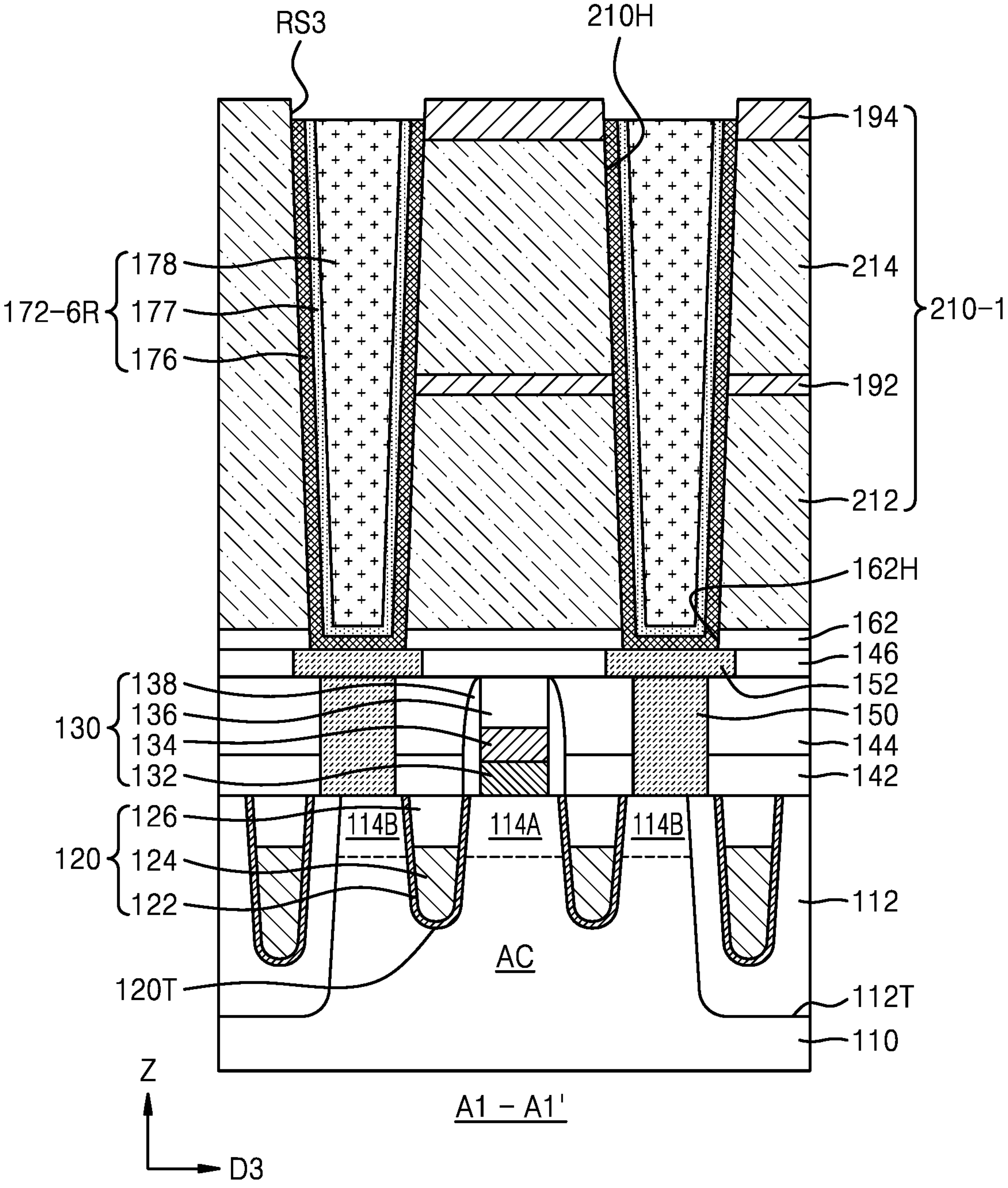
FIGS. 37, 38, 39 and 40 are cross-sectional views for describing a method of manufacturing an integrated circuit device according to an embodiment of the present inventive concept.

The electrode layer 172-6 may be arranged in the opening 210H of the mold structure 210 (see FIG. 37). The first interface layer IF1 may be arranged on a sidewall of the u-shaped second sub-electrode layer 177. The first interface layer IF1 may be on the inside of the opening 210H. The first interface layer IF1 may include, for example, a conductive metal nitride. In an embodiment of the present inventive concept, the first interface layer IF1 may include NbN or NbTiON.

The lower electrode 170-4 may include the first seed layers 176*a* and 176*a*'. The lower electrode 170-4 may be at least partially surrounded by the supporters 192 and 194. As the supporters 192 and 194 are not arranged on the sidewall of the electrode layer 172-6, the lower electrode 170-4 might not be surrounded by the supporters 192 and 194. For example, the supporters 192 and 194 might not be arranged on a sidewall of one of the electrode layers 172-6. For example, in an embodiment of the present inventive concept, some of the electrode layers 172-6 may be surrounded by the supporters 192 and 194, while other electrode layers 172-6 might not be surrounded by the supporters 192 and 194. The lower electrode 170-4 may include the first seed layers 176*a* and 176*a*' contacting at least a portion of the electrode layer 172-6.

The first seed layers 176*a* and 176*a*' may be arranged between the first supporter 192 and the electrode layer 172-6 and between the second supporter 194 and the electrode layer 172-6. The lower electrode 170-4 may include the second seed layer 176*b*. The second seed layer 176*b* may be arranged between the electrode layer 172-6 and the landing pad 152. The second seed layer 176*b* may be formed on the inner wall of the opening 162H of the etch stop layer 162, and the top surface of the second seed layer 176*b* may contact an entire portion of a bottom surface of the electrode layer 172-6. In an embodiment of the present inventive concept, the first seed layers 176*a* and 176*a*' and the second seed layer 176*b* may include TiN.

The lower electrode 170-4 may include the capping layer 195-2. The lower electrode 170-4 may include the capping layer 195-2 arranged at a level lower than a surface of the second supporter 194. The capping layer 195-2 may be buried and arranged in the recess hole RS3 that is formed at a level lower than the surface 194F (see FIG. 11) of the second supporter 194.

The capping layer 195-2 may be arranged on the electrode layer 172-6 and the first seed layer 176*a*'. In an embodiment of the present inventive concept, the capping layer 195-2 may include a conductive metal nitride, for example, TiN. The first interface layer IF1 may be formed on the capping layer 195-2. The dielectric layer 180 may be formed on the first interface layer IF1.

The integrated circuit device 100-6 may include the second interface layer IF2 between the dielectric layer 180 and the upper electrode 185. The second interface layer IF2 may include, for example, a conductive metal oxide. In an embodiment of the present inventive concept, the second interface layer IF2 may include NbO. As described above, the integrated circuit device 100-6 may include various configurations of the lower electrode 170-4 and the first interface layer IF1.

FIGS. 20 to 23 are cross-sectional views for describing a method of manufacturing an integrated circuit device, according to an embodiment of the present inventive concept;

In detail, FIGS. 20 to 23 are provided to describe a method of manufacturing the integrated circuit device 100 shown in FIGS. 1 to 4. In FIGS. 20 to 23, same descriptions as those of FIGS. 1 to 4 are briefly given or omitted.

Referring to FIG. 20, the device isolation layer 112 may be formed in a device isolation trench 112T of the substrate 110. The active region AC on the substrate 110 may be defined by the device isolation layer 112. The gate structure 120 is complete by forming the gate insulating layer 122, the gate electrode 124, and the gate capping layer 126 in the gate line trench 120T of the substrate 110. Next, the first source/drain region 114A and the second source/drain region 114B may be formed by injecting impurity ions to the substrate 110 at two sides of the gate structure 120.

The bit line structure 130 and the first insulating layer 142 and the second insulating layer 144 at least partially surrounding the bit line structure 130 may be formed on the substrate 110. The bit line structure 130 may include the bit line contact 132, the bit line 134, the bit line capping layer 136, and the bit line spacer 138.

The capacitor contact 150 contacting the second source/drain region 114B may be formed in the first insulating layer 142 and the second insulating layer 144. The third insulating layer 146 may be formed on the capacitor contact 150 and the second insulating layer 144, and the landing pad 152 contacting the capacitor contact 150 may be formed in the third insulating layer 146.

In addition, the etch stop layer 162 and the mold structure 210 may be sequentially formed on the landing pad 152 and the third insulating layer 146. The mold structure 210 may include a first mold layer 212, the first supporter 192, a second mold layer 214, and the second supporter 194 sequentially stacked on the etch stop layer 162.

The first mold layer 212 and the etch stop layer 162 may include materials having an etch selectivity with respect to each other. For example, when the first mold layer 212 includes SiO, the etch stop layer 162 may include SiN, SiON, or SiCN. In addition, the first mold layer 212 and the second mold layer 214 and the first supporter 192 and the second supporter 194 may include materials having an etch selectivity with respect to each other. For example, when each of the first mold layer 212 and the second mold layer 214 includes SiO, each of the first supporter 192 and the second supporter 194 may include SiN, SiON, SiBN, or SiCN.

A mask layer may be formed on the second supporter 194, and the opening 210H may be formed in the mold structure 210 by using the mask layer. Here, a portion of the etch stop layer 162 may be removed, and the opening 162H connected to the opening 210H may be formed in the etch stop layer 162. A top surface of the landing pad 152 may be exposed by the opening 210H and the opening 162H.

The electrode layer 172 filling an inner portion of the opening 210H may be formed on the landing pad 152 and the mold structure 210. The electrode layer 172 may include, for example, NbN. The electrode layer 172 may be formed by using, for example, a chemical vapor deposition (CVD) process, an atomic layer deposition (ALD) process, or a metal organic ALD (MOALD) process.

In addition, the recess hole RS1 is formed by selectively etching a top surface of the electrode layer 172 buried in the opening 210H. A bottom surface of the recess hole RS1 may be lower than the surface of the second supporter 194. For example, the bottom surface of the recess hole RS1 may be lower than the top surface of the second supporter 194. The top surface of the electrode layer 172 may be lower than the surface of the second supporter 194. The top surface of the electrode layer 172 may be lower than the top surface of the second supporter 194. The electrode layer 172 is included in the lower electrode 170.

Figure 21:
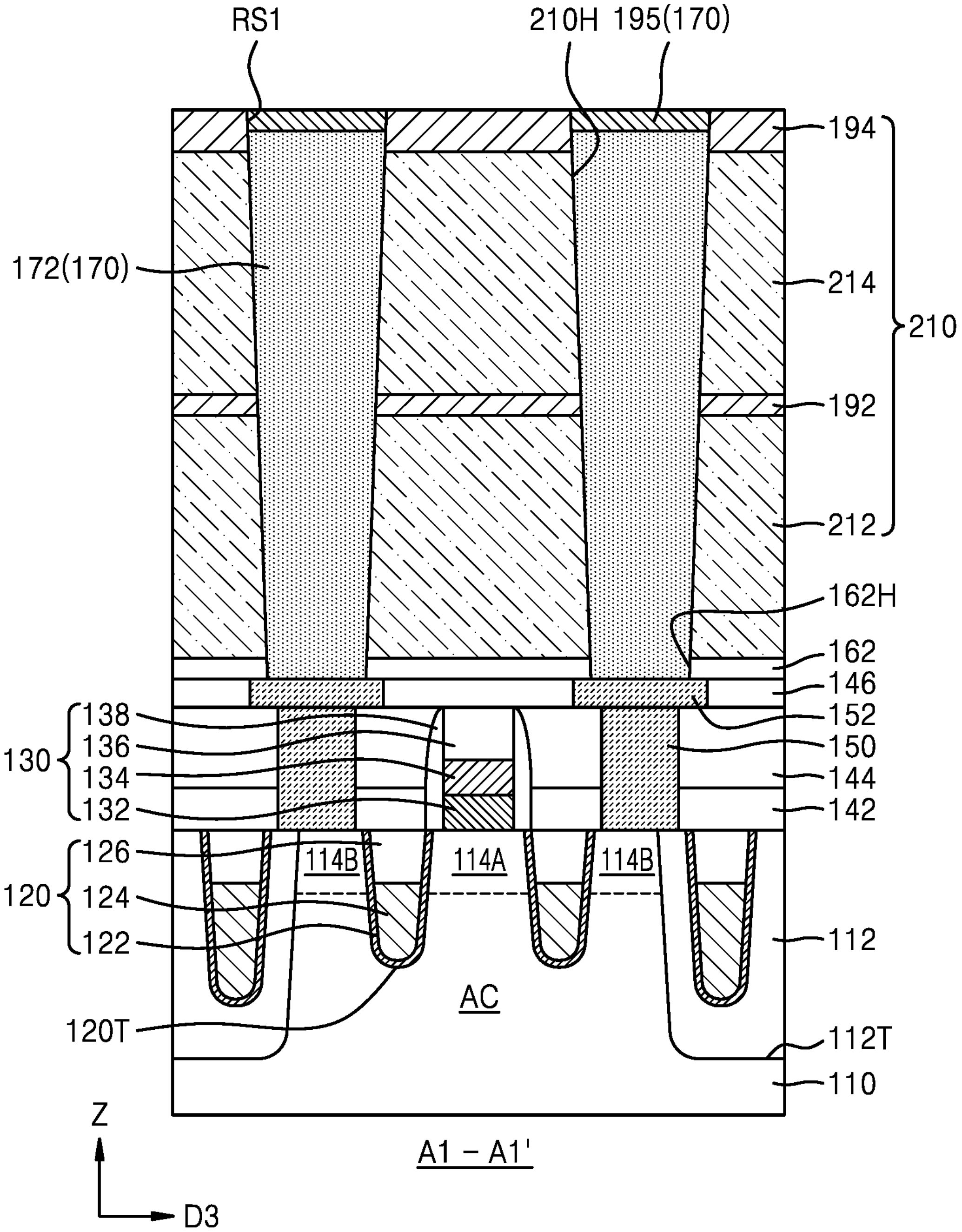
Figure 22:
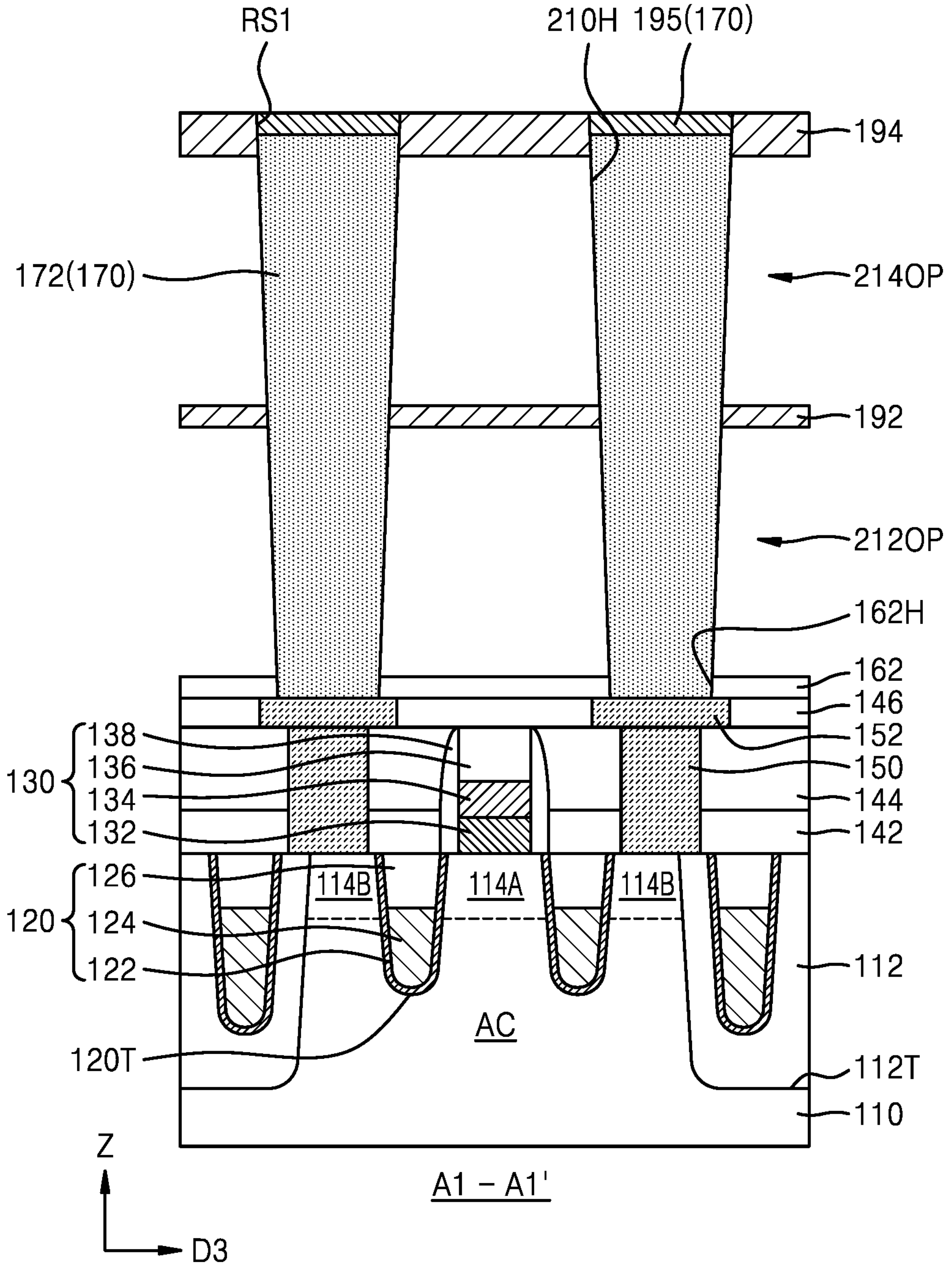

Referring to FIGS. 21 and 22, the capping layer 195 is formed in the recess hole RS1, as shown in FIG. 21. The capping layer 195 may be arranged on the electrode layer 172. The capping layer 195 may include a conductive metal nitride, for example, TiN. The lower surface of the capping layer 195 may be arranged lower than the top surface of the second supporter 194. In an embodiment of the present inventive concept, the capping layer 195 may be arranged lower than the second supporter 194. For example, the top surface of the capping layer 195 may be lower than the top surface of the second supporter 194; however, the present inventive concept is not limited thereto. The lower electrode 170 may include the capping layer 195.

As shown in FIG. 22, a first mold opening 212OP and a second mold opening 214OP may be formed by removing the first mold layer 212 and the second mold layer 214. In a process to remove the first mold layer 212 and the second mold layer 214, the first supporter 192 and the second supporter 194 might not be removed, and the electrode layer 172 may be connected to and supported by the first supporter 192 and the second supporter 194.

Figure 23:
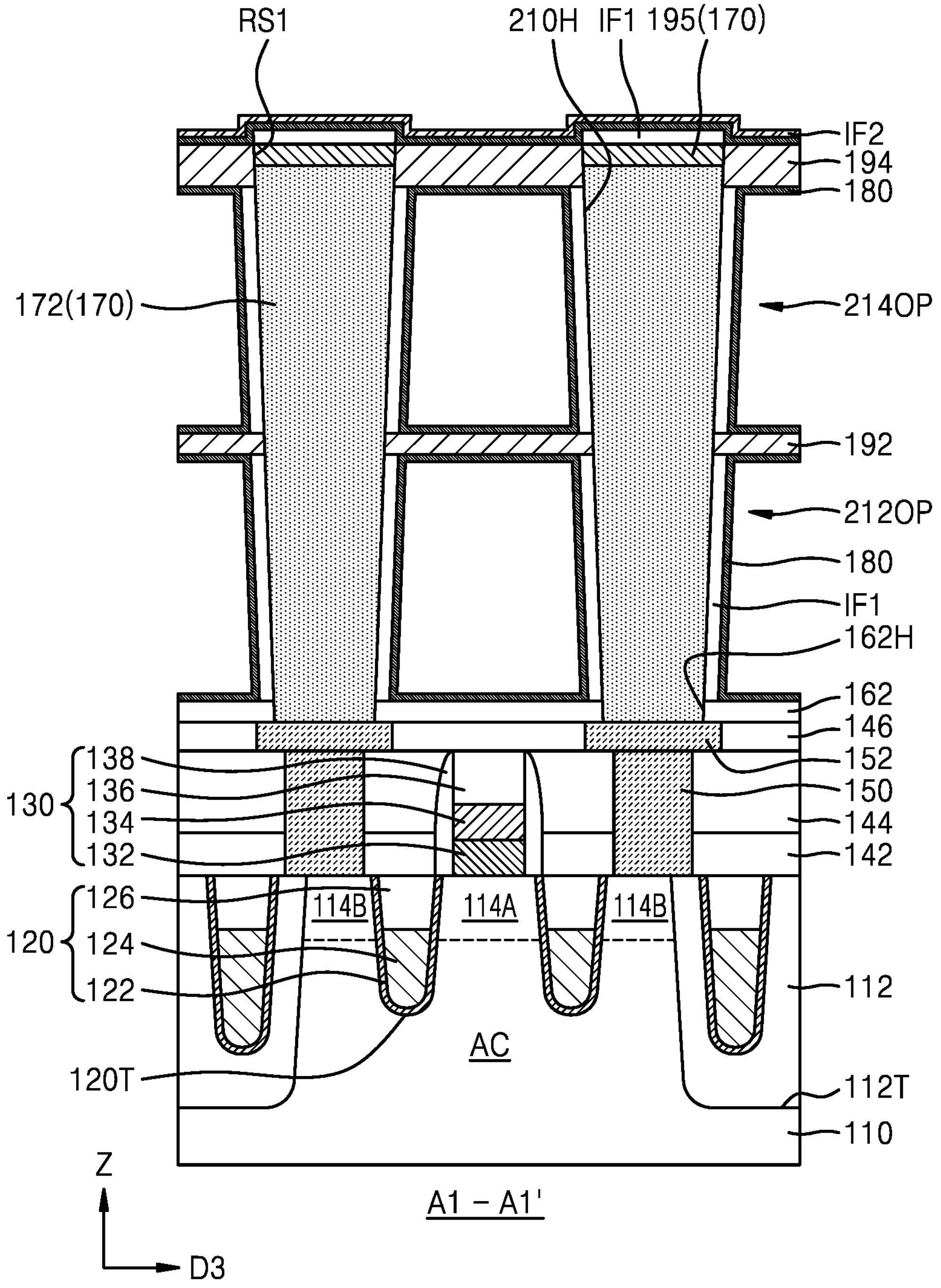

Referring to FIG. 23, the first interface layer IF1 may be conformally formed on the electrode layer 172, the first supporter 192, the second supporter 194, and the capping layer 195. The first interface layer IF1 may include, for example, a conductive metal nitride. In an embodiment of the present inventive concept, the first interface layer IF1 may include NbN or NbTiON. The first interface layer IF1 may be formed by using a CVD process, an ALD process, or a MOALD process.

The dielectric layer 180 may be formed on the first interface layer IF1. In an embodiment of the present inventive concept, the dielectric layer 180 may be formed by a CVD process, a metal organic CVD (MOCVD) process, an ALD process, a MOALD process, or the like. In an embodiment of the present inventive concept, the dielectric layer 180 may be formed by using hafnium oxide, and a portion of the dielectric layer 180 contacting the first interface layer IF1 may be formed to predominantly have the tetragonal crystal structure.

Next, the second interface layer IF2 is formed on the dielectric layer 180, as shown in FIG. 2. The second interface layer IF2 may include, for example, a conductive metal oxide. In an embodiment of the present inventive concept, the second interface layer IF2 may include NbO. The second interface layer IF2 may be formed by using a CVD process, an ALD process, or a MOALD process.

The upper electrode 185 is formed on the second interface layer IF2. The upper electrode 185 may include, for example, NbN. The upper electrode 185 may be formed by using a CVD process, an ALD process, or a MOALD process.

FIGS. 24 to 29 are cross-sectional views for describing a method of manufacturing an integrated circuit device according to an embodiment of the present inventive concept;

FIGS. 24 to 29 are provided to describe a method of manufacturing the integrated circuit device 100-3 shown in FIGS. 9 to 11. In FIGS. 24 to 29, same descriptions as those of FIGS. 9 to 11 are briefly given or omitted.

Figure 24:
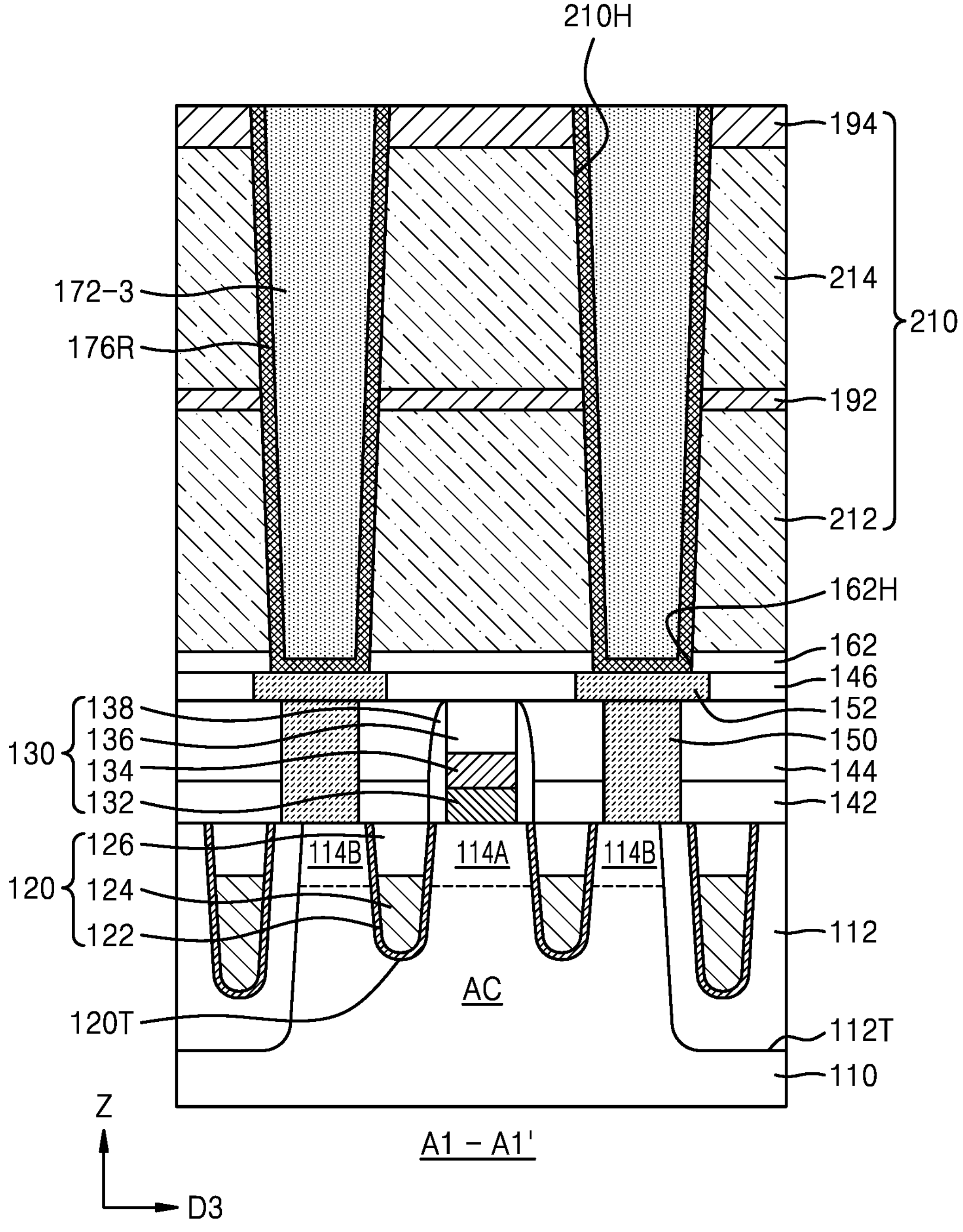
FIGS. 24, 25, 26, 27, 28 and 29 are cross-sectional views for describing a method of manufacturing an integrated circuit device according to an embodiment of the present inventive concept.

Referring to FIG. 24, as shown in FIG. 20, the device isolation layer 112, the gate structure 120, the first source/drain region 114A, and the second source/drain region 114B are formed in the substrate 110. The first insulating layer 142, the second insulating layer 144, the bit line structure 130, the capacitor contact 150, and the landing pad 152 are formed on the substrate 110.

The etch stop layer 162 and the mold structure 210 may be sequentially formed on the landing pad 152 and the third insulating layer 146. The mold structure 210 may include the first mold layer 212, the first supporter 192, the second mold layer 214, and the second supporter 194.

The mask layer may be formed on the second supporter 194, and the opening 210H may be formed in the mold structure 210 by using the mask layer. Here, a portion of the etch stop layer 162 may be removed, and the opening 162H connected to the opening 210H of the mold structure 210 may be formed in the etch stop layer 162. A top surface of the landing pad 152 may be exposed by the opening 210H of the mold structure 210 and the opening 162H and the etch stop layer 162.

A preliminary seed layer 176R may be conformally formed on an inner wall of the opening 210H of the mold structure 210 and a top surface of the mold structure 210. In an embodiment of the present inventive concept, the preliminary seed layer 176R may include TiN. The preliminary seed layer 176R may be formed by a CVD process, a MOCVD process, an ALD process, a MOALD process, and the like. The preliminary seed layer 176R may be formed to have a thickness of about 5 Å to about 200 Å.

In addition, the electrode layer 172-3 may fill an inner space of the opening 210H and may be formed on the preliminary seed layer 176R. The electrode layer 172-3 may include NbN. The electrode layer 172 may be formed by using a CVD process, an ALD process, or a MOALD process.

Figure 25:
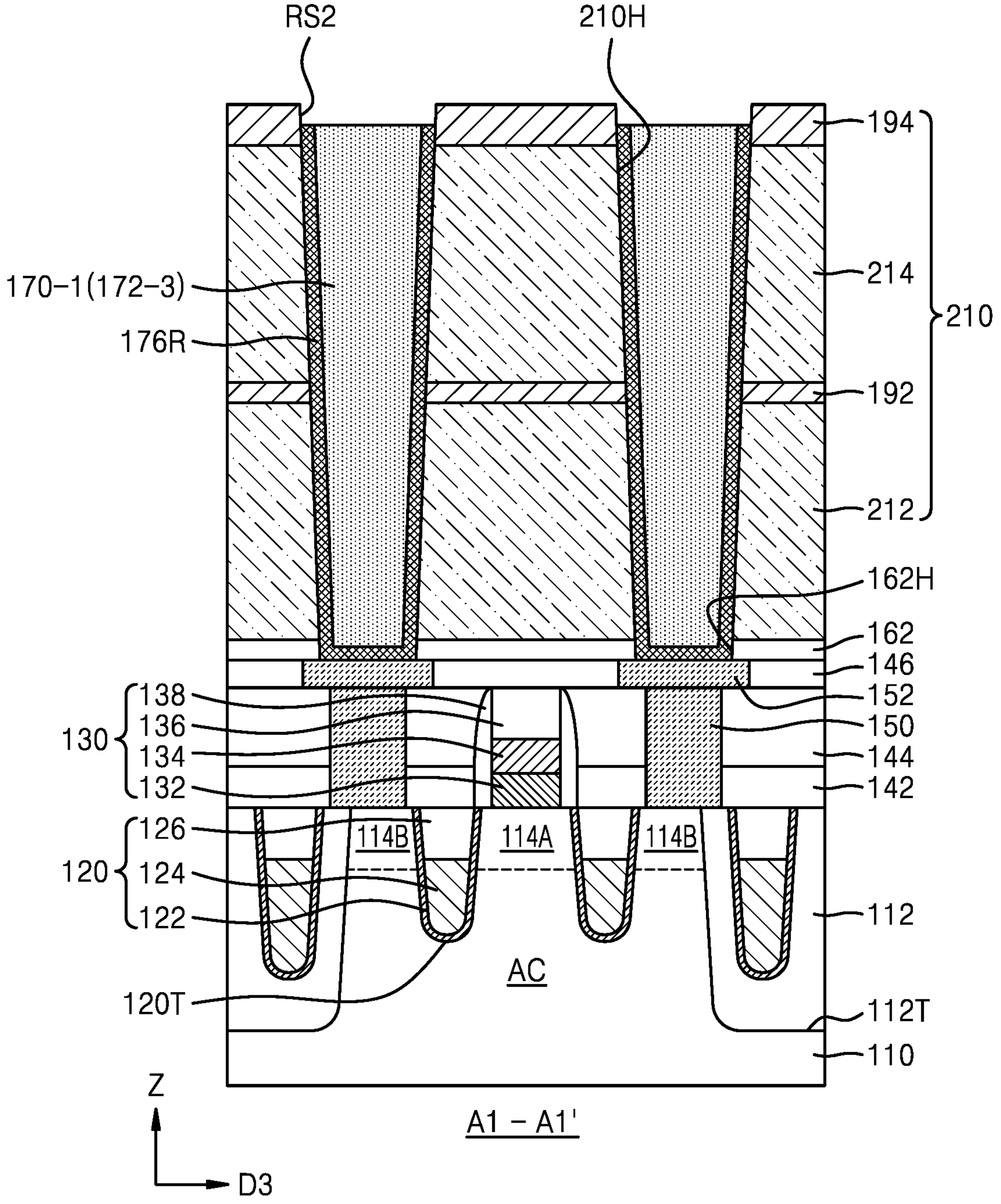
Figure 26:
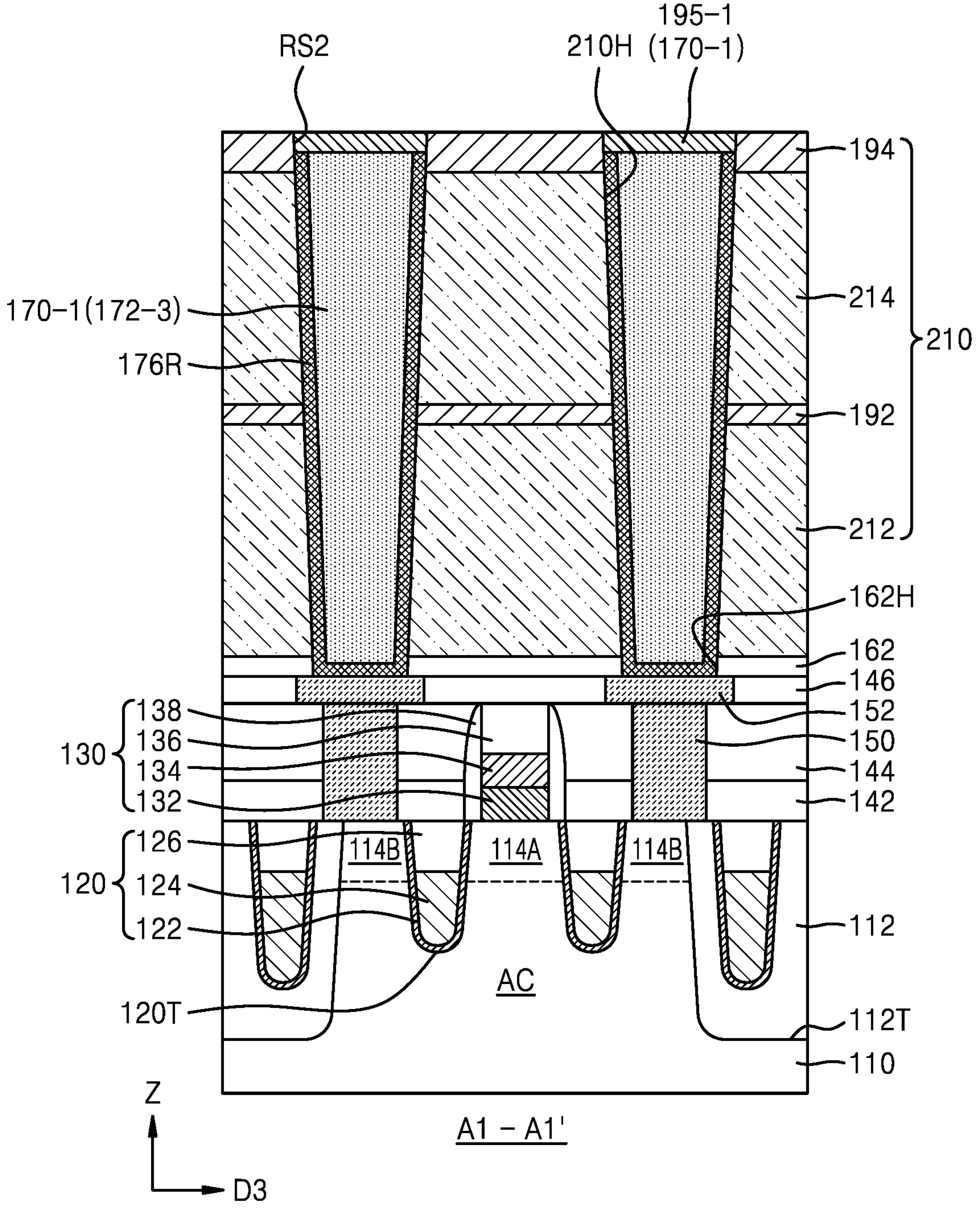

Referring to FIGS. 25 and 26, as shown in FIG. 25, the recess hole RS2 is formed by selectively etching a top surface of the electrode layer 172-3 buried into the opening 210H. A bottom surface of the recess hole RS2 may be lower than the surface (e.g., the top surface) of the second supporter 194. The top surface of the electrode layer 172-3 may be lower than the surface (e.g., the top surface) of the second supporter 194. The electrode layer 172-3 may be included in the lower electrode 170-1.

As shown in FIG. 26, the capping layer 195-1 is formed in the recess hole RS1. The capping layer 195-1 may include a conductive metal nitride, for example, TiN. The capping layer 195-1 may be arranged lower than the surface of the second supporter 194. For example, the lower surface of the capping layer 195-1 may be lower than the top surface of the second supporter 194. The lower electrode 170-1 may include the capping layer 195.

Figure 27:
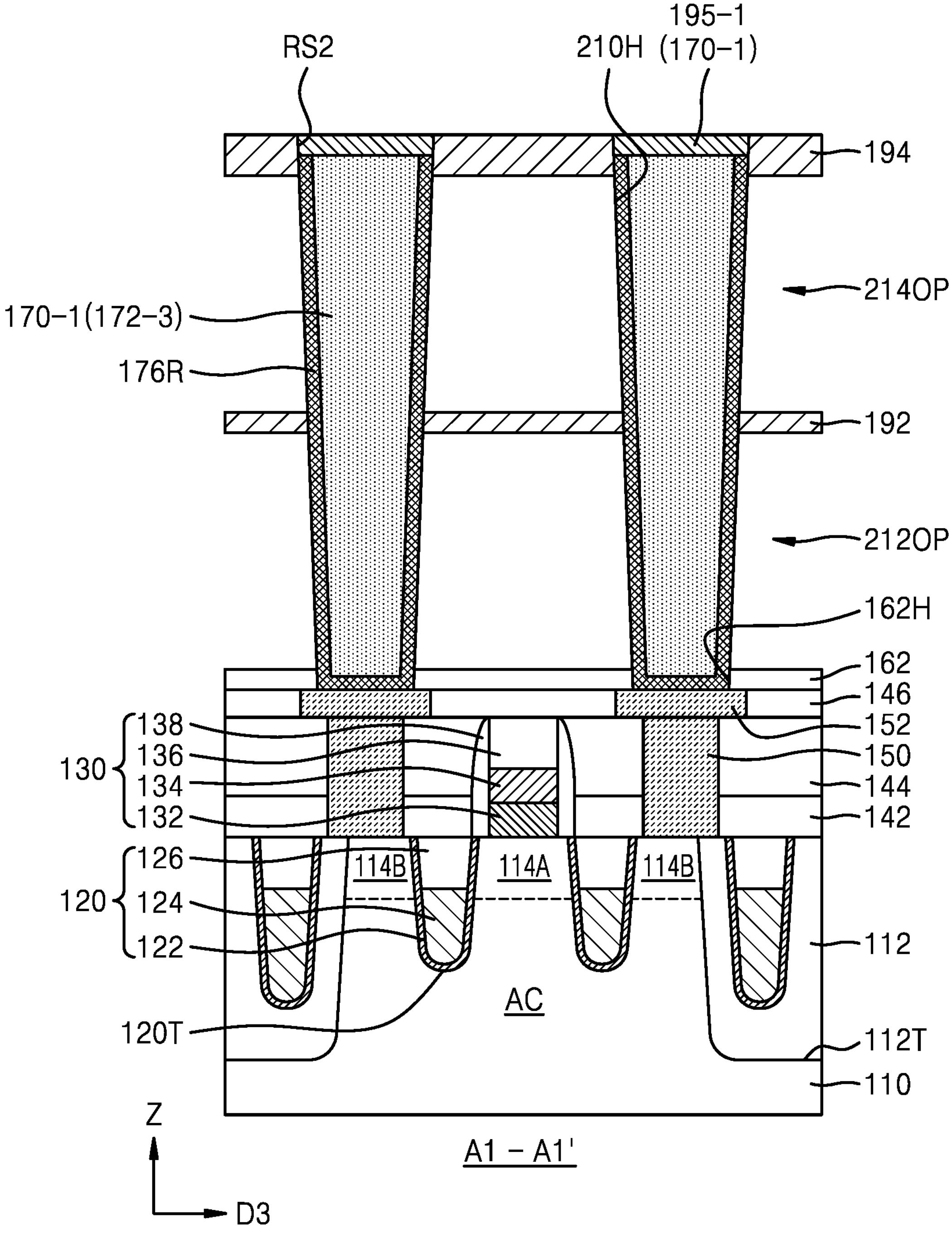

Referring to FIG. 27, the first mold opening 212OP and the second mold opening 214OP may be formed by removing the first mold layer 212 and the second mold layer 214. In the process to remove the first mold layer 212 and the second mold layer 214, the first supporter 192 and the second supporter 194 might not be removed, and a sidewall of the preliminary seed layer 176R may be exposed in the first mold opening 212OP and the second mold opening 214OP.

Figure 28:
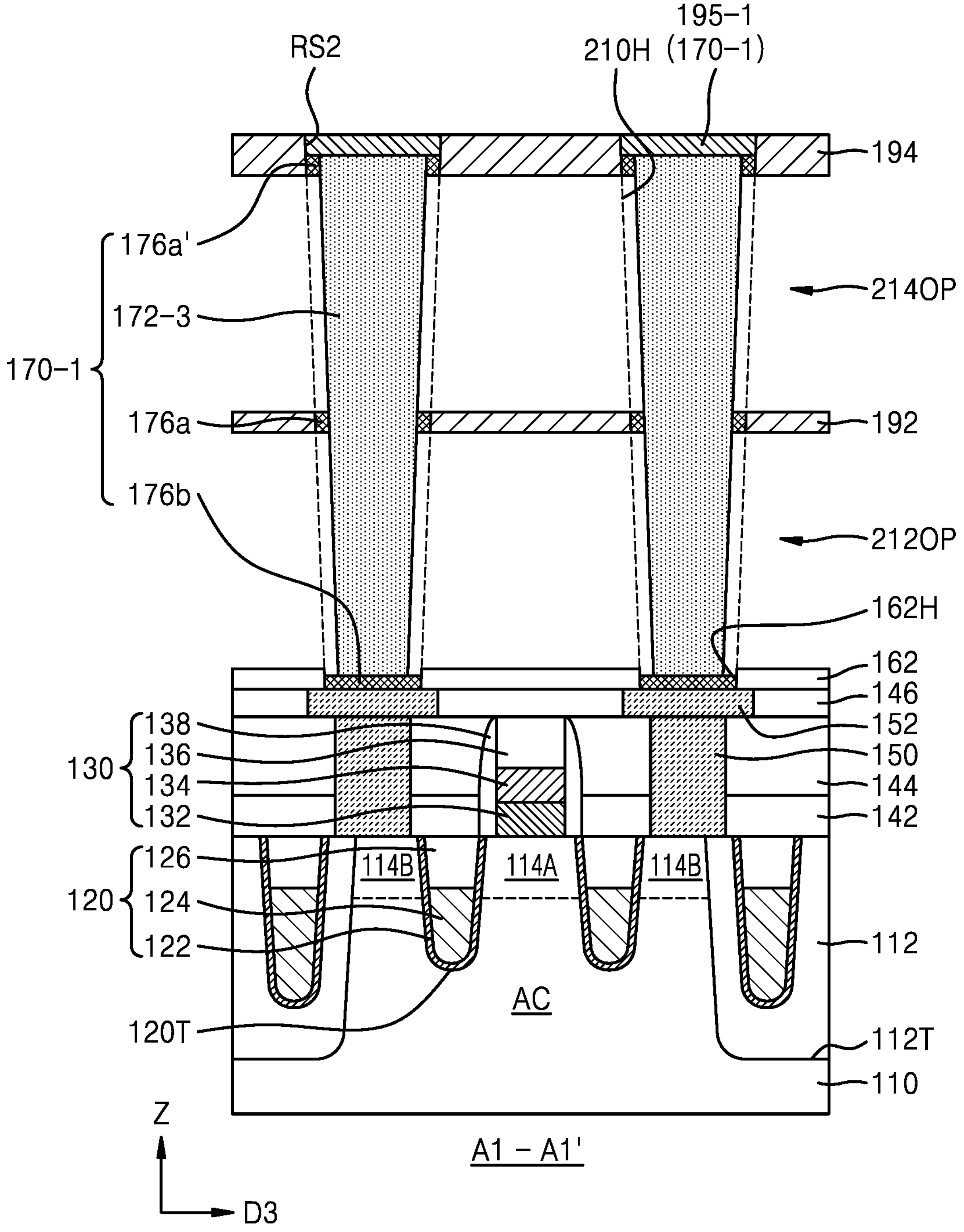

Referring to FIG. 28, a portion of the preliminary seed layer 176R exposed in the first mold opening 212OP and the second mold opening 214OP may be removed. In an embodiment of the present inventive concept, the preliminary seed layer 176R may be partially removed by a wet etching process.

After a process of removing the preliminary seed layer 176R, the sidewall of the electrode layer 172-3 may be exposed. The exposed sidewall of the electrode layer 172-3 may include the inside of the opening 210H. For example, the exposed sidewall of the electrode layer 172-3 may be within where the opening 210H of the mold structure 210 formerly existed. In the process of removing the preliminary seed layer 176R, a portion of the preliminary seed layer 176R between the sidewall of the electrode layer 172-3 and the first supporter 192 and a portion of the preliminary seed layer 176R between the sidewall of the electrode layer 172-3 and the second supporter 194 might not be removed. Remaining portions of the preliminary seed layer 176R respectively arranged between the sidewall of the electrode layer 172-3 and the first supporter 192 and between the sidewall of the electrode layer 172-3 and the second supporter 194 may be referred to as the first seed layers **176*a* and 176*a*'**.

In addition, in the process of removing the preliminary seed layer 176R, a portion of the preliminary seed layer 176R arranged in the opening 162H of the etch stop layer 162 and between a bottom portion of the electrode layer 172-3 and the landing pad 152 might not be removed. The portion of the preliminary seed layer 176R may be referred to as the second seed layer **176*b***.

Figure 29:
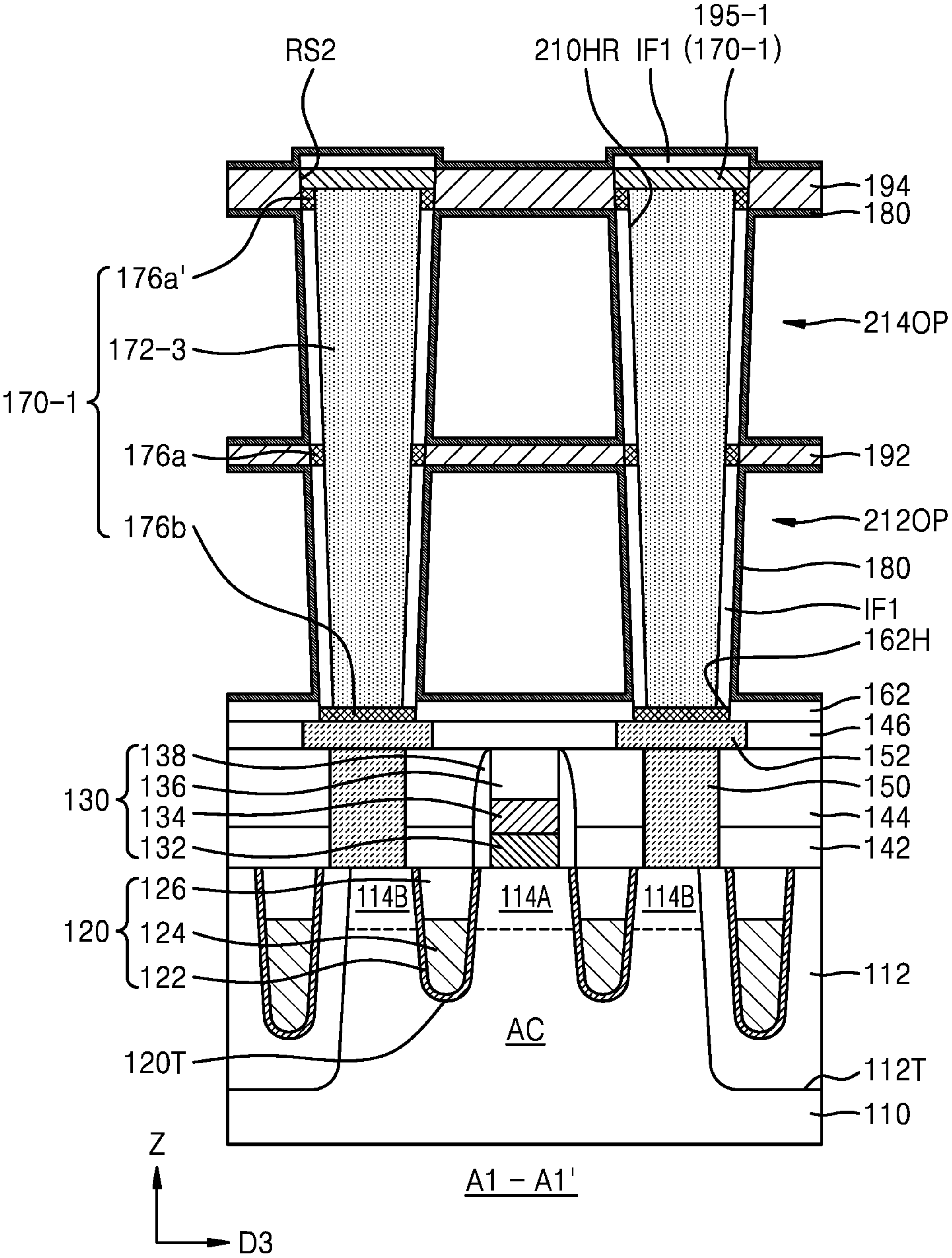

Referring to FIG. 29, the first interface layer IF1 may be conformally formed on the electrode layer 172-3 and the capping layer 195-1. The first interface layer IF1 may include, for example, a conductive metal nitride. In an embodiment of the present inventive concept, the first interface layer IF1 may include NbN or NbTiON. The first interface layer IF1 may be formed by using a CVD process, an ALD process, or a MOALD process.

The dielectric layer 180 may be formed on the first interface layer IF1. In an embodiment of the present inventive concept, the dielectric layer 180 may be formed by a CVD process, a MOCVD process, an ALD process, a MOALD process, or the like. In an embodiment of the present inventive concept, the dielectric layer 180 may be formed by using hafnium oxide, and a portion of the dielectric layer 180 contacting the first interface layer IF1 may be formed to predominantly have the tetragonal crystal structure.

Next, the second interface layer IF2 is formed on the dielectric layer 180, as shown in FIG. 9. The second interface layer IF2 may include, for example, a conductive metal oxide. In an embodiment of the present inventive concept, the second interface layer IF2 may include NbO. The second interface layer IF2 may be formed by using a CVD process, an ALD process, or a MOALD process.

The upper electrode 185 is formed on the second interface layer IF2. The upper electrode 185 may include, for example, NbN. The upper electrode 185 may be formed by using a CVD process, an ALD process, or a MOALD process.

FIGS. 30 to 34 are cross-sectional views for describing a method of manufacturing an integrated circuit device according to an embodiment of the present inventive concept.

FIGS. 30 to 34 are provided to describe a method of manufacturing the integrated circuit device 100-4 shown in FIGS. 12 to 14. In FIGS. 30 to 34, same descriptions as those of FIGS. 12 to 14 are briefly given or omitted.

Figure 30:
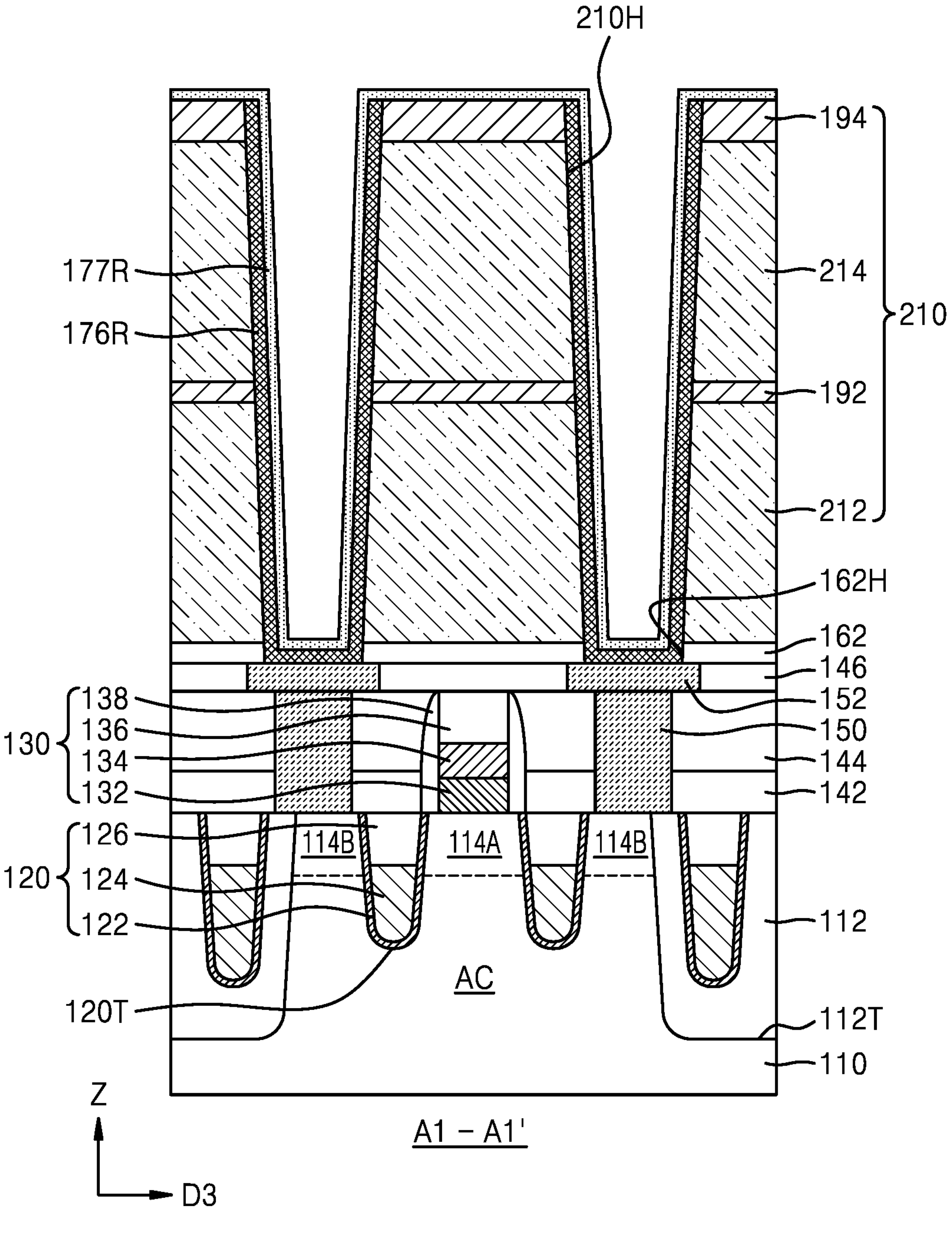
FIGS. 30, 31, 32, 33 and 34 are cross-sectional views for describing a method of manufacturing an integrated circuit device according to an embodiment of the present inventive concept.

Referring to FIG. 30, as described above with reference to FIG. 20, the device isolation layer 112, the gate structure 120, the first source/drain region 114A, and the second source/drain region 114B are formed in the substrate 110. The first insulating layer 142, the second insulating layer 144, the bit line structure 130, the capacitor contact 150, and the landing pad 152 are formed on the substrate 110.

The etch stop layer 162 and the mold structure 210 may be sequentially formed on the landing pad 152 and the third insulating layer 146. The mold structure 210 may include the first mold layer 212, the first supporter 192, the second mold layer 214, and the second supporter 194.

The mask layer may be formed on the second supporter 194, and the opening 210H may be formed in the mold structure 210 by using the mask layer. Here, a portion of the etch stop layer 162 may be removed, and the opening 162H connected to the opening 210H of the mold structure 210 may be formed in the etch stop layer 162. A top surface of the landing pad 152 may be exposed by the opening 210H of the mold structure 210 and the opening 162H of the etch stop layer 162.

A first preliminary seed layer 176R may be formed on the inner wall of the opening 210H of the mold structure 210. In an embodiment of the present inventive concept, the first preliminary seed layer 176R may include TiN. The first preliminary seed layer 176R may be formed by a CVD process, a MOCVD process, an ALD process, a MOALD process, and the like.

In addition, a second preliminary seed layer 177R is formed on the first preliminary seed layer 176R. The second preliminary seed layer 177R is formed on the first preliminary seed layer 176R on the inner wall of the opening 210H and the second supporter 194 on a bottom of the opening 210H. In an embodiment of the present inventive concept, the second preliminary seed layer 177R may include NbN. The second preliminary seed layer 177R may be formed by a CVD process, a MOCVD process, an ALD process, a MOALD process, and the like.

Figure 31:
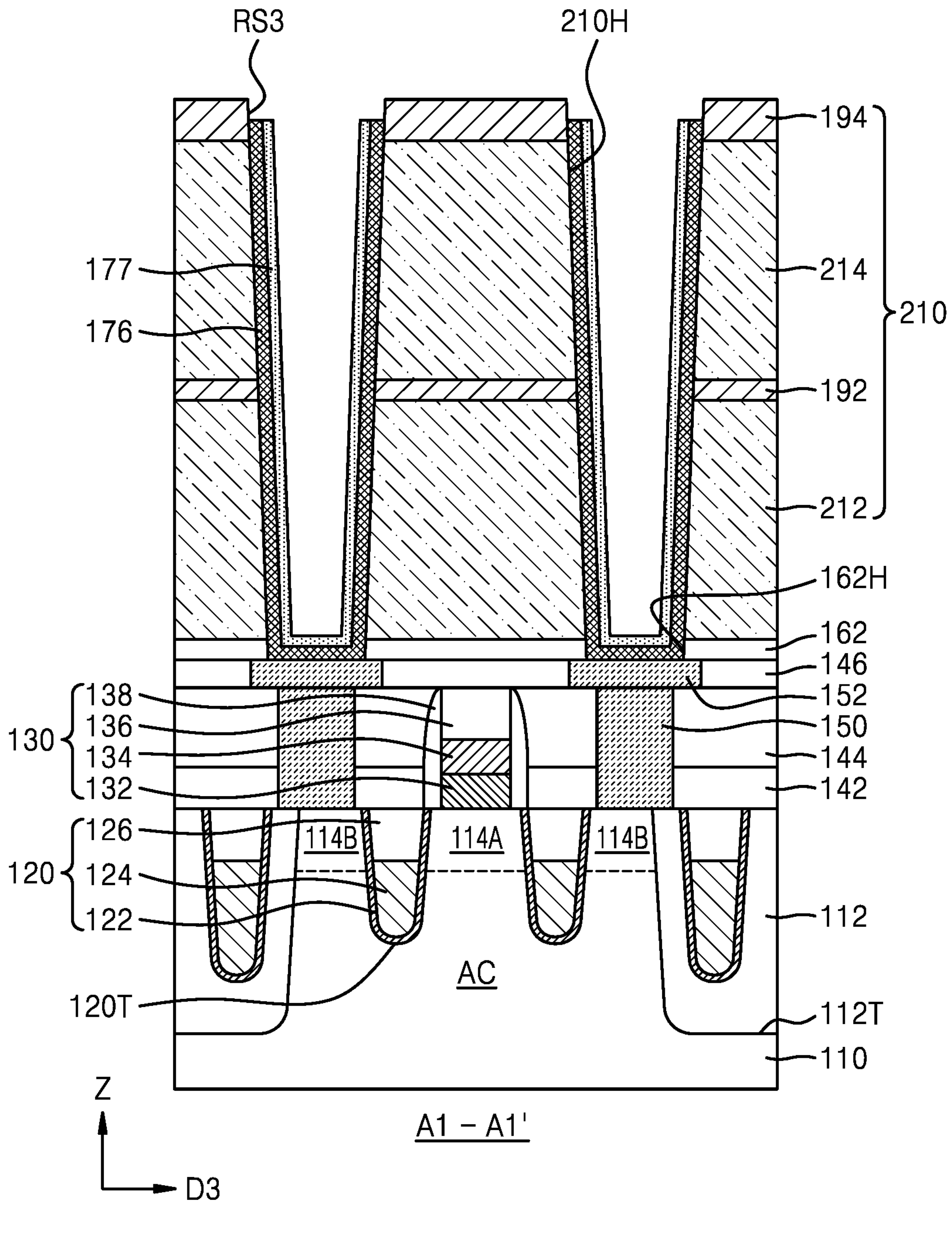

Referring to FIGS. 31 and 32, as shown in FIG. 31, the recess hole RS3 is formed by etching by a top portion of the first preliminary seed layer 176R and a top portion of the second preliminary seed layer 177R. By doing so, the u-shaped first sub-electrode layer 176 and the u-shaped second sub-electrode layer 177 may be formed in the opening 210H. The u-shaped first sub-electrode layer 176 may be formed on the inner wall and the bottom of the opening 210H. The u-shaped second sub-electrode layer 177 may be formed on the u-shaped first sub-electrode layer 176 on the inner wall and the bottom of the opening 210H.

The third sub-electrode layer 178 may be formed and may fill the inner space of the opening 210H and the recess hole RS3. In addition, the third sub-electrode layer 178 may be formed on a u-shaped second sub-electrode layer 177. The third sub-electrode layer 178 may include TiN. The third sub-electrode layer 178 may be formed by a CVD process, a MOCVD process, an ALD process, a MOALD process, and the like.

Accordingly, the electrode layer 172-4 includes the u-shaped first sub-electrode layer 176, the u-shaped second sub-electrode layer 177, and the third sub-electrode layer 178. The electrode layer 172-4 may be included in the lower electrode 170-2.

Figure 33:
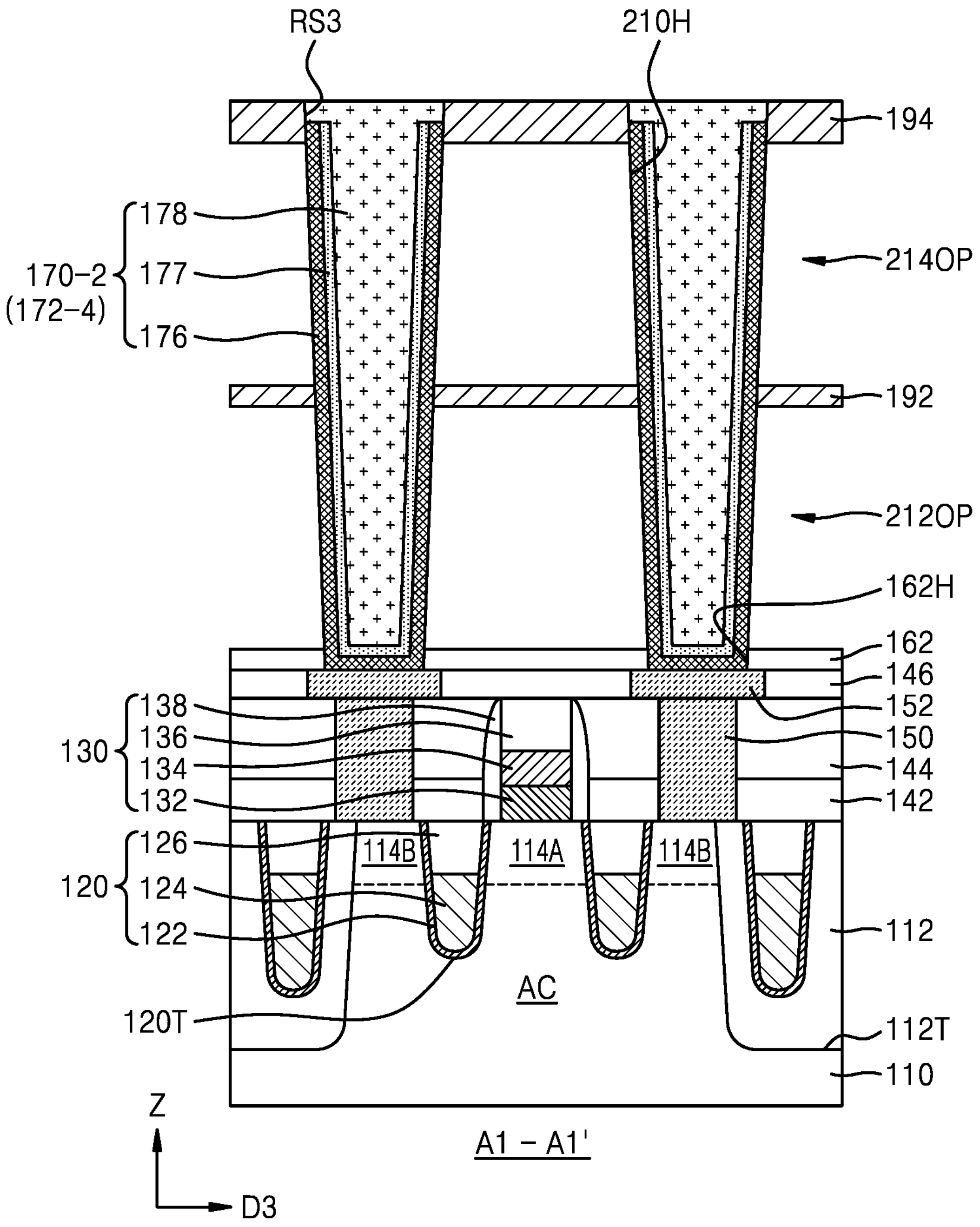

Referring to FIG. 33, the first mold opening 212OP and the second mold opening 214OP may be formed by removing the first mold layer 212 and the second mold layer 214. In the process to remove the first mold layer 212 and the second mold layer 214, the first supporter 192 and the second supporter 194 might not be removed, and the sidewall of the u-shaped first sub-electrode layer 176 may be exposed in the first mold opening 212OP and the second mold opening 214OP.

Figure 34:
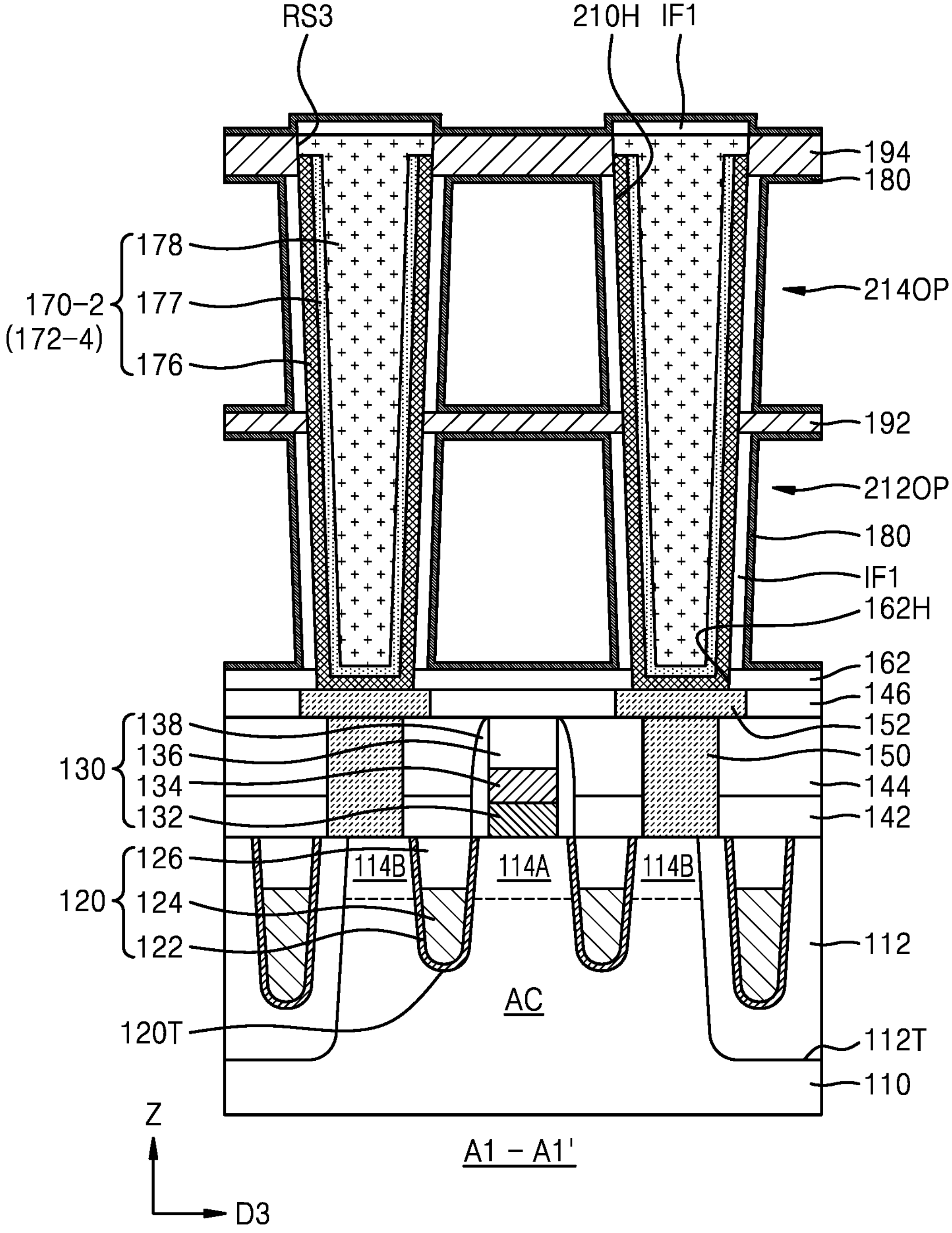

Referring to FIG. 34, the first interface layer IF1 is formed on the sidewall of the u-shaped first sub-electrode layer 176 exposed in the first mold opening 212OP and the second mold opening 214OP. The first interface layer IF1 is formed on the third sub-electrode layer 178. The first interface layer IF1 may include, for example, a conductive metal nitride. In an embodiment of the present inventive concept, the first interface layer IF1 may include NbN or NbTiON. The first interface layer IF1 may be formed by using a CVD process, an ALD process, or a MOALD process.

The dielectric layer 180 may be formed on the first interface layer IF1. In an embodiment of the present inventive concept, the dielectric layer 180 may be formed by a CVD process, a MOCVD process, an ALD process, a MOALD process, or the like. In an embodiment of the present inventive concept, the dielectric layer 180 may be formed by using hafnium oxide, and a portion of the dielectric layer 180 contacting the first interface layer IF1 may be formed to predominantly have the tetragonal crystal structure.

In addition, the second interface layer IF2 is formed on the dielectric layer 180, as shown in FIG. 12. The second interface layer IF2 may include, for example, a conductive metal oxide. In an embodiment of the present inventive concept, the second interface layer IF2 may include NbO. The second interface layer IF2 may be formed by using a CVD process, an ALD process, or a MOALD process.

The upper electrode 185 is formed on the second interface layer IF2. The upper electrode 185 may include, for example, NbN. The upper electrode 185 may be formed by using a CVD process, an ALD process, or a MOALD process.

Figure 35:
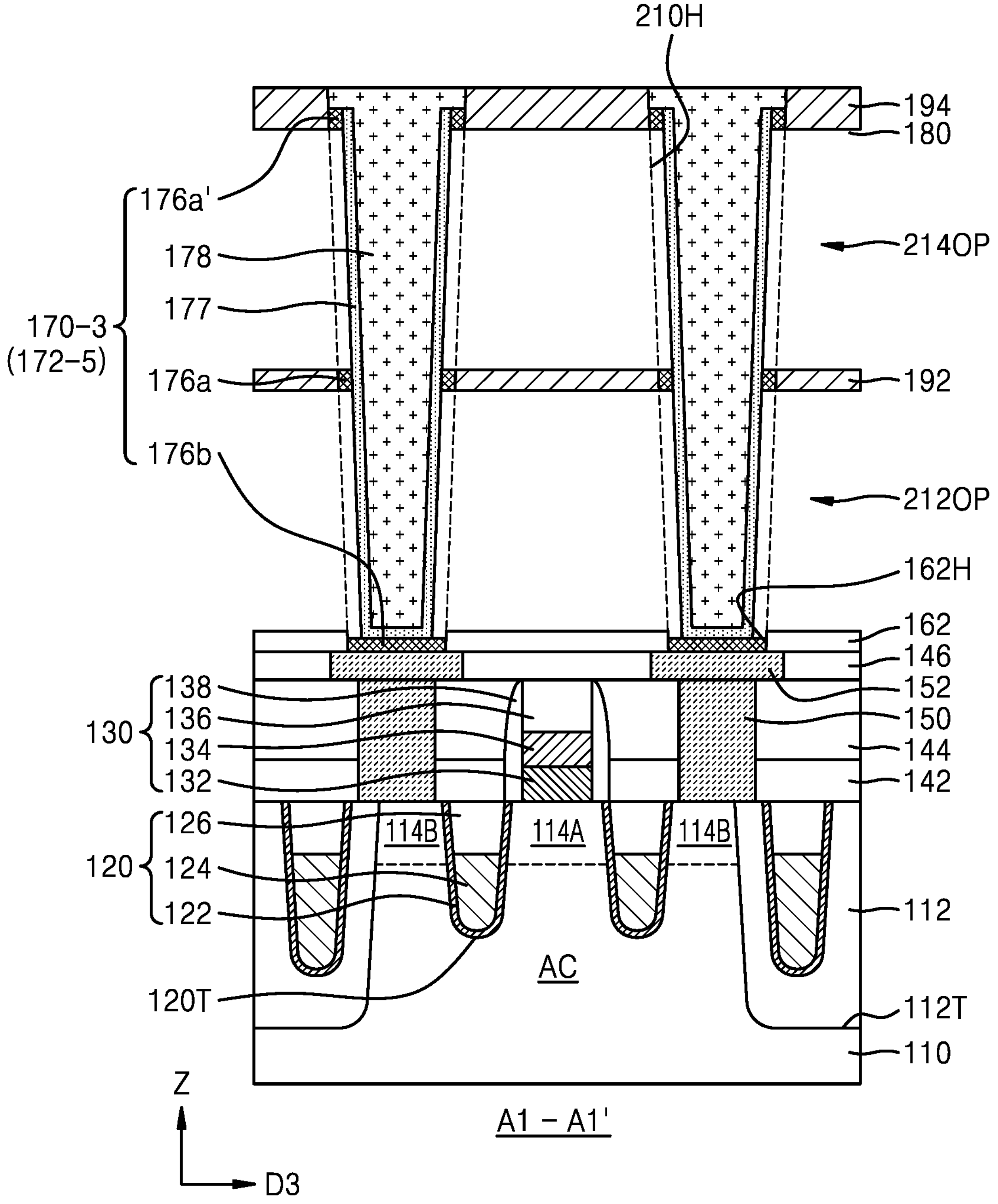
FIGS. 35 and 36 are cross-sectional views for describing a method of manufacturing an integrated circuit device according to an embodiment of the present inventive concept.
Figure 36:
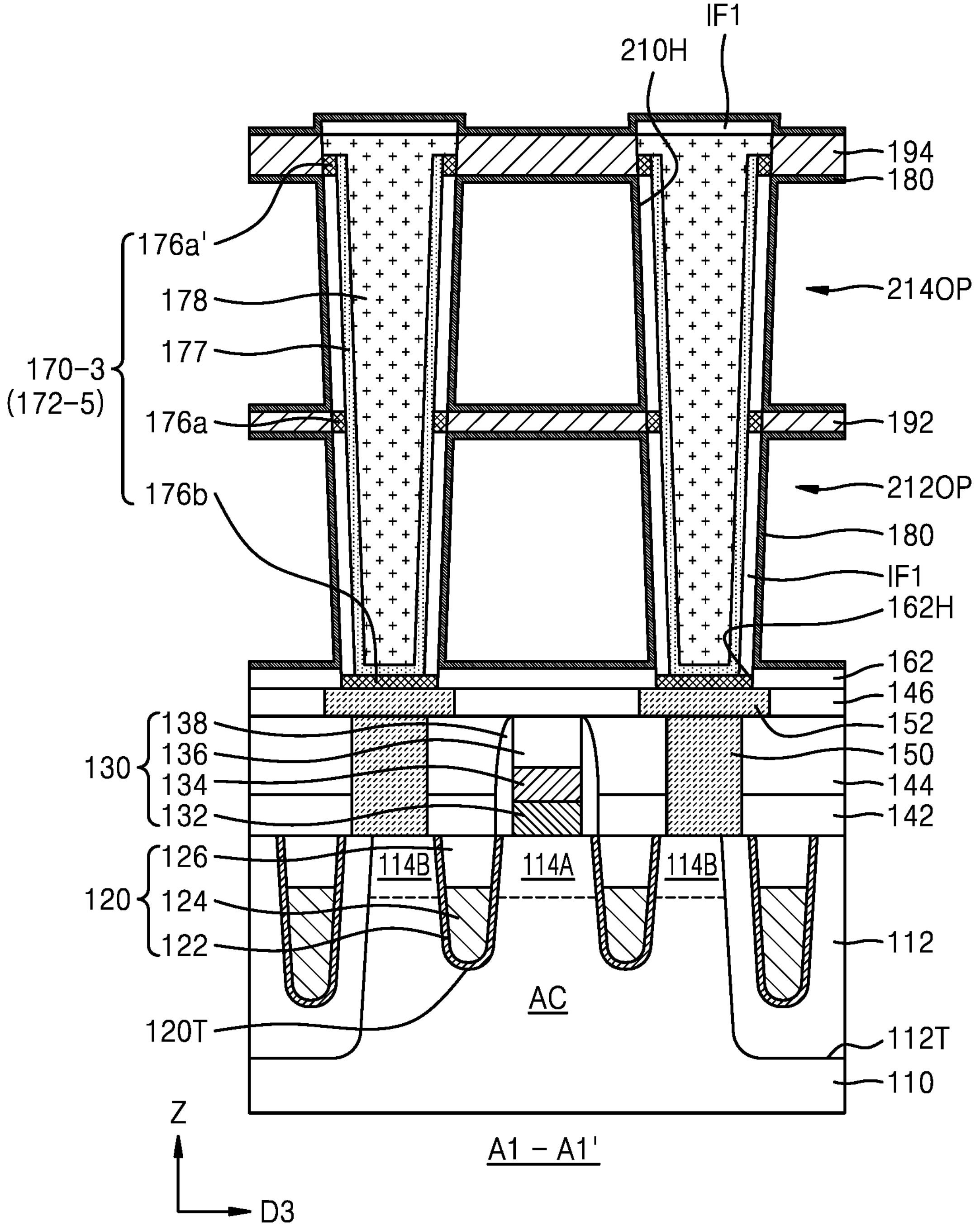

FIGS. 35 and 36 are cross-sectional views for describing a method of manufacturing an integrated circuit device according to an embodiment of the present inventive concept.

FIGS. 35 and 36 are provided to describe a method of manufacturing the integrated circuit device 100-5 shown in FIGS. 15 and 17. In FIGS. 35 and 36, same descriptions as those of FIGS. 15 to 17 are briefly given or omitted. The method of manufacturing the integrated device circuit 100-4 described above with reference to FIGS. 30 to 33 will be performed.

Referring to FIG. 35, a portion of the u-shaped first sub-electrode layer 176 exposed by the first mold opening 212OP and the second mold opening 214OP may be removed. In an embodiment of the present inventive concept, the u-shaped first sub-electrode layer 176 may be partially removed by a wet etching process. The u-shaped first sub-electrode layer 176 may be partially removed toward the inside of the opening 210H.

After a process of removing the u-shaped first sub-electrode layer 176, the sidewall of the u-shaped second sub-electrode layer 177 may be exposed. The electrode layer 172-5 may include the u-shaped second sub-electrode layer 177 and the third sub-electrode layer 178. The electrode layer 172-5 may be included in the lower electrode 170-3.

In addition, in the process of removing the u-shaped first sub-electrode layer 176, a portion of the u-shaped first sub-electrode layer 176 between the sidewall of the u-shaped second sub-electrode layer 177 and the first supporter 192 and a portion of the u-shaped first sub-electrode layer 176 between the sidewall of the u-shaped second sub-electrode layer 177 and the second supporter 194 might not be removed.

Remaining portions of the u-shaped first sub-electrode layer 176 arranged between the sidewall of the u-shaped second sub-electrode layer 177 and the first supporter 192 and between the sidewall of the u-shaped second sub-electrode layer 177 and the second supporter 194 may be referred to as the first seed layers 176*a* and 176*a'*.

In addition, in a process of removing the u-shaped first sub-electrode layer 176, a portion of the u-shaped first sub-electrode layer 176, which is arranged in the opening 162H of the etch stop layer 162 and between a bottom portion of the electrode layer 172-5 and the landing pad 152, might not be removed. The portion of the u-shaped first sub-electrode layer 176 may be referred to as the second seed layer 176*b*.

Accordingly, the electrode layer 172-5 may include the first seed layers 176*a* and 176*a*' and the second seed layer 176*b*. In addition, the lower electrode 170-3 may also include the first seed layers 176*a* and 176*a*' and the second seed layer 176*b*.

Referring to FIG. 36, the first interface layer E1 may be conformally formed on the electrode layer 172-5. The first interface layer IF1 may include, for example, a conductive metal nitride. In an embodiment of the present inventive concept, the first interface layer IF1 may include NbN or NbTiON. The first interface layer IF1 may be formed by using a CVD process, an ALD process, or a MOALD process.

The dielectric layer 180 may be formed on the first interface layer IF1. In an embodiment of the present inventive concept, the dielectric layer 180 may be formed by a CVD process, a MOCVD process, an ALD process, a MOALD process, or the like. In an embodiment of the present inventive concept, the dielectric layer 180 may be formed by using hafnium oxide, and a portion of the dielectric layer 180 contacting the first interface layer IF1 may be formed to predominantly have the tetragonal crystal structure.

In addition, the second interface layer IF2 is formed on the dielectric layer 180, as shown in FIG. 15. The second interface layer IF2 may include, for example, a conductive metal oxide. In an embodiment of the present inventive concept, the second interface layer IF2 may include, for example, NbO. The second interface layer IF2 may be formed by using a CVD process, an ALD process, or a MOALD process.

The upper electrode 185 is formed on the second interface layer IF2. The upper electrode 185 may include, for example, NbN. The upper electrode 185 may be formed by using a CVD process, an ALD process, or a MOALD process.

FIGS. 37 to 40 are cross-sectional views for describing a method of manufacturing an integrated circuit device according to an embodiment of the present inventive concept.

FIGS. 37 to 40 are provided to describe a method of manufacturing the integrated circuit device 100-6 shown in FIGS. 18 and 19. In FIGS. 37 to 40, same descriptions as those of FIGS. 18 and 19 are briefly given or omitted.

Referring to FIG. 37, as described above with reference to FIG. 20, the device isolation layer 112, the gate structure 120, the first source/drain region 114A, and the second source/drain region 114B are formed in the substrate 110. The first insulating layer 142, the second insulating layer 144, the bit line structure 130, the capacitor contact 150, and the landing pad 152 are formed on the substrate 110.

The etch stop layer 162 and a mold structure 210-1 may be sequentially formed on the landing pad 152 and the third insulating layer 146. The mold structure 210-1 may include the first mold layer 212, the first supporter 192, the second mold layer 214, and the second supporter 194. As shown in FIG. 37, the first supporter 192 and the second supporter 194 might not be formed in a region of the etch stop layer 162.

The mask layer may be formed on the second supporter 194, and the opening 210H may be formed in the mold structure 210-1 by using the mask layer. Here, a portion of the etch stop layer 162 may be removed, and the opening 162H connected to the opening 210H of the mold structure 210-1 may be formed in the etch stop layer 162. A top surface of the landing pad 152 may be exposed by the opening 210H of the mold structure 210-1 and the opening 162H of the etch stop layer 162.

The u-shaped first sub-electrode layer 176 is formed on the inner wall of the opening 210H of the mold structure 210. The u-shaped first sub-electrode layer 176 may be formed on the inner wall and the bottom of the opening 210H. The u-shaped first sub-electrode layer 176 may include a conductive metal nitride, for example, TiN. The u-shaped first sub-electrode layer 176 may be formed by a CVD process, a MOCVD process, a ALD process, MOALD process, and the like.

The u-shaped second sub-electrode layer 177 is formed on the u-shaped first sub-electrode layer 176. The u-shaped second sub-electrode layer 177 may be formed on the u-shaped first sub-electrode layer 176 that is formed on the inner wall and the bottom of the opening 210H. The u-shaped second sub-electrode layer 177 may include, for example, NbN. The u-shaped second sub-electrode layer 177 may be formed by a CVD process, a MOCVD process, an ALD process, a MOALD process, and the like.

The third sub-electrode layer 178 buried into the opening 210H is formed on the u-shaped second sub-electrode layer 177. The third sub-electrode layer 178 may fill the inner space of the opening 210H and may be formed on the u-shaped second sub-electrode layer 177. The third sub-electrode layer 178 may include, for example, TiN. The third sub-electrode layer 178 may be formed by a CVD process, a MOCVD process, an ALD process, MOALD process, and the like.

The u-shaped first sub-electrode layer 176, the u-shaped second sub-electrode layer 177, and the third sub-electrode layer 178 are included in a preliminary electrode layer 172-6R. The preliminary electrode layer 172-6R may extend in the direction substantially perpendicular to the top surface of the substrate 110. The first supporter 192 and the second supporter 194 might not be formed on some of sidewalls of the preliminary electrode layer 172-6R.

In addition, the recess hole RS3 is formed on top portions of the u-shaped first sub-electrode layer 176, the u-shaped second sub-electrode layer 177, and the third sub-electrode layer 178 in the opening 210H.

Figure 38:
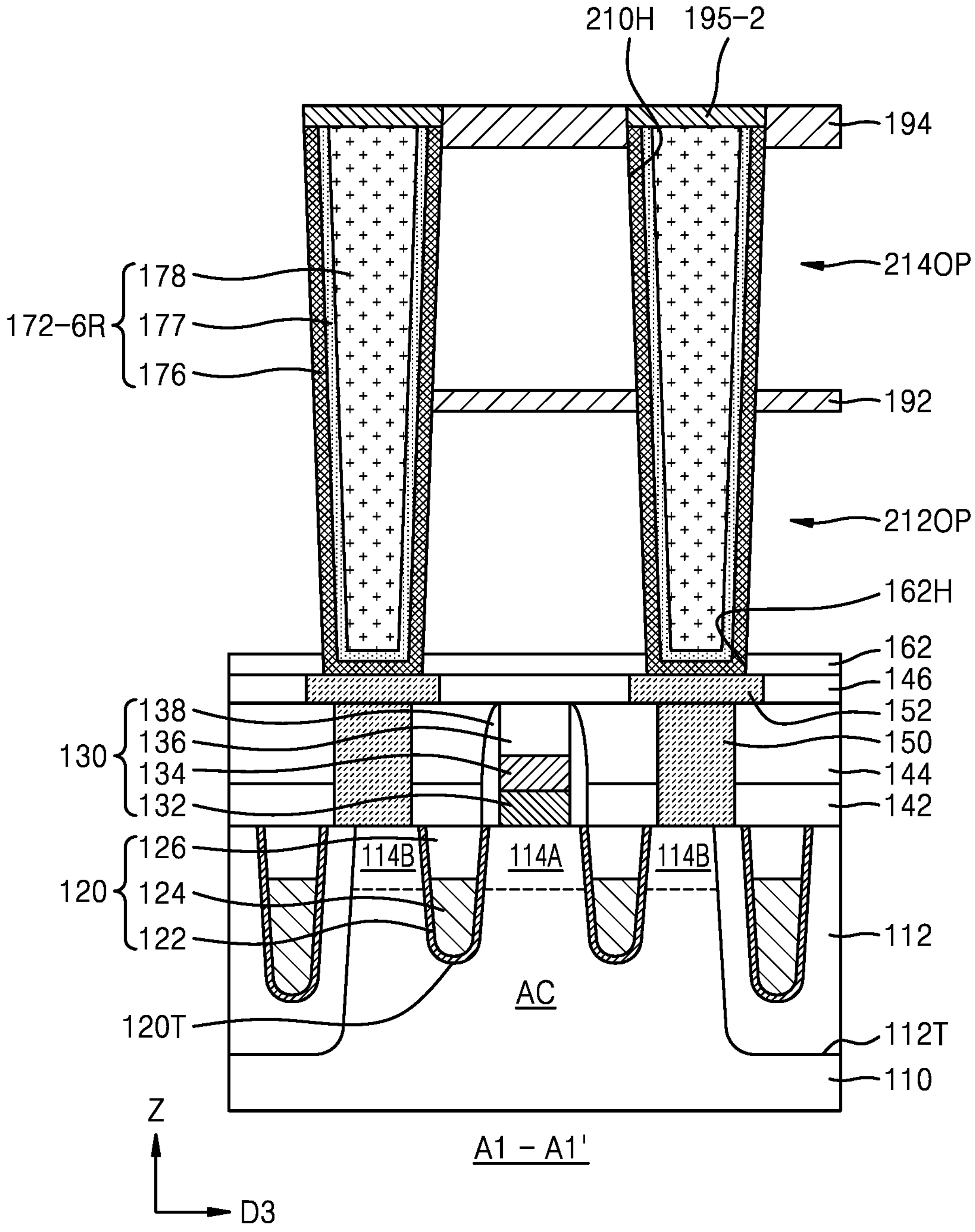

Referring to FIG. 38, the capping layer 195-2 buried into the recess hole RS3 may be formed. The capping layer 195-2 may be formed lower than the surface of the second supporter 194. For example, a lower surface of the capping layer 195-2 may be formed lower than an upper surface of the second supporter 194. The first mold opening 212OP and the second mold opening 214OP may be formed by removing the first mold layer 212 and the second mold layer 214.

In the process to remove the first mold layer 212 and the second mold layer 214, the first supporter 192 and the second supporter 194 might not be removed, and the sidewall of the u-shaped first sub-electrode layer 176 may be exposed by the first mold opening 212OP and the second mold opening 214OP. As shown in FIG. 38, a portion of the sidewall of the u-shaped first sub-electrode layer 176 in the preliminary electrode layer 172-6R may be entirely exposed by the first mold opening 212OP and the second mold opening 214OP.

Figure 39:
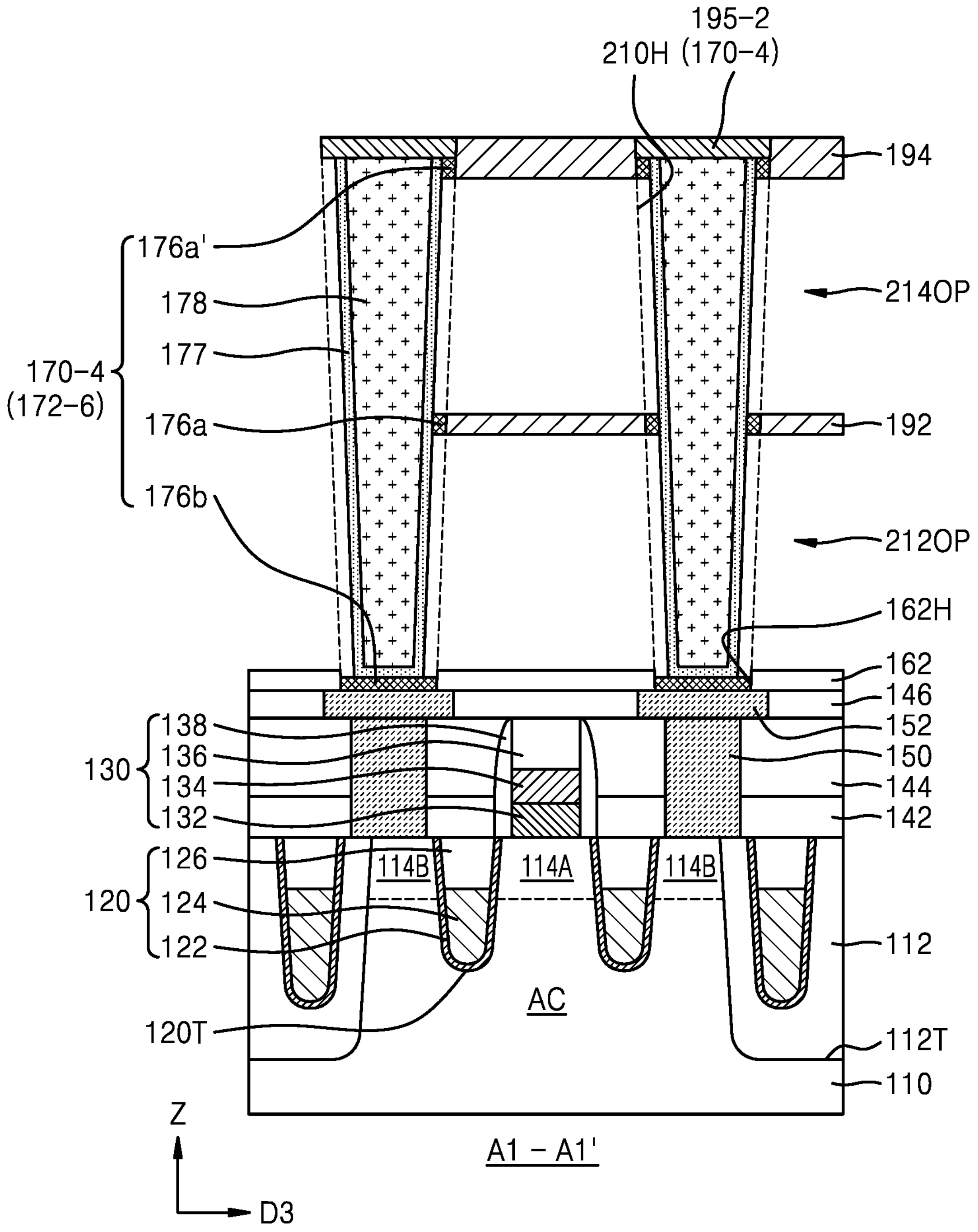

Referring to FIG. 39, the electrode layer 172-6 is formed by removing the u-shaped first sub-electrode layer 176 of the preliminary electrode layer 172-6R. For example, the u-shaped first sub-electrode layer 176 exposed in the first mold opening 212OP and the second mold opening 214OP may be removed. In an embodiment of the present inventive concept, the u-shaped first sub-electrode layer 176 may be partially removed by a wet etching process.

After a process of removing the u-shaped first sub-electrode layer 176, the sidewall of the u-shaped second sub-electrode layer 177 may be exposed. The exposed sidewall of the u-shaped second sub-electrode layer 177 may be within the inside of the opening 210H of the mold structure 210-1 that was formerly there. After the process of removing the u-shaped first sub-electrode layer 176, at least a portion of the sidewall of the u-shaped second sub-electrode layer 177 may be entirely exposed.

In the process of removing the u-shaped first sub-electrode layer 176, the portion of the u-shaped first sub-electrode layer 176 between the sidewall of the u-shaped second sub-electrode layer 177 and the first supporter 192 and the portion of the u-shaped first sub-electrode layer 176 between the sidewall of the u-shaped first sub-electrode layer 176 and the second supporter 194 might not be removed. Remaining portions of the u-shaped first sub-electrode layer 176, which are arranged between the sidewall of the u-shaped second sub-electrode layer 177 and the first supporter 192 and between the sidewall of the u-shaped second sub-electrode layer 177 and the second supporter 194, may be referred to as the first seed layers 176*a* and 176*a'*.

In the process of removing the u-shaped first sub-electrode layer 176, the portion of the u-shaped first sub-electrode layer 176 arranged in the opening 162H of the etch stop layer 162*t* and between a bottom portion of the u-shaped second sub-electrode layer 177 and the landing pad 152 might not be removed. The portion of the u-shaped first sub-electrode layer 176 may be referred to as the second seed layer 176*b*.

Through the aforementioned process, the lower electrode 170-4 including the u-shaped second sub-electrode layer 177, the third sub-electrode layer 178, the first seed layers 176*a* and 176*a'*, the second seed layer 176*b*, and the capping layer 195-2 is formed.

Figure 40:
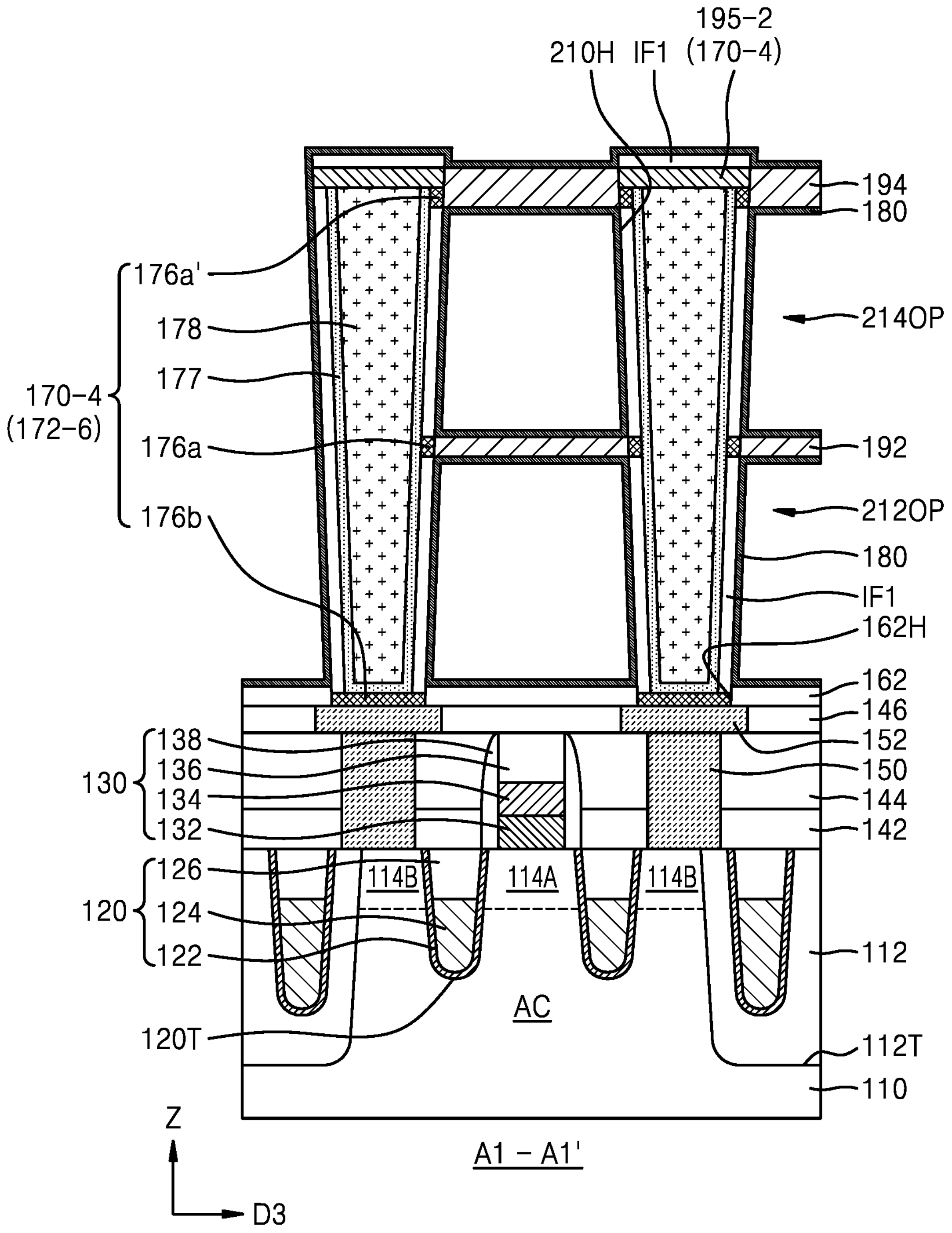

Referring to FIG. 40, the first interface layer IF1 is formed on the electrode layer 172-6 and the capping layer 195-2. The first interface layer IF1 is formed on the sidewall of the u-shaped second sub-electrode layer 177 and the capping layer 195-2. The first interface layer IF1 may include, for example, a conductive metal nitride. In an embodiment of the present inventive concept, the first interface layer IF1 may include, for example, NbN or NbTiON. The first interface layer IF1 may be formed by using a CVD process, an ALD process, or a MOALD process.

The dielectric layer 180 may be formed on the first interface layer IF1. In an embodiment of the present inventive concept, the dielectric layer 180 may be formed by a CVD process, a MOCVD process, an ALD process, a MOALD process, or the like. In an embodiment of the present inventive concept, the dielectric layer 180 may be formed by using hafnium oxide, and a portion of the dielectric layer 180 contacting the first interface layer IF1 may be formed to predominantly have the tetragonal crystal structure.

In addition, the second interface layer IF2 is formed on the dielectric layer 180, as shown in FIG. 18. The second interface layer IF2 may include, for example, a conductive metal oxide. In an embodiment of the present inventive concept, the second interface layer IF2 may include, for example, NbO. The second interface layer IF2 may be formed by using a CVD process, an ALD process, or a MOALD process.

The upper electrode 185 is formed on the second interface layer IF2. The upper electrode 185 may include, for example, NbN. The upper electrode 185 may be formed by using a CVD process, an ALD process, or a MOALD process.

While the present inventive concept has been described with reference to embodiments thereof, it will be understood by those of ordinary skill in the art that various changes in form and details may be made thereto without departing from the spirit and scope of the present inventive concept.

What is claimed is:

1. An integrated circuit device comprising: a capacitor structure, wherein the capacitor structure comprises:

a lower electrode arranged on a substrate, wherein the lower electrode comprises an electrode layer extending in a direction substantially perpendicular to an upper surface of the substrate, wherein the electrode layer comprises niobium nitride;

a supporter arranged on a sidewall of the lower electrode;

a dielectric layer arranged on the lower electrode and the supporter;

a first interface layer arranged between a sidewall of the lower electrode and the dielectric layer and between a top surface of the lower electrode and the dielectric layer, wherein the first interface layer comprises a conductive metal nitride; and an upper electrode arranged on the dielectric layer, wherein the upper electrode covers the lower electrode and comprises niobium nitride, wherein the lower electrode further comprises a capping layer disposed between the electrode layer and the first interface layer.

2. The integrated circuit device of claim 1, wherein the electrode layer comprises any one of a single layer or a double layer, wherein the single layer comprises niobium nitride, wherein the double layer comprises a first sub-electrode layer arranged on the substrate and a second sub-electrode layer arranged on the first sub-electrode layer, wherein the first sub-electrode layer comprises titanium nitride, and wherein the second sub-electrode layer comprises niobium nitride.

3. The integrated circuit device of claim 1, wherein the electrode layer comprises a triple layer comprising a first sub-electrode layer arranged on the substrate, a second sub-electrode layer arranged on the first sub-electrode layer, and a third sub-electrode layer arranged on the second sub-electrode layer, wherein the first sub-electrode layer comprises titanium nitride, wherein the second sub-electrode layer comprises niobium nitride, and wherein the third sub-electrode layer comprises titanium nitride.

4. The integrated circuit device of claim 1, further comprising a second interface layer arranged between the dielectric layer and the upper electrode, wherein the second interface layer comprises a conductive metal oxide.

5. The integrated circuit device of claim 1, wherein the supporter comprises a first supporter and a second supporter respectively on a first portion of a sidewall of the lower electrode and a second portion of a sidewall of the lower electrode, and wherein the capping layer is disposed on the electrode layer and disposed to be lower than a surface of the second supporter.

6. The integrated circuit device of claim 1, wherein the upper electrode comprises any one of a single layer or a double layer, wherein the single layer comprises niobium nitride, wherein the double layer comprises a fourth sub-electrode layer arranged on the dielectric layer and a fifth sub-electrode layer arranged on the fourth sub-electrode layer, wherein the fourth sub-electrode layer comprises titanium nitride, and wherein the fifth sub-electrode layer comprises niobium nitride.

7. The integrated circuit device of claim 1, wherein the upper electrode comprises a triple layer comprising a fourth sub-electrode layer arranged on the dielectric layer, a fifth sub-electrode layer arranged on the fourth sub-electrode layer, and a sixth sub-electrode layer arranged on the fifth sub-electrode layer, wherein the fourth sub-electrode layer comprises titanium nitride, wherein the fifth sub-electrode layer comprises niobium nitride, and wherein the sixth sub-electrode layer comprises titanium nitride.

8. An integrated circuit device comprising: a capacitor structure, wherein the capacitor structure comprises:

a lower electrode arranged on a substrate, wherein the lower electrode comprises an electrode layer extending in a direction substantially perpendicular to a top surface of the substrate, and the electrode layer comprises niobium nitride;

a supporter arranged on a sidewall of the lower electrode;

a dielectric layer arranged on the lower electrode and the supporter;

a first interface layer arranged between a sidewall of the electrode layer and the dielectric layer and between a top surface of the electrode layer and the dielectric layer, wherein the first interface layer comprises a conductive metal nitride; and an upper electrode arranged on the dielectric layer, wherein the upper electrode overlaps the lower electrode and comprises niobium nitride, and wherein the lower electrode further comprises a first seed layer at least partially surrounded by the supporter and contacting at least a portion of the electrode layer, and wherein the lower electrode further comprises a capping layer disposed between the electrode layer and the first interface layer.

9. The integrated circuit device of claim 8, wherein the lower electrode further comprises a second seed layer arranged on a bottom portion of the electrode layer, and each of the first seed layer and the second seed layer comprises titanium nitride.

10. The integrated circuit device of claim 8, wherein the electrode layer comprises a first sidewall portion and a second sidewall portion, wherein the first sidewall portion is at least partially surrounded by the first seed layer, and wherein the second sidewall portion is at least partially surrounded by the first interface layer.

11. The integrated circuit device of claim 10, wherein the first sidewall portion and the second sidewall portion are coplanar with each other.

12. The integrated circuit device of claim 10, wherein the second sidewall portion does not contact the supporter, and wherein the first seed layer is between the first sidewall portion and a sidewall of the supporter.

13. The integrated circuit device of claim 8, further comprising a second interface layer between the dielectric layer and the upper electrode, wherein the second interface layer comprises a conductive metal oxide.

14. The integrated circuit device of claim 8, wherein the electrode layer comprises a double layer comprising a u-shaped first sub-electrode layer arranged on the substrate and a u-shaped second sub-electrode layer arranged on the u-shaped first sub-electrode layer, wherein the u-shaped first sub-electrode layer comprises titanium nitride, and wherein the u-shaped second sub-electrode layer comprises niobium nitride.

15. The integrated circuit device of claim 8, wherein the electrode layer comprises a triple layer comprising a u-shaped first sub-electrode layer arranged on the substrate, a u-shaped second sub-electrode layer arranged on the u-shaped first sub-electrode layer, and a third sub-electrode layer arranged on the u-shaped second sub-electrode layer, wherein the u-shaped first sub-electrode layer comprises titanium nitride, wherein the u-shaped second sub-electrode layer comprises niobium nitride, and wherein the third sub-electrode layer comprises titanium nitride.

16. The integrated circuit device of claim 8, wherein the supporter comprises a first supporter and a second supporter respectively on a first portion of a sidewall of the lower electrode and a second portion of the sidewall of the lower electrode, and wherein the capping layer is disposed on the electrode layer and the first seed layer and disposed to be lower than a surface of the second supporter.

17. The integrated circuit device of claim 8, wherein the upper electrode comprises any one of a single layer or a double layer, wherein the single layer is arranged on the dielectric layer, wherein the double layer comprises a fourth sub-electrode layer arranged on the dielectric layer and a fifth sub-electrode layer arranged on the fourth sub-electrode layer, wherein the fourth sub-electrode layer comprises titanium nitride, and wherein the fifth sub-electrode layer comprises niobium nitride.

18. The integrated circuit device of claim 8, wherein the upper electrode comprises a fourth sub-electrode layer arranged on the dielectric layer, a fifth sub-electrode layer arranged on the fourth sub-electrode layer, and a sixth sub-electrode layer arranged on the fifth sub-electrode layer, wherein the fourth sub-electrode layer comprises titanium nitride, wherein the fifth sub-electrode layer comprises niobium nitride, and wherein the sixth sub-electrode layer comprises titanium nitride.

19. An integrated circuit device comprising: a capacitor structure, wherein the capacitor structure comprises:

a lower electrode arranged on a substrate, wherein the lower electrode comprises an electrode layer extending in a direction substantially perpendicular to a first surface of the substrate, and the electrode layer comprises niobium nitride;

a supporter arranged on a sidewall of the lower electrode;

a dielectric layer arranged on the lower electrode and the supporter;

a first interface layer arranged between a sidewall of the electrode layer and the dielectric layer and between a first surface of the electrode layer and the dielectric layer, wherein the first interface layer comprises a conductive metal nitride;

an upper electrode arranged on the dielectric layer, wherein the upper electrode covers the lower electrode and comprises niobium nitride; and a second interface layer arranged between the dielectric layer and the upper electrode, wherein the second interface layer comprises a conductive metal oxide, wherein the supporter comprises a first supporter and a second supporter respectively disposed on a middle portion of a sidewall of the lower electrode and an upper portion of the sidewall of the lower electrode, and wherein the lower electrode further comprises a capping layer arranged on the electrode layer, and wherein a surface of the capping layer is arranged lower than a surface of the second supporter.

20. The integrated circuit device of claim 19, wherein each of the electrode layer and the upper electrode comprises one of a single layer comprising niobium nitride, a double layer comprising niobium nitride and titanium nitride, or a triple layer comprising first titanium nitride, niobium nitride, and second titanium nitride.

* * * * *